US012550249B2

(12) United States Patent
Buck et al.

(10) Patent No.: US 12,550,249 B2
(45) Date of Patent: Feb. 10, 2026

(54) FLEX CIRCUIT AND ELECTRICAL COMMUNICATION ASSEMBLIES RELATED TO SAME

(71) Applicant: Samtec, Inc., New Albany, IN (US)

(72) Inventors: Jonathan E. Buck, Hershey, PA (US); Marc Epitaux, Gland (CH)

(73) Assignee: SAMTEC, INC., New Albany, IN (US)

( * ) Notice: Subject to any disclaimer, the term of this patent is extended or adjusted under 35 U.S.C. 154(b) by 39 days.

(21) Appl. No.: 17/517,395

(22) Filed: Nov. 2, 2021

(65) Prior Publication Data

US 2022/0140514 A1 May 5, 2022

Related U.S. Application Data

(60) Provisional application No. 63/249,423, filed on Sep. 28, 2021, provisional application No. 63/108,871, filed on Nov. 2, 2020.

(51) Int. Cl.
*H05K 1/02* (2006.01)
*H01R 13/02* (2006.01)
*H01R 13/6461* (2011.01)

(52) U.S. Cl.
CPC ......... *H05K 1/0221* (2013.01); *H01R 13/025* (2013.01); *H01R 13/6461* (2013.01); *H05K 1/0245* (2013.01); *H05K 1/0298* (2013.01)

(58) Field of Classification Search
CPC ............ H01R 13/025; H01R 13/62983; H01R 13/6461; H05K 1/0245; H05K 1/0298; H05K 2201/09481; H05K 1/0221; H05K 1/028; H05K 1/147; H05K 1/189; H05K 2201/05; H05K 2201/09445
See application file for complete search history.

(56) References Cited

U.S. PATENT DOCUMENTS

| | | | | |
|---|---|---|---|---|
| 4,609,240 A | | 9/1986 | Pistor | |
| 4,640,032 A | | 2/1987 | Lewis | |
| 4,924,179 A | | 5/1990 | Sherman | |
| 4,975,068 A | * | 12/1990 | Squires | H01R 12/78 439/372 |

(Continued)

FOREIGN PATENT DOCUMENTS

| | | |
|---|---|---|
| CN | 1329721 A | 1/2002 |
| CN | 1559084 A | 12/2004 |

(Continued)

OTHER PUBLICATIONS

Amphenol TCS Expands the XCede Platform with 85 ohm Connectors and High Speed cable Solutions, ENP Newswire, Feb. 26, 2009.

(Continued)

*Primary Examiner* — Steven T Sawyer
(74) *Attorney, Agent, or Firm* — Baker Hostetler

(57) ABSTRACT

Flex circuit embodiments are provided having high signal conductor density and high signal integrity. Electrical communication systems are described that are configured to be placed in electrical communication with the flex circuits. Electrical communication systems are described that include an electrical connector that is selectively intermatable with an electrical connector that is mounted to a flex circuit, and an electrical connector that is mounted to a substrate such as a printed circuit board (PCB).

13 Claims, 23 Drawing Sheets

(56) References Cited

U.S. PATENT DOCUMENTS

| | | | | |
|---|---|---|---|---|
| 5,383,787 | A * | 1/1995 | Switky | H05K 7/1061 439/71 |
| 5,435,757 | A | 7/1995 | Fedder et al. | |
| 5,441,424 | A | 8/1995 | Morlion et al. | |
| 5,487,673 | A | 1/1996 | Hurtarte | |
| 5,509,827 | A * | 4/1996 | Huppenthal | H01R 12/775 333/260 |
| 5,564,931 | A | 10/1996 | Fabian et al. | |
| 5,567,166 | A | 10/1996 | Lemke | |
| 5,598,627 | A | 2/1997 | Saka et al. | |
| 5,781,759 | A | 7/1998 | Kashiwabara | |
| 5,823,796 | A | 10/1998 | Bethurum | |
| 6,068,500 | A | 5/2000 | Kantner | |
| 6,071,016 | A | 6/2000 | Ichino et al. | |
| 6,100,626 | A * | 8/2000 | Frey | H01R 4/04 310/334 |
| 6,144,559 | A | 11/2000 | Johnson et al. | |
| 6,186,106 | B1 | 2/2001 | Glovatsky et al. | |
| 6,203,376 | B1 | 3/2001 | Magajne et al. | |
| 6,232,556 | B1 * | 5/2001 | Daugherty | H01R 12/61 439/874 |
| 6,425,691 | B1 | 7/2002 | Demangone | |
| 6,574,115 | B2 | 6/2003 | Asano et al. | |
| 6,688,776 | B2 | 2/2004 | Simmons et al. | |
| 6,702,590 | B2 | 3/2004 | Zaderej et al. | |
| 6,726,504 | B2 | 4/2004 | Fuerst et al. | |
| 6,738,259 | B2 | 5/2004 | Le et al. | |
| 6,797,882 | B1 | 9/2004 | Crane et al. | |
| 6,971,887 | B1 | 12/2005 | Trobough | |
| 6,990,733 | B2 | 1/2006 | Lopata et al. | |
| 7,004,644 | B1 | 2/2006 | Johnson | |
| 7,118,293 | B2 | 10/2006 | Nagasaka et al. | |
| 7,320,426 | B2 | 1/2008 | Shue et al. | |
| 7,329,054 | B1 | 2/2008 | Epitaux et al. | |
| 7,384,275 | B2 | 6/2008 | Ngo | |
| 7,402,048 | B2 | 7/2008 | Meier et al. | |
| 7,503,793 | B2 | 3/2009 | Morello | |
| 7,719,843 | B2 | 5/2010 | Dunham | |
| 8,007,316 | B2 | 8/2011 | Costello | |
| 8,036,500 | B2 | 10/2011 | McColloch | |
| 8,083,553 | B2 | 12/2011 | Manter et al. | |
| 8,173,490 | B2 | 5/2012 | Eckhardt et al. | |
| 8,335,411 | B2 | 12/2012 | Kuznia et al. | |
| 8,353,708 | B2 | 1/2013 | Hsu | |
| 8,553,102 | B2 | 10/2013 | Yamada | |
| 8,724,944 | B2 | 5/2014 | Kuznia et al. | |
| 8,787,711 | B2 | 7/2014 | Zbinden et al. | |
| 8,867,231 | B2 | 10/2014 | Roitberg et al. | |
| 8,867,869 | B2 | 10/2014 | Steijer et al. | |
| 9,118,151 | B2 | 8/2015 | Tran et al. | |
| 9,442,255 | B2 | 9/2016 | Pommer et al. | |
| 9,465,176 | B2 | 10/2016 | Pommer et al. | |
| 9,606,307 | B2 | 3/2017 | Matsumaru et al. | |
| 9,647,762 | B2 | 5/2017 | Arvelo et al. | |
| 9,766,418 | B2 | 9/2017 | Lewallen et al. | |
| 9,791,647 | B2 | 10/2017 | Steijer et al. | |
| 9,841,572 | B2 | 12/2017 | Zbinden et al. | |
| 10,074,920 | B2 | 9/2018 | Tran et al. | |
| 10,910,748 | B2 | 2/2021 | Mason et al. | |
| 10,931,047 | B2 | 2/2021 | Lee et al. | |
| 2002/0153977 | A1 | 10/2002 | McDonough et al. | |
| 2003/0036304 | A1 | 2/2003 | Soubh | |
| 2004/0094328 | A1 | 5/2004 | Fjelstad et al. | |
| 2004/0155328 | A1 | 8/2004 | Kline | |
| 2004/0218372 | A1 | 11/2004 | Hamasaki et al. | |
| 2004/0245610 | A1 | 12/2004 | Zhong et al. | |
| 2005/0093120 | A1 | 5/2005 | Millik et al. | |
| 2005/0093127 | A1 | 5/2005 | Fjelstad et al. | |
| 2006/0001163 | A1 | 1/2006 | Kolbehdari et al. | |
| 2006/0040523 | A1 | 2/2006 | Renfro et al. | |
| 2006/0091507 | A1 * | 5/2006 | Fjelstad | H01L 23/49805 257/676 |
| 2006/0133821 | A1 | 6/2006 | Wang et al. | |
| 2006/0215963 | A1 | 9/2006 | Hamano | |
| 2006/0228922 | A1 | 10/2006 | Morriss | |
| 2007/0001277 | A1 | 1/2007 | Ichikawa | |
| 2007/0015416 | A1 | 1/2007 | Gutierrez et al. | |
| 2007/0040626 | A1 | 2/2007 | Blair et al. | |
| 2008/0095506 | A1 | 4/2008 | McColloch | |
| 2008/0150571 | A1 | 6/2008 | Miller et al. | |
| 2008/0176436 | A1 | 7/2008 | Morello | |
| 2008/0277769 | A1 | 11/2008 | Cotte et al. | |
| 2009/0023330 | A1 | 1/2009 | Stoner et al. | |
| 2009/0148108 | A1 | 6/2009 | Fukutomi | |
| 2010/0062656 | A1 | 3/2010 | Lynch et al. | |
| 2010/0075536 | A1 | 3/2010 | Kubo | |
| 2010/0188828 | A1 | 7/2010 | Takao | |
| 2010/0195304 | A1 | 8/2010 | Takao | |
| 2010/0258952 | A1 | 10/2010 | Fjelstad | |
| 2011/0201213 | A1 | 8/2011 | Dabov et al. | |
| 2011/0272825 | A1 * | 11/2011 | McGrath | H01L 25/0657 257/E21.503 |
| 2012/0282807 | A1 * | 11/2012 | Regnier | H01R 13/6466 174/250 |
| 2013/0040483 | A1 | 2/2013 | Ngo et al. | |
| 2013/0088829 | A1 | 4/2013 | Co | |
| 2013/0108210 | A1 * | 5/2013 | Uemura | G02B 6/43 385/14 |
| 2013/0115500 | A1 | 5/2013 | Mcclure et al. | |
| 2013/0181360 | A1 | 7/2013 | Kim et al. | |
| 2013/0215563 | A1 | 8/2013 | Behziz et al. | |
| 2013/0309809 | A1 | 11/2013 | Eckhardt et al. | |
| 2014/0056592 | A1 | 2/2014 | Mccolloch et al. | |
| 2014/0057487 | A1 | 2/2014 | May | |
| 2014/0098969 | A1 | 4/2014 | Oliveira | |
| 2014/0193160 | A1 | 7/2014 | Yagisawa et al. | |
| 2014/0273629 | A1 * | 9/2014 | Canning | H01R 13/6463 439/676 |
| 2015/0234437 | A1 | 8/2015 | Gallina et al. | |
| 2015/0357736 | A1 | 12/2015 | Tran et al. | |
| 2016/0056554 | A1 | 2/2016 | Costello | |
| 2016/0218455 | A1 | 7/2016 | Sayre et al. | |
| 2018/0132352 | A1 * | 5/2018 | Yanagihashi | H05K 1/028 |
| 2018/0217341 | A1 | 8/2018 | Smith et al. | |
| 2019/0182958 | A1 | 6/2019 | Searls et al. | |
| 2019/0200450 | A1 | 6/2019 | Mellitz et al. | |
| 2019/0372251 | A1 | 12/2019 | Huang et al. | |
| 2020/0212631 | A1 | 7/2020 | Buck et al. | |
| 2021/0091496 | A1 | 3/2021 | Cartier, Jr. et al. | |
| 2021/0194164 | A1 | 6/2021 | Epitaux et al. | |
| 2021/0257788 | A1 * | 8/2021 | Cartier, Jr. | H05K 1/141 |
| 2021/0265785 | A1 | 8/2021 | Mongold et al. | |
| 2021/0289617 | A1 | 9/2021 | Mellitz et al. | |
| 2022/0167497 | A1 * | 5/2022 | Fukao | H05K 1/0283 |
| 2022/0304149 | A1 * | 9/2022 | Qiao | H05K 1/117 |

FOREIGN PATENT DOCUMENTS

| | | | |
|---|---|---|---|
| CN | 1559164 | A | 12/2004 |
| CN | 1925234 | A | 3/2007 |
| CN | 101120491 | A | 2/2008 |
| CN | 101882717 | A | 11/2010 |
| CN | 102082376 | A | 6/2011 |
| CN | 103337749 | A | 10/2013 |
| CN | 211530225 | U | 9/2020 |
| JP | 5605323 | B2 | 10/2014 |
| KR | 10-1269784 | B1 | 5/2013 |
| TW | I221197 | B | 9/2004 |
| TW | I241621 | B | 10/2005 |
| TW | I260488 | B | 8/2006 |
| TW | I329398 | B | 8/2010 |
| TW | I444120 | B | 7/2014 |
| TW | I525882 | B | 3/2016 |
| TW | I577085 | B | 4/2017 |
| TW | 202033079 | A | 9/2020 |
| TW | M611526 | U | 5/2021 |
| TW | 202239297 | A | 10/2022 |
| WO | 2016/053501 | A1 | 4/2016 |

(56) References Cited

FOREIGN PATENT DOCUMENTS

| | | | |
|---|---|---|---|
| WO | 2017/024244 | A1 | 2/2017 |
| WO | 2020/014597 | A2 | 1/2020 |

OTHER PUBLICATIONS

Wig et al., U.S. Appl. No. 61/714,871, filed Oct. 17, 2012.

Abot et al., Precise Monitoring of Damage Evolution in Laminated Composite Materials using Integrated Carbon Nanotube Fiber Sensors: Experimental Results and Validation; Conference: American Society for Composites, Sep. 2016, 14 pages.

Anandtech, SuperComputing 15: Intel's Knights Landing/Xeon Phi Silicon on Display, online article Ian Cutress dated Nov. 19, 2015, 8 pages, https://www.anandtech.com/show/9802/supercomputing-15-intels-knights-landing-xeon-phi-silicon-on-display.

Icrontic, Tech Tips: Rounded Cables, Supplied by Koolcases, published in Tech Nov. 20, 2002; 8 pages.

Intel Xeon Phi Processor: Your Path to Deeper Insight, Product Brief, Dec. 13, 2016, 4 pages.

Intel Xeon Phi Processors, Product Specification List dated Dec. 31, 2016, https://ark.intel.com/content/www/us/en/ark/products/series/75557/intel-xeon-phi-processors.html.

The Next Platform, Intel Knights Landing Yields Big Bang for the Buck Jump, online article by Timothy Prickett Morgan dated Jun. 20, 2016, 13 pages, https://www.nextplatform.com/2016/06/20/intel-knights-landing-yields-big-bang-buck-jump/.

* cited by examiner

FLEX CIRCUIT AND ELECTRICAL COMMUNICATION ASSEMBLIES RELATED TO SAME

CROSS-REFERENCE TO RELATED APPLICATIONS

This claims priority to U.S. Patent Application Ser. No. 63/108,871 filed Nov. 2, 2020 and U.S. Patent Application Ser. No. 63/249,423, filed 28 Sep. 2021, the disclosure of each of which is hereby incorporated by reference as if set forth in its entirety herein.

BACKGROUND

High data rate communication and processing is revolutionizing many aspects of human society. The communication and processing revolution is enabled by integrated circuits (ICs), which can generate and process Tbps of information. Within the integrated circuit, information is transmitted by narrow (<10 nm) electrically conductive traces and processed by thousands or millions of transistors. ICs are typically packaged in the form of an IC die which is mounted on a die package substrate to form a die package or an IC package. In turn, the IC package is mounted to a host substrate. The host substrate has electrical traces, and these electrical traces can produce unwanted, parasitic insertion loss and other undesirable signal transmission qualities.

An earlier approach to mitigate unwanted and undesirable signal transmission losses in a host or circuit board substrate is disclosed in U.S. Pat. No. 6,971,887, hereby incorporated by reference in its entirety. This patent discloses using an external substrate to couple first and second socket elements. The external substrate has a dielectric with a lower electrical loss tangent value than a dielectric that comprises the circuit board substrate. Signals may transfer through the external substrate at a rate of 12GT/s+ at a distance of about six inches. In general, U.S. Pat. No. 6,971,887 teaches connecting central processing unit (CPU) sockets with an external substrate so that high-rate signals bypass the host or circuit board substrate.

Another approach at mitigating unwanted and undesirable signal transmission losses in host substrates is described at pages 26 and 27 of the book "Flexible Circuit Technology", Third Edition, Joseph Fjelstad, BR Publishing, Inc. (2006). Mr. Fjelstad writes, "While the historical role of flex circuits was most often as a wire harness replacement, the technology has gown well beyond such mundane applications. Today, flexible circuits are continuing to increase the breadth of their application. Electronic packaging engineers around the world are devising newer ways of using flex circuits and are expanding on the basic promise of the technology by developing ever more fanciful, yet practical, electronic interconnection structures. It is worth exploring briefly some of flexible circuit technology's unique abilities to increase electronic circuit packaging density and performance in terms of some of the many novel applications that are either in use or in development. Some of the new applications and approaches to the use of flexible circuit technology have further demonstrated the ability of the technology to increase circuit density in unusual ways, such as in IC packaging where the new package structures typically occupy a small fraction of the volume of more conventional design approaches. High-speed flex circuit assemblies have proven a viable alternative for high-speed applications for board-to-board distances up to 75 mm (30 inches) at data rates up to 10 Gbps with the flex circuit integrated directly into connectors. An example is shown in FIG. 2-14 (High speed flex cables can be directly connected from package to connector in order to bypass parasitics and avoid crosstalk issues associated with traditional interconnection design.) Commonly available high-speed flex circuit products are available in pitches down to 0.5 mm (0.020") and less for both differential pair and single-ended configurations. With the move to ever-higher data transmission speeds, these types of flexible circuit applications will become increasingly important. High-speed structures made possible by high-speed cables will be discussed in more detail later."

In general, instead of providing a jumper between at least two CPUs or at least two CPU sockets, Mr. Fjelstad discloses using flexible circuit material to bypass the host substrate and define a flex cable connection between a differential pair of a right-angle backplane connector and a die package substrate for signaling up to 10 Gbps.

U.S. Pat. No. 8,353,708, entitled, "Independent Loading Mechanism Facilitating Interconnections for Both CPU and Flexible Printed Cables" generally discloses electrically connecting a CPU with a printed circuit board and achieves high-speed signal transmissions between CPUs through cables.

Moving forward approximately five more years, United States Patent Publication No. 2016/0218455, entitled, "Hybrid Electrical Connector For High-Frequency Signals", filed by the Applicant and hereby incorporated by reference in its entirety, discloses that electrical traces in the host substrate have much higher loss than an optical or shielded cable and are far more susceptible to interference and crosstalk. US Publication 2016/0218455 proposes shortening the electrical traces in the host substrate to about 5 mm or 10 mm from the IC and connecting twin axial cable to the electrical traces in the host substrate.

United States Patent Publication 2021/0265785, entitled, "Cable Connector System, filed by the Applicant and hereby incorporated by reference in its entirety, discloses, "In total, on both the first and second surfaces of the die package, a die package in the range of approximately 140 mm by 140 mm to approximately 280 mm by 280 mm can carry at least 1024 twin axial pairs or 2048 individual cable conductors which are routed to respective first electrical panel connectors . . . "

Finally, United States Patent Publication No. 2021/0289617, entitled, "Alternative Circuit Apparatus For Long Host Routing" and hereby incorporated by reference in its entirety, discloses a circuit assembly. The circuit assembly includes a package comprising a multi-level BGA/chip carrier and a package to board flex circuit. BGA/chip carrier includes an IC including a first BGA mounted to the chip carrier/interposer board comprising a PCB or substrate that is interposed between first BGA and a second BGA mounted to a multilayer PCB via a first set of BGA pads patterned on an upper layer of a multilayer PCB. The left end of flex circuit is mounted to the topside of chip carrier by means of a BGA, while the right end of flex circuit is mounted to a multilayer PCB by a second set of BGA pads patterns on the upper layer of the PCB. The second set of pads are electrically connected to connector via wiring in a layer. A high-speed data channel can have a bandwidth of at least 50 Gbps.

SUMMARY

The present disclosure is generally directed, individually or in any combinations, to: an improved flex circuit and associated interconnects; the routing at least 512 or 1024 differential signal pairs from a single surface of an IC die package, a single surface of a die package substrate, or a signal surface of a communication module; attaching flex circuits to at least two, at least three, or at least four die package sides of a die package substrate; and a hybrid cable assembly that includes a combination of a flex circuit or circuits and cables, alone or in combination with an end one electrical connector and/or an end two electrical connectors.

BRIEF DESCRIPTION OF THE DRAWINGS

The foregoing summary, as well as the following detailed description of illustrative embodiments of the electrical communication system of the present disclosure, will be better understood when read in conjunction with the appended drawings. For the purposes of examples of the present disclosure, there is shown in the drawings illustrative embodiments. It should be understood, however, that the present disclosure is not limited to the precise arrangements and instrumentalities shown. In the drawings.

DETAILED DESCRIPTION

Figure 1A:
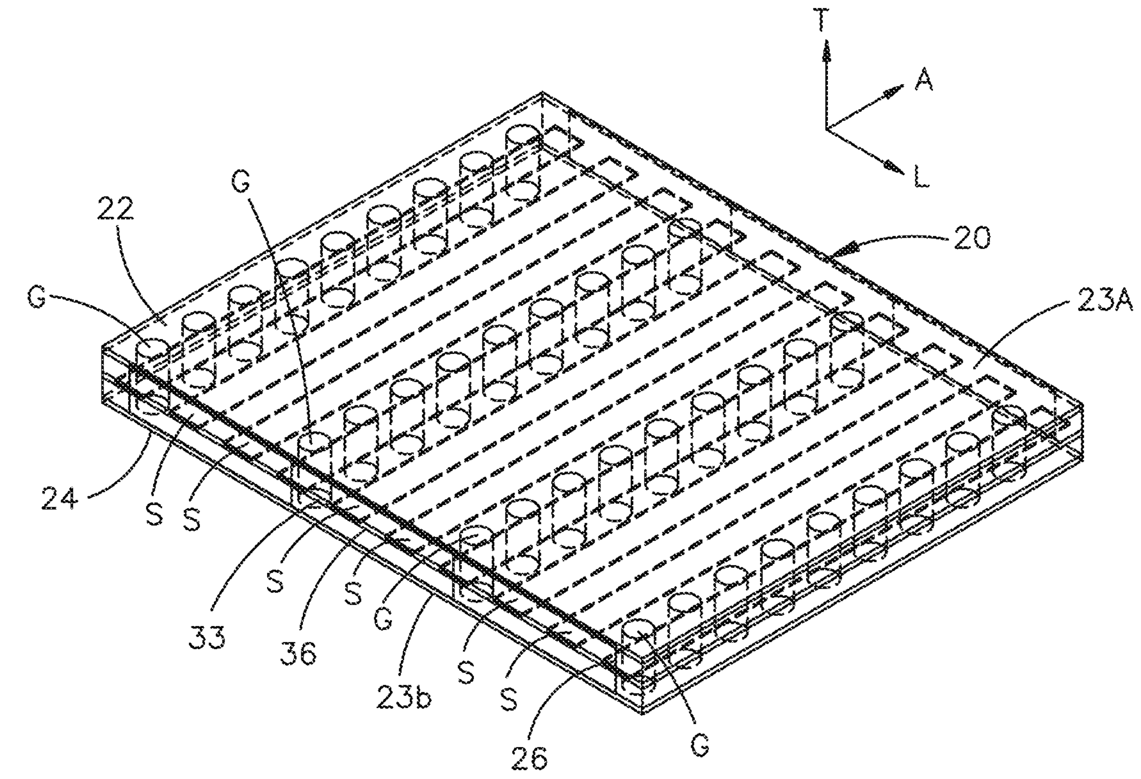
FIG. 1A is a perspective view of a portion of a three-layer flex circuit including a single of ground conductors disposed between adjacent differential signal pairs of signal conductors.

The present disclosure can be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular embodiments by way of example only and is not intended to be limiting of the scope of the present disclosure. Further, reference to a plurality as used in the specification including the appended claims includes the singular "a," "an," "one," and "the," and further includes "at least one." Further still, reference to a particular numerical value in the specification including the appended claims includes at least that particular value, unless the context clearly dictates otherwise.

The term "plurality", as used herein, means more than one. When a range of values is expressed, the range extends from the one particular value to the other particular value. Similarly, when values are expressed as approximations, by use of the antecedent "about," it will be understood that the particular value forms another example. All ranges are inclusive and combinable.

The term "substantially," "approximately," and derivatives thereof, and words of similar import, when used to described sizes, shapes, spatial relationships, distances, directions, and other similar parameters includes the stated parameter in addition to a range up to 10% more and up to 10% less than the stated parameter, including up to 5% more and up to 5% less, including up to 3% more and up to 3% less, including up to 1% more and up to 1% less. If terms such as "equal", "perpendicular", or a numerical value associated with a given dimension are used to compare or describe elements of the invention, the terms should be interpreted as referring to within manufacturing tolerances.

As an overview, with all things being equal, a flex circuit has a higher differential pair density than two coaxial cables or a co-extruded twinax cable. However, flex circuit also performs electrically worse than an equal length of coaxial, twin axial or extruded waveguide cable. As the length of the flex circuit increases, the signal integrity performance degrades faster than the coax, twinax and waveguide cables. So, many have adopted twinax cables over flex for applications where signals are being transmitted at high speeds or data rates, such as 56G NRZ/112G PAM4 signaling or 112G NRZ/224G PAM4 signaling.

A problem with cables, however, is density. For example, a 34 AWG, 100 Ohm twin axial cable with a THV (thermoplastic elastomer) jacket is approximately 1.2 mm wide. Center-to-center spacing of two immediately adjacent cable conductor differential pairs is at least 1.5 mm with ground terminations and mechanical tolerance. So, a simplified equation to figure out the number of 34 AWG cables that can be attached to one of four sides or edges of the die package substrate is roughly (Side Length—10 mm (keep out))/1.5 mm/pair.

As shown in Table 1: No. of 34 AWG Twin Ax Cables That Fit on One of Four Die Package Sides, it is virtually impossible to attach fully shielded 1024 coaxial cables to only one major surface of a 50×50 mm to 100×100 mm die package substrate that is already carrying an IC die. The twin axial cables are just too fat. At best, at four rows deep on each of the four die package sides, with no connectors, the most twin axial cables that can be directly attached to just one major surface of a 100×100 mm die package substrate that also contains an IC die 70 is 240 twin axial cables permanently attached on each of the four die package sides, for a total of 960 differential signal pairs on one major surface of the IC die package.

TABLE 1

| No. of 34 AWG Twin Ax Cables That Fit on One of Four Die Package Sides | | | | |
|---|---|---|---|---|
| Package Side (mm) | 1 Row of Cable Pairs Per Side | 2 Rows of Cable Pairs Per Side | 3 Rows of Cable Pairs Per Side | 4 Rows of Cable Pairs Per Side |
| 50 | 26 | 52 | 78 | 104 |
| 60 | 33 | 66 | 99 | 132 |
| 70 | 40 | 80 | 120 | 160 |
| 80 | 46 | 92 | 138 | 184 |
| 90 | 53 | 106 | 159 | 212 |
| 100 | 60 | 120 | 180 | 240 |

Making die package substrates larger accommodate fatter cables is not always a practical solution because as the die package substrate sides get longer and the die package major surfaces grow in area, the more likely the die package substrate will warp, 'potato chip' or lose coplanarity during reflow.

So, the technical problem is how to keep a die package substrate small enough to mitigate co-planarity issues, say approximately any one of: 50×50 mm or 55×55 mm or 60×60 mm or 65×65 mm or 70×70 mm or 75×75 mm or 80×80 mm or 85×85 mm or 90×90 mm or 95×95 mm or maybe even 100×100 mm or 105×105 mm, but still route or transmit at least 1024 high-speed differential signal pairs from only one major surface of an IC die or an IC die package or a die package substrate to an electrical component, a communication module or an electrical connector, where high speed is at least 28G NRZ, 56G PAM-4, such as 56G NRZ, 112G PAM-4 and 112G NRZ, 224G PAM-4. A first non-limiting solution is to make flex circuits work better electrically. A second non-limiting solution is to leverage the density benefits of flex circuits with the better signal integrity benefits of twin axial cable. These general solutions are now discussed.

Figure 1B:
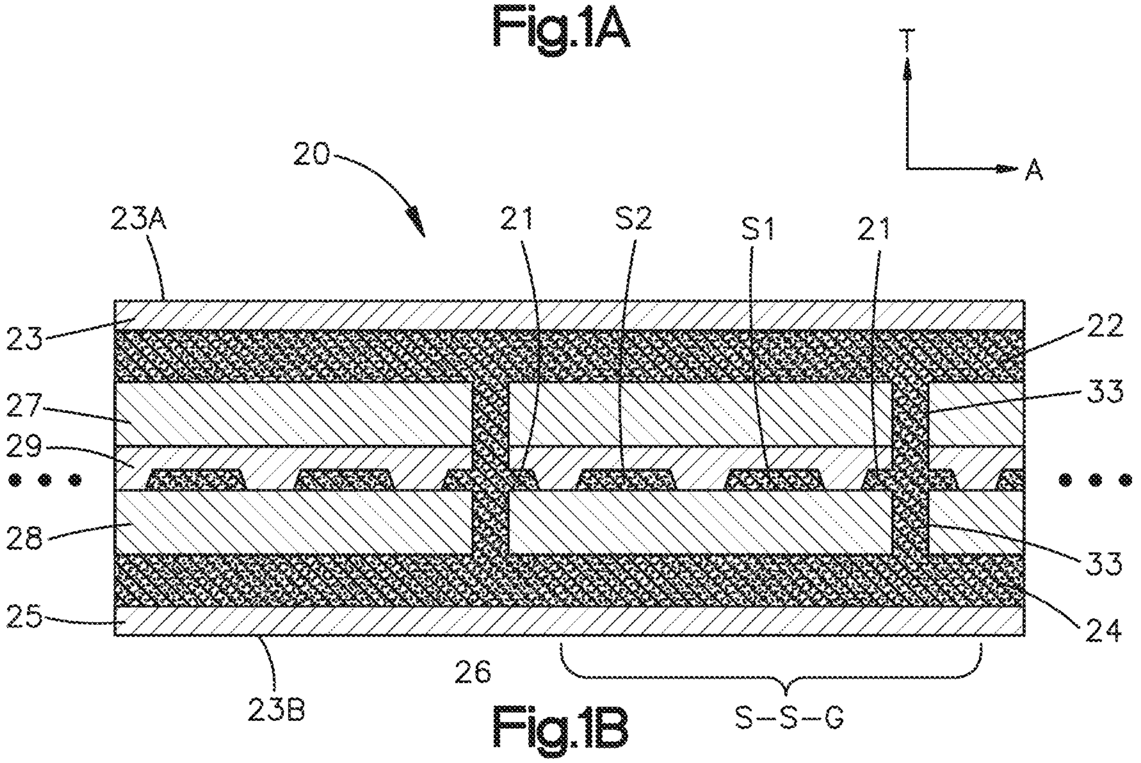
FIG. 1B is a cross-section of a portion of the flex circuit shown in FIG. 1A.

Referring to FIG. 1A, which shows a perspective view of a portion of a flex circuit 20 and FIG. 1B which shows is a cross-section of the same flex circuit 20. The flex circuit 20 can include a first flex circuit side 23A and a second flex circuit side 23B opposite the first flex circuit side 23A along the transverse direction T. The flex circuit 20 can include first and second electrically conductive layers 22 and 24, respectively opposite each other, and thus spaced from each other, along a transverse direction T. The flex circuit 20 can further includes a first electrical signal conductive layer 26A that can include flex signal conductors 26, disposed between the first and second electrically conductive layers 22 and 24.

As best shown in FIG. 1B, the flex circuit 20 can include a first outer dielectric layer 23, which can be configured as an electrically insulative coating that can cover an outer surface of the first electrically conductive layer 22 that faces away from the plurality of flex electrical conductors 26. The flex circuit 20 can include a second outer dielectric layer 25, which can be configured as an electrically insulative coating that can cover an outer surface of the second electrically conductive layer 24 that faces away from the plurality of flex signal conductors 26. The first and second outer dielectric layers 23 and 25 can coat all surfaces of the first and second electrically conductive layers 22 and 24 as desired. The first and second electrically conductive layers 22 and 24 can define respective outermost electrically conductive members of the flex circuit 20 with respect to the transverse direction T. The first and second outer dielectric layers 23 and 25 may define respective outermost layers of the flex circuit 20 with respect to the transverse direction T.

The flex circuit 20 may further include a first inner dielectric layer 27 situated between the first electrically conductive layer 22 and the plurality of flex signal conductors 26. The flex circuit 20 may further include a second inner dielectric layer 28 situated between the second electrically conductive layer 24 and the plurality of flex signal conductors 26. Additionally, a bond sheet 29 may be situated between the first inner dielectric layer 27 and the plurality of flex signal conductors 26. The bond sheet 29 may help to adhesively connect layers of the flex circuit 20 together.

The first electrically conductive layer 22, the second electrically conductive layer 24, and the plurality of flex signal conductors 26 may be formed from copper. Patterning on these various layers may be formed by photolithography or some other method. The first and second outer dielectric layers 23, 25 may be formed from polyimide. The first and second inner dielectric layers 27, 28 may be formed from a liquid crystal polymer. A liquid crystal polymer can have better dielectric properties than polyimide and thus it may be advantageous to use a liquid crystal polymer in an inner region of the flex circuit 20 where electric fields are present during circuit operation. A liquid crystal polymer has a lower dielectric constant and dissipation factor than polyimide. Also, unlike polyimide, it is not hydroscopic, so its dielectric properties are not affected by the presence of water.

The flex signal conductors 26 can include a plurality of flex ground conductors 21, a plurality of flex signal conductors 26 or both. The flex signal conductors 26 can each be elongate along a longitudinal direction L. At least one of the flex ground conductors 21 can be disposed between adjacent flex differential signal pairs S1, S2 of the flex signal conductors 26 along a lateral direction A that is perpendicular to each of the transverse direction T and the longitudinal direction L. One flex ground conductor 21 can be disposed between adjacent flex differential signal pairs S1, S2 of flex signal conductors 26 along a lateral direction. The flex ground conductors 21 and flex signal conductors 26 may form a repeating pattern of G-S-S. The flex differential signal pair S1, S2 of flex signal conductors 26 may be operated as a differential signal pair, which can provide some immunity to background electromagnet noise that may be present in any operating system. Thus, each flex differential signal pair S1, S2 of flex signal conductors 26 can be isolated from each other by a respective flex ground conductor 21. The flex signal conductors 26 can be arranged such that immediately adjacent ones of the flex signal conductors 26 can be spaced from each other along the lateral direction along a center-to-center conductor pitch that is in a range from approximately 0.3 mm to approximately 0.5 mm. For instance, the conductor pitch can be approximately 0.35 mm. The pitch between the repeating pattern of conductors is thus approximately 0.9 mm to approximately 1.5 mm. For instance, the repeating pattern pitch may be approximately 1.05 mm.

The flex signal conductors 26 can be substantially coplanar with each other along a plane that includes the longitudinal direction L and the lateral direction A. Further, the flex signal conductors 26 can be rectangular or trapezoidal in shape in a plane defined by the transverse direction T and a lateral direction A. The flex signal conductors 26 can be wider along the lateral direction A than they are tall along the transverse direction T. It should be appreciated that the transverse direction T, the longitudinal direction L, and the lateral direction A, and other spatial relationships are described herein while the flex circuit 20 is in a flat position, it being recognized that the flex circuit 20 can be bent, twisted, or otherwise contorted during use.

The flex ground conductors 21 can be in electrical communication with at least one of the first and second electrically conductive layers 22 and 24. For instance, the first and second electrically conductive layers 22 and 24 can be electrically connected to the flex ground conductors 21. In particular, the flex circuit 20 can include a plurality of electrically conductive ground vias 33 that can extend from the first electrically conductive layer 22, through a respective one of the flex ground conductors 21, and to the second electrically conductive layer 24. Ground vias 33 can each extend through the first and second electrically conductive layers 22 and 24 along the transverse direction T. Alternatively, the ground vias 33 can extend into, but not through one or both of the first and second electrically conductive layers 22 and 24. In another example, ground vias 33 can extend from the first electrically conductive layer 22 to a respective flex ground conductor 21, and ground vias 33 can each extend from a respective flex ground conductor 21 to the second electrically conductive layer 24. Thus, it can be said that the ground vias 33 can extend from respective ones of the flex ground conductors 21 to at least one or both of the first and second electrically conductive layers 22 and 24. Multiple ground vias 33 (or pairs of first and second ground vias 33) can connect each of the flex ground conductors 21 to the first and second electrically conductive layers 22 and 24. Thus, groups of ground vias 33 can extend into or through a respective one of the flex ground conductors 21 and can be spaced from each other along respective lengths of the flex ground conductors 21 along the longitudinal direction. In this regard, it should be appreciated that the first and second electrically conductive layers 22 and 24, and the flex ground conductors 21, can be placed in electrical communication with each other through the ground vias 33.

The presence of ground vias 33 may create undesirable resonances in the flex circuit 20 so in alternative embodiments the flex circuit 20 may be devoid of ground vias 33 or only have ground vias 33 at a first circuit end 134 or a second circuit end 136 (FIG. 6A) where electrical signals enter and/or exit the flex circuit 20. In other words, the flex circuit 20 may have no ground vias 33 or only a small number of ground vias 33, such as less than 2, 4, 6, 8, or 10 ground vias 33 per flex differential signal pair S1, S2.

The flex circuit 20 depicted in FIGS. 1A and 1B may be referred to as a three-layer flex circuit 20, since there are three layers of metal conductors separated by the electrically insulating dielectric layers. The flex circuit 20 may be fabricated by laminating one or more layers of metal/dielectric sheets. The metal of the metal/dielectric sheets may be patterned using photolithography or some other means to etch away metal in areas where it is not wanted. The metal can be copper, and the flexible dielectric can be a polyimide or a liquid crystal polymer. Thickness of the metal layer can be very thin (approximately >0 microns <0.002 microns) to very thick (approximately >250 microns) and the dielectric thickness can vary from approximately 10 microns to 220 microns. Thickness of the various layers comprising the flex circuit 20 may be chosen to optimize performance while maintaining adequate flexibility. In some embodiments, the thickness of each of the layers of a three-layer flex circuit 20 may be less than approximately 0.15 mm and the total flex circuit thickness may be less than approximately 0.4 mm. Filled electrically conductive ground or signal vias 33, 34 between the different conductive layers may be made using mechanical or laser drilling and well know plating processes. It should be noted that the flex circuit 20 can be different from a flat cable, which is made by an extrusion process.

Depending on the size, and shape of the metal traces or flex signal conductors 26, their relation to ground planes such as the first and second electrically conductive layers 22, 24, and the dielectric properties of the dielectric material surrounding the flex signal conductors 26, a characteristic impedance of the flex differential signal pairs S1, S2 can be adjusted. The characteristic impedance may be adjusted to be in the range of approximately 85±5 Ohms to approximately 100±10 Ohms. In particular, the characteristic impedance may be 92.5±5 Ohms. The flex circuit 20 and interconnections at the respective first and second circuit ends 134, 136 of the flex circuit 20, where signals such as coaxial or differential signals enter and exit the flex circuit 20, can be designed to maintain as uniform an impedance as possible, to minimize reflections and resonances in the transmission system. The pitch between flex differential signal pairs in a common row, column or linear array may be small, for example, approximately 1.05 mm. This allows for a high-density interconnection for signals routed to and from the flex circuit 20.

Figure 1C:
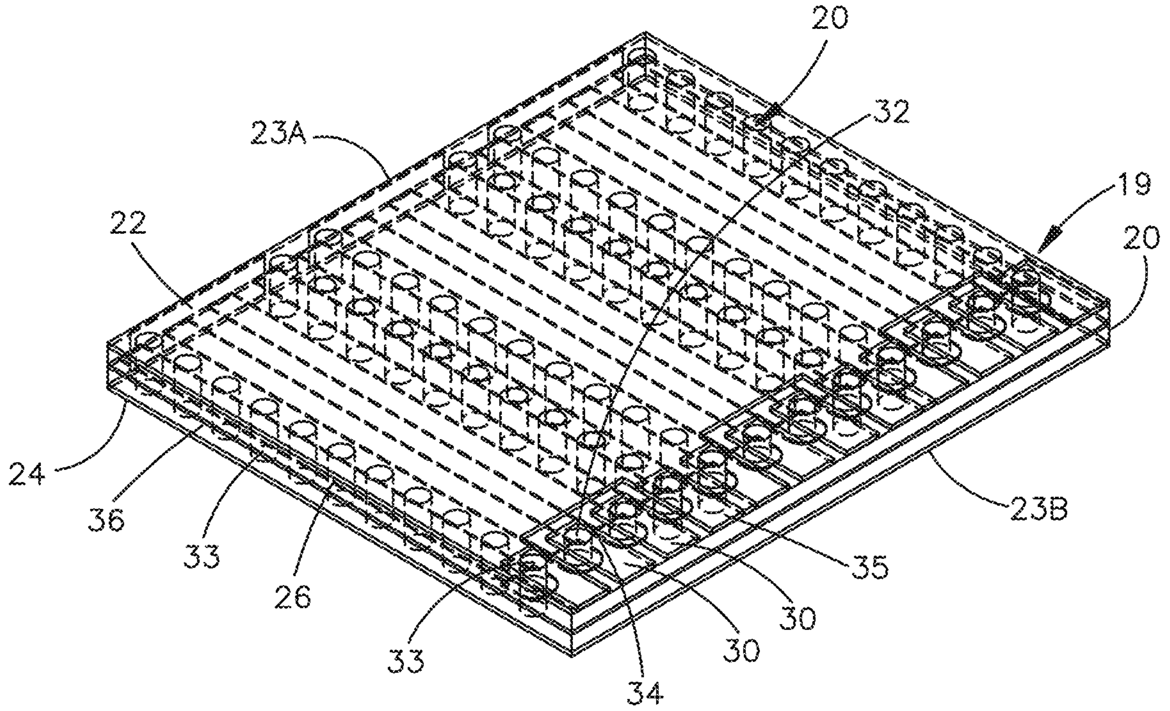
FIG. 1C is a perspective view of the flex circuit shown in FIG. 1A with a mating region at a first circuit end of the flex circuit.
Figure 1D:
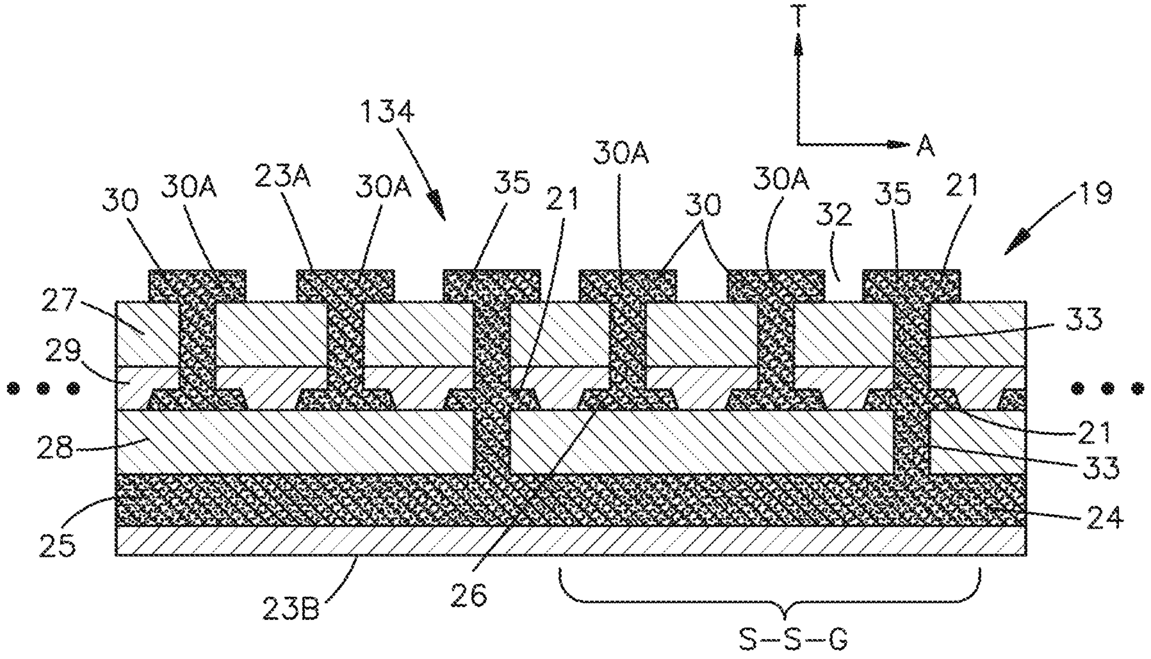
FIG. 1D is a cross-section of a portion of the flex circuit shown in FIG. 1C through a mating region at a first circuit end.
Figure 4A:
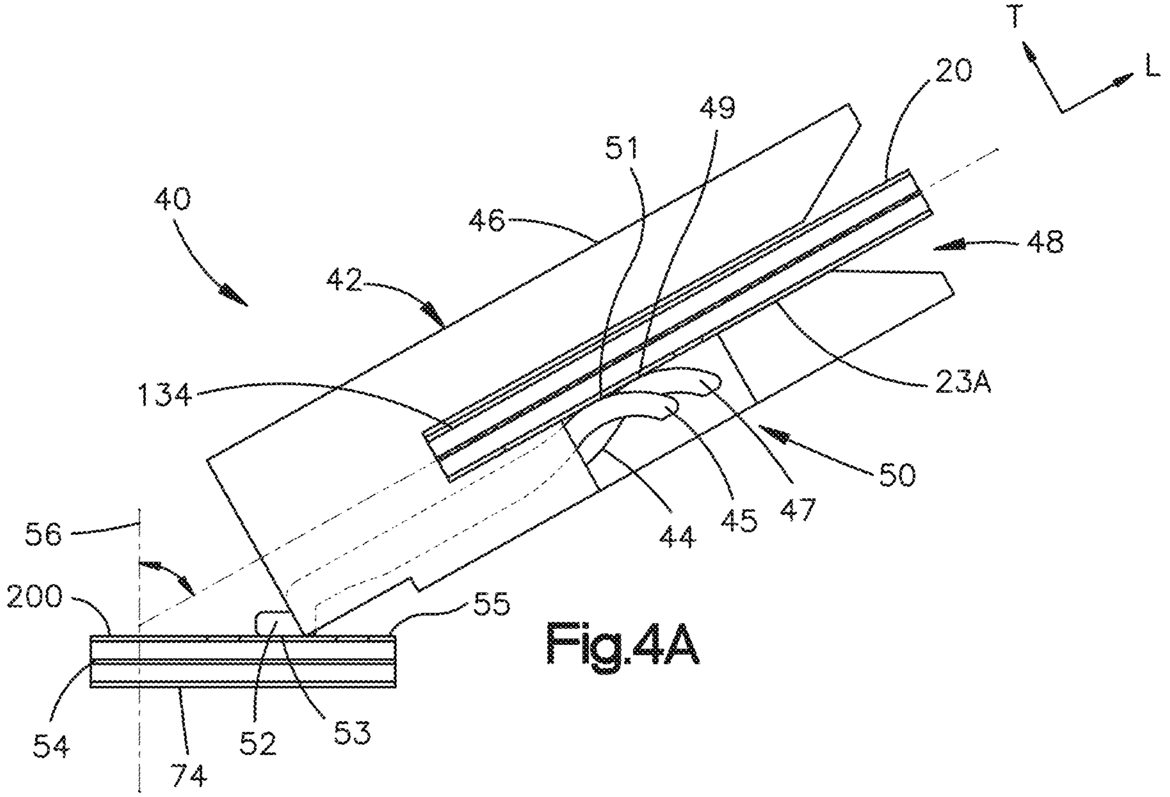
FIG. 4A is a side view of an electrical communication assembly including a substrate, flex circuit with a single sided contact, and an electrical connector mated to the flex circuit and mounted to a substrate at an oblique angle.
Figure 4B:
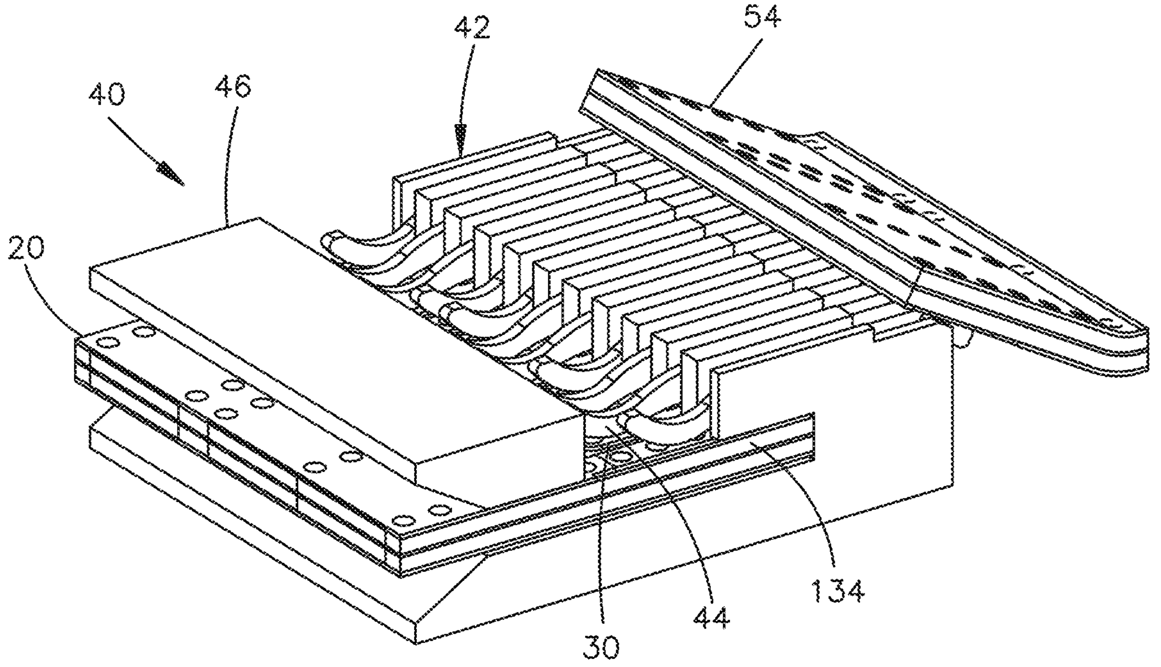
FIG. 4B is a perspective view of the electrical communication assembly of FIG. 4A.

FIGS. 1C and 1D show a perspective view and cross-sectional view of the flex circuit 20 at a first circuit end 134 of the flex circuit 20. The flex circuit 20 can include a flex mating region 19 on the first circuit end 134. Referring to FIGS. 4A and 4B for context, the first circuit end 134 can be configured to be mated or mounted to a complementary electrical component or electrical connector such as a first electrical connector 42. The first electrical connector 42 can be configured to be mounted or adjacent to a first major surface 200 of a first substrate 54 or a die package substrate 74. The first circuit end 134 may be referred to as a single sided connection, since all flex signal pads 30 can be positioned on one side of the first circuit end 134 the flex circuit 20, such as the first flex circuit side 23A of the flex circuit 20 or the second flex circuit side 23B of the flex circuit 20.

Referring back to FIGS. 1C and 1D, the flex signal pads 30 can each be electrically connected to a respective one of the flex signal conductors 26. In particular, the flex circuit 20 can include a plurality of signal vias 34 that can each extend from the flex signal pads 30 to a respective one of the flex signal conductors 26. In particular, the flex signal pads 30 can be aligned with a respective one of the flex signal conductors 26 along the transverse direction T. The signal vias 34 can extend from a respective one of the flex signal pads 30 from an aligned one of the flex signal conductors 26 along the transverse direction T. In one example, each flex signal pad 30 can be connected to a respective single one of the flex signal conductors 26 by a single signal via 34, though it should be appreciated that flex signal pads 30 can be connected to a single one of the flex signal conductors 26 by more than one signal via 34 if desired. One or more signal via 34 can extend into, but not through, a respective one of the flex signal pads 30 and a respective flex signal conductor 26 along the transverse direction T, if desired. Alternatively, signal via 34 can extend through each of the flex signal pads 30 and the flex signal conductor 26 along the transverse direction T.

As shown in FIG. 1D, the first circuit end 134 of the flex circuit 20 can further include flex ground pads 35 that can each be defined by portions of the first electrically conductive layer 22 that was not removed to make anti-pad 32 around the flex signal pads 30. The flex ground pads 35 can be at least partially or entirely aligned with the flex signal pads 30 along the lateral direction A. The flex signal pads 30 can define first differential flex signal pair pads 30A on or adjacent to the first flex circuit side 23A. At least one flex ground pad 35 can be positioned between the first differential flex signal pair pads 30A.

Figure 1E:
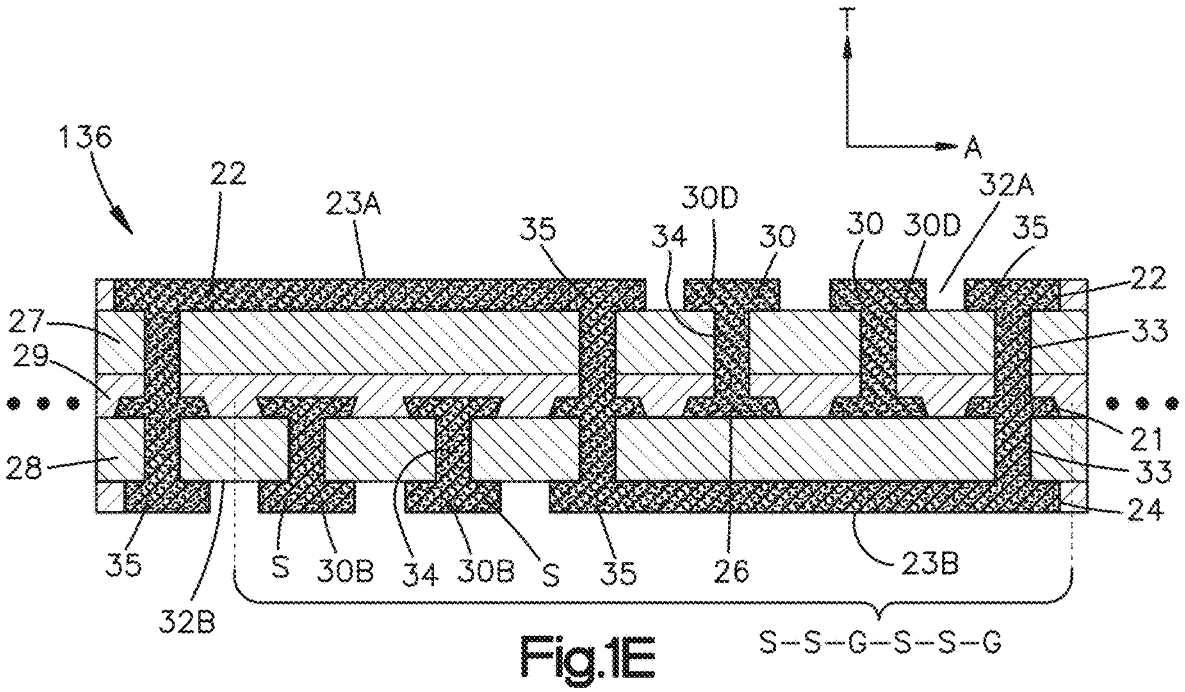
FIG. 1E is a cross-section of a portion of the flex circuit shown in FIG. 1A through a mating region at a second circuit end.

FIG. 1E depicts a cross-sectional view of a second circuit end 136 of the flex circuit 20. Unlike the single-sided first circuit end 134 depicted in FIGS. 1C and 1D, FIG. 1E depicts a double-sided connection in which electrical connections can be made to both the first and second flex circuit sides 23A, 23B of the flex circuit 20. The flex signal pads 30 can include fourth differential flex signal pair pads 30D positioned on the first flex circuit side 23A. The fourth differential flex signal pair pads 30D can be substantially coplanar with the first electrically conductive layer 22. The flex signal pads 30 can further include second differential flex signal pair pads 30B positioned on the second flex circuit side 23B. The second differential flex signal pair pads 30B can be substantially coplanar with the second electrically conductive layer 24 to form a double-sided flex circuit. Thus, referring again to FIGS. 4A and 4B for context, corresponding first and second rows of first electrical contacts 44 of the first electrical connector 42 can mate with the respective second and fourth differential flex signal pair pads 30B, 30D and respective flex ground pads 35. Returning back to FIG. 1E, the second differential flex signal pair pads 30B in the first row can be offset from the sequentially adjacent and opposite fourth differential flex signal pair pads 30D in the second row along the lateral direction A by less than a row pitch, a row pitch or more than a row pitch. In this example, anti-pads 32 can be a first plurality of anti-pads 32A that can separate and electrically isolate the fourth differential flex signal pair pads 30D from the first electrically conductive layer 22 and a second plurality of anti-pads 32B that can separate and electrically isolate the second differential flex signal pair pads 30B for the second electrically conductive layer 24.

Respective flex signal pads 30 can be electrically connected to a respective one of the flex signal conductors 26. In particular, the flex circuit 20 can include a plurality of electrically conductive signal vias 34 that can each extend from a respective flex signal pad 30 to a respective flex signal conductor 26. In particular, the flex signal pads 30 can be aligned with a respective one of the flex signal conductors 26 along the transverse direction T. The signal vias 34 can extend from a respective one of the flex signal pads 30 from an aligned one of the flex signal conductors 26 along the transverse direction T. In one example, each flex signal pad 30 can be connected to a respective single one of the flex signal conductors 26 by a single signal via 34, though it should be appreciated that a flex signal pad 30 can be connected to a single one of the flex signal conductors 26 by more than one signal via 34 if desired. The signal via 34 can extend into, but not through, both the flex signal pad 30 and the flex signal conductor 26 along the transverse direction T, if desired. Alternatively, respective signal vias 34 can respectively extend through a corresponding the flex signal pad 30 and a corresponding flex signal conductor 26 along the transverse direction T.

The flex circuit 20 can further include flex ground pads 35 that can be defined by the first electrically conductive layer 22 and can be at least partially or entirely aligned with the flex signal pads 30 or fourth differential flex signal pair pads 30D along the lateral direction A, and flex ground pads 35 that can be defined by the second electrically conductive layer 24 can be at least partially or entirely aligned with the flex signal pads 30 or second differential flex signal pair pads 30B along the lateral direction A.

While the cross-sectional view FIGS. 1D and 1E show all the flex signal pads 30, the second differential flex signal pair pads 30B, the fourth differential flex signal pair pads 30D, and the flex ground pads 35 all lying in a common plane defined by the transverse and lateral directions, these flex signal pads 30, second differential flex signal pair pads 30B, the fourth differential flex signal pair pads 30D and flex ground pads 35 may be staggered or offset in the longitudinal direction. For example, the flex ground pads 35 may be closer to the first circuit end 134 of the flex circuit 20 than the flex signal pads 30. Also, the flex signal pads 30 may be arranged in rows offset in the longitudinal direction. There may be one, two, three, four, five, six, seven, eight or more longitudinally offset rows of flex signal pads 30 and/or second and fourth differential flex signal pair pads 30B, 30D.

Figure 1F:
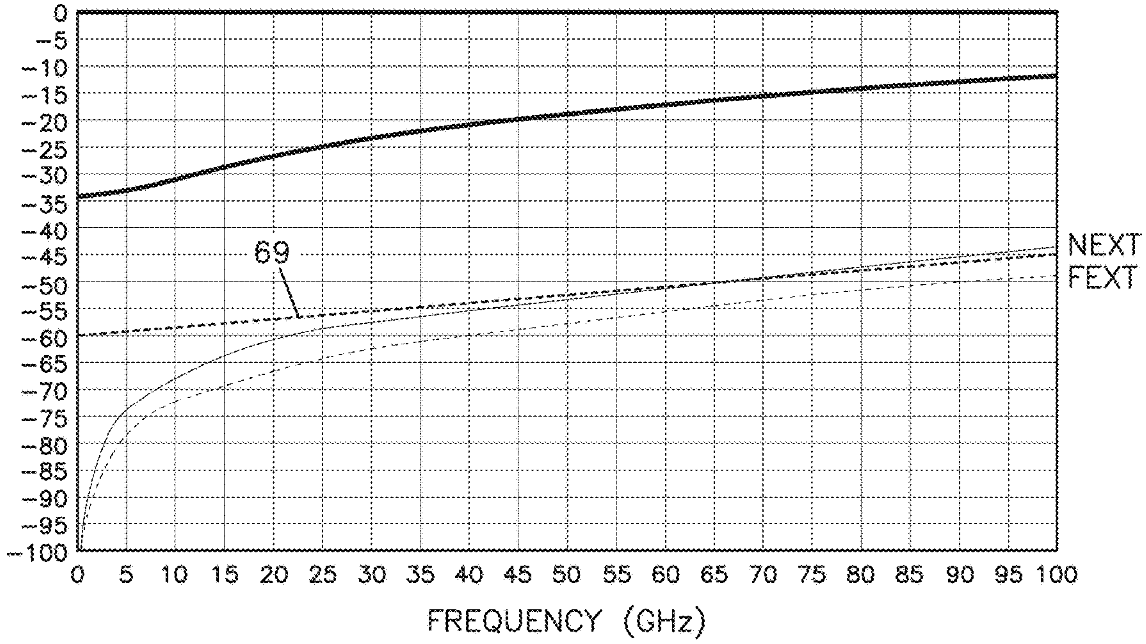
FIG. 1F is a chart that plots NEXT, FEXT, IR, and RL as a function of operating frequency for the flex circuit of FIGS. 1A-1E.

FIG. 1F shows signal integrity model data of the flex circuits 20 of FIGS. 1A-1E including worst-case multi-active asynchronous far-end cross talk (FEXT), worst-case multi-active asynchronous near-end cross talk (NEXT), insertion loss (IL) and return loss (RL) that occurs when transmitting signals along respective flex signal conductors 26. FIG. 1F shows the value of these various parameters plotted against the frequency of the signals that propagate along the flex differential signal pair S1, S2 of flex signal conductors 26. The length of the modeled flex circuit 20 is 3.65 mm, end-to-end, with flex signal pads 30. Second reference line 59 is shown to allow comparison of the propagation characteristics of this flex circuit 20 as compared to other flex circuits 20 described below. Inspection of FIG. 1F shows that the modeled FEXT is no more than approximately −55 dB worst-case multi-active asynchronous cross talk, and the modeled NEXT is no more than approximately −50 dB worst-case multi-active asynchronous cross talk at a frequency up to and including 60 GHz.

The flex circuit 20 may be part of a digital communication system that transmits and/or receives digital information. The digital information may be in many formats, but a commonly used format is a non-return-to-zero (NRZ) format. For this format the information transfer rate, which may be expressed in Gigabits per second (Gbps), may be twice the bandwidth of the transmission system. For example, a system capable of transmitting signals at 50 GHz can support an information transfer rate of approximately 100 Gpbs. It should be appreciated that the flex circuit 20 may be used with different communication formats, such as 112G PAM-4, and is not limited to use with a NRZ format.

If FEXT and NEXT values of −55 dB and −50 dB, respectively, are acceptable in a communication system, then the flex circuit 20 may be used to transmit information at data transfer rates up to approximately 120 Gpbs. Specifically flex circuit 20 may be part of a system in which the data transfer rate is at least approximately 12 gigabits per second up to approximately 112 gigabits per second, including approximately 15 gigabits per second, approximately 20 gigabits per second, approximately 25 gigabits per second, approximately 30 gigabits per second, approximately 35 gigabits per second, approximately 40 gigabits per second, approximately 45 gigabits per second, approximately 50 gigabits per second, approximately 55 gigabits per second, approximately 60 gigabits per second, approximately 65 gigabits per second, approximately 70 gigabits per second, approximately 75 gigabits per second, approximately 80 gigabits per second, approximately 85 gigabits per second, approximately 90 gigabits per second, approximately 95 gigabits per second, approximately 100 gigabits per second, approximately 105 gigabits per second, and approximately 110 gigabits per second.

Figure 2A:
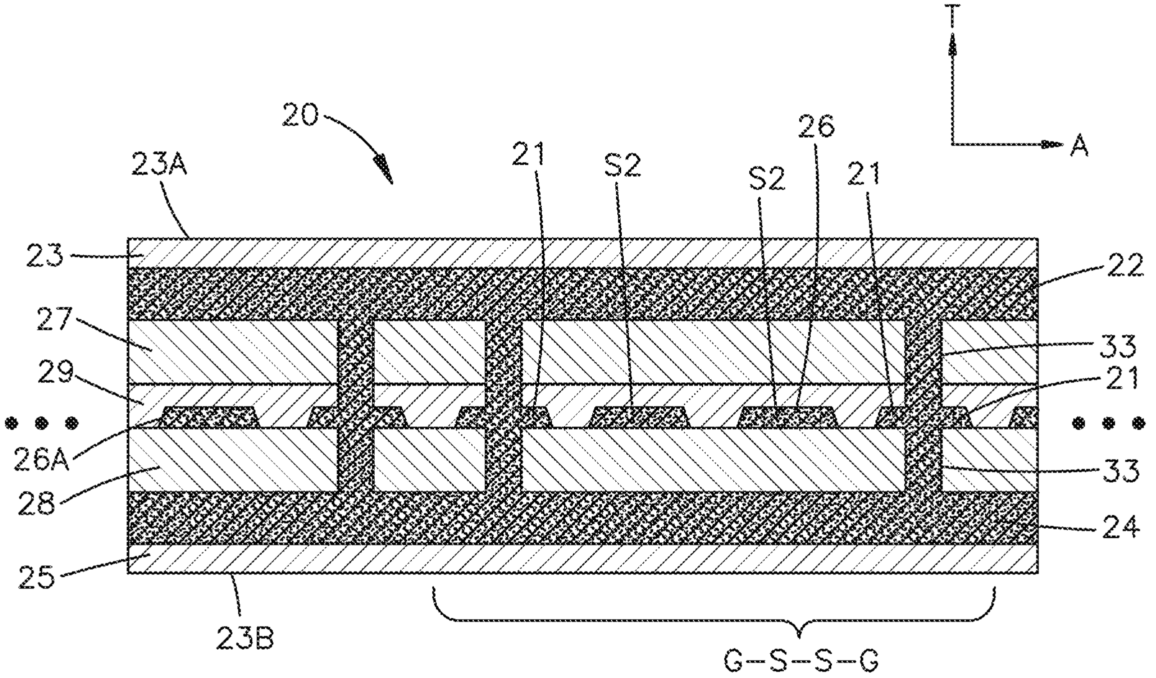
FIG. 2A is a cross-section of a portion of a three-layer flex circuit having two grounds between adjacent differential signal pairs.
Figure 2B:
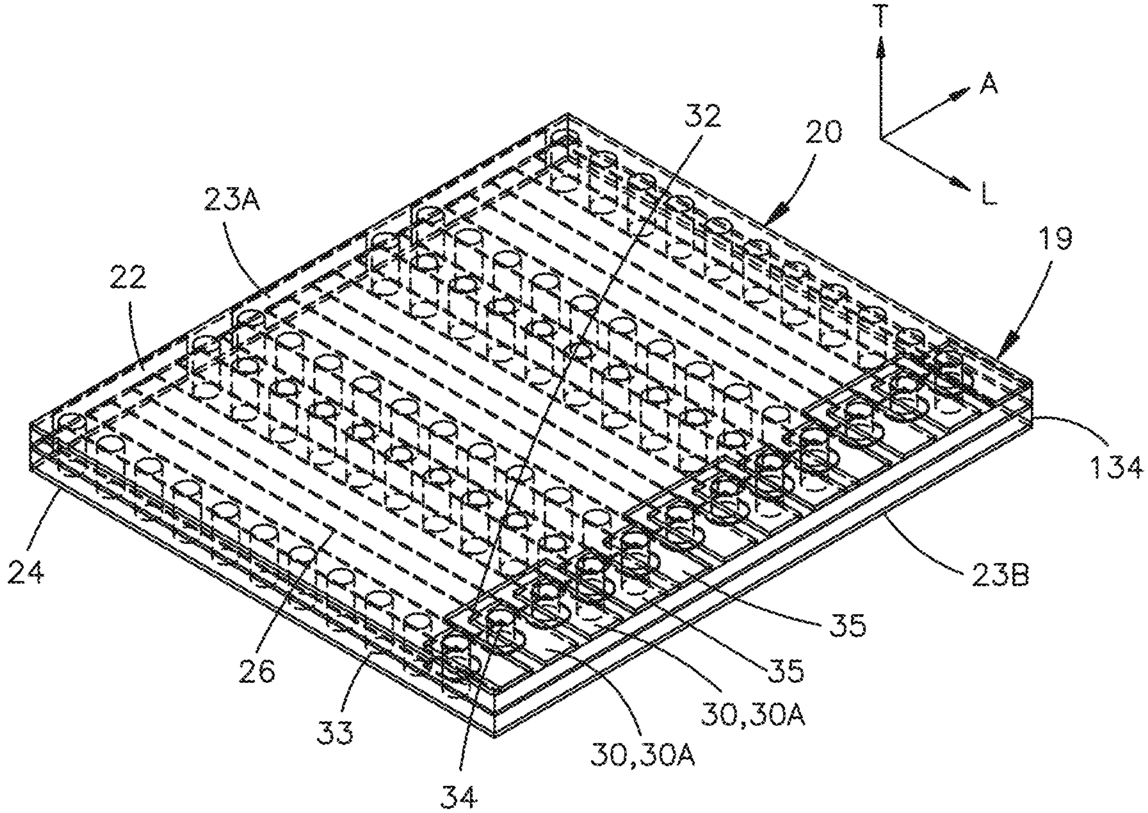
FIG. 2B is a perspective view of the flex circuit shown in FIG. 2A with a mating region at a first circuit end of the flex circuit.

Referring now to FIG. 2A, which shows a non-flex mating region cross-section of a first circuit end 134 of a portion of a flex circuit 20 and FIG. 2B which shows a perspective view of the same first circuit end 134 of the flex circuit 20. Unlike the flex circuit 20 described relative to FIGS. 1A-1F, FIGS. 2A and 2B depict a flex circuit 20 with a repeating G-S-S-G pattern along the lateral direction A. Each pair of immediately adjacent flex signal contacts 26 can define a flex differential signal pair S1, S2 or first differential flex signal pair pads 30A. The flex circuit 20 can include a flex mating region 19 on the first circuit end 134 that is configured to be mated or mounted to a complementary electrical component such as any one selected from (all described later) a first electrical connector 42, a second electrical connector 60, a die package substrate 74, a third electrical connector 80, a package connector 138 or package pads 162.

FIG. 2B shows a portion of the flex circuit 20 exposing the flex mating region 19. In the flex mating region 19 the first outer dielectric layer 23 may be removed, exposing the first electrically conductive layer 22. The flex mating region 19 can include a plurality of flex signal pads 30 in electrical communication with respective flex signal conductors 26. Each flex ground pad 35 can each be in electrical communication with a respective flex ground conductor 21. At least some of the flex signal pads 30 can be substantially coplanar with the first electrically conductive layer 22. In one example, all of the flex signal pads 30 can be coplanar with the first electrically conductive layer 22 in a plane that includes the lateral direction A and the longitudinal direction L. Thus, referring again to FIGS. 4A and 4B for context, a single row of first electrical contacts 44 can mate with all of the flex signal pads 30.

FIG. 2B shows that flex signal pads 30 can all be coplanar with the first electrically conductive layer 22. The flex circuit 20 can include anti-pads 32 or gaps that extend through the first electrically conductive layer 22 along the transverse direction T, to separate and electrically isolate the at least some flex signal pads 30 or the first differential flex signal pair pads 30A from the first electrically conductive layer 22. The flex signal conductors 26 and the flex ground conductors 21 can be arranged such that a pair of immediately adjacent flex ground conductors 21 is disposed between the first differential flex signal pair pads 30A along the lateral direction A. Thus, the flex circuit 20 can define a repeating G-S-S-G pattern along the lateral direction A. The flex signal conductors 26 can be arranged such that immediately adjacent ones of the flex signal conductors 26 can be spaced from each other along the lateral direction along a center-to-center conductor pitch that is in a range from approximately 0.3 mm to approximately 0.5 mm. For instance, the conductor pitch can be approximately 0.35 mm. For this exemplary conductor pitch the pitch of a repeating pattern would be approximately 1.4 mm. It is noteworthy that for the same contact spacing the repeating pattern pitch of a G-S-S-G pattern is larger than the G-S-S configuration described relative to FIGS. 1A-1F due to the presence of an extra flex ground conductor G in the repeating pattern, such in the repeating G-S-S-G pattern.

Figure 2C:
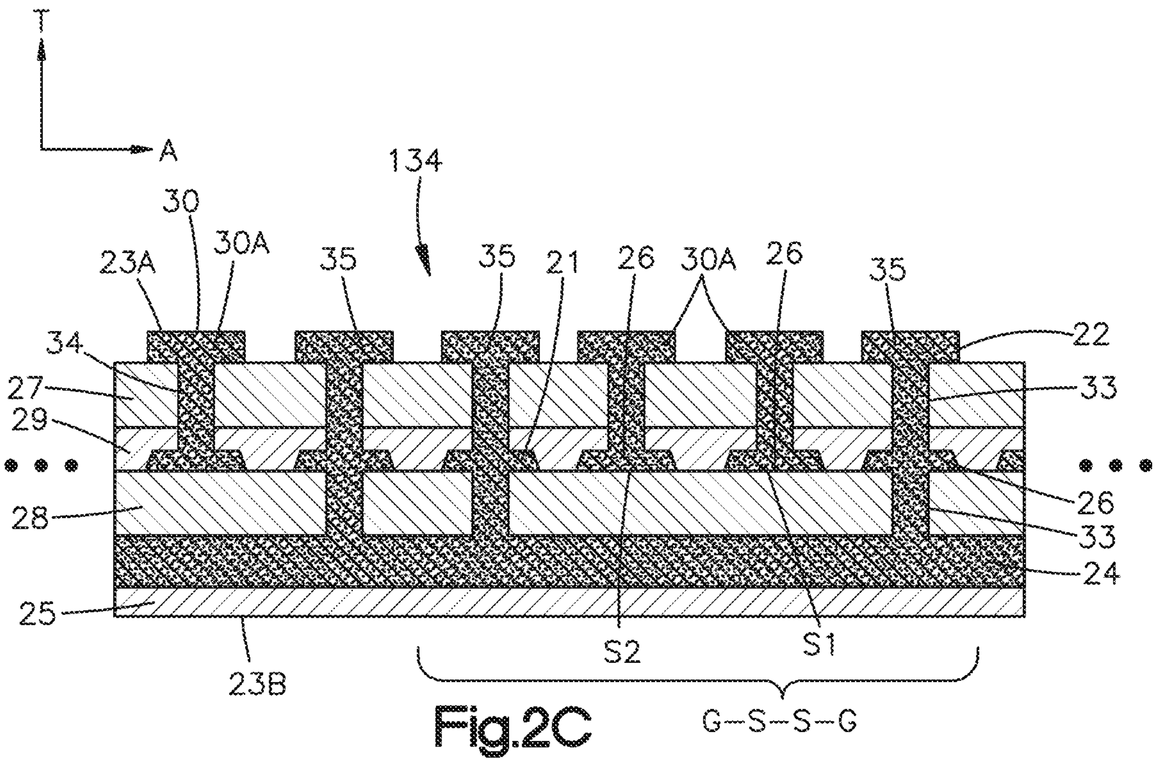
FIG. 2C is a cross-section of a portion of the flex circuit shown in FIG. 2B through a mating region at a first circuit end.

FIG. 2C shows a cross-sectional view of a portion of the flex circuit 20 at a first circuit end 134 of the flex circuit 20. The first circuit end 134 may be referred to as a single sided connection, since all electrical connections to the first circuit end 134 are made on one side of the flex circuit 20, such as the first flex circuit side 23A or the second flex circuit side 23. The signal contact pads 30 can be electrically connected to a respective one of the flex signal conductors 26. In particular, the flex circuit 20 can include a plurality of electrically conductive signal vias 34 that can each extend from one of the flex signal pads 30 to a respective one of the flex signal conductors 26. In particular, the flex signal pads 30 can be aligned with a respective one of the flex signal conductors 26 along the transverse direction T. The signal vias 34 can extend from a respective one of the flex signal pads 30 from an aligned one of the flex signal conductors 26 along the transverse direction T. In one example, each flex signal pad 30 can be connected to a respective single flex signal conductor 26 by a single signal via 34, though it should be appreciated that flex signal pads 30 can be connected to a single one of the flex signal conductors 26 by more than one signal via 34 if desired. The signal via 34 can extend into but not through each of the flex signal pad 30 and the flex signal conductor 26 along the transverse direction T, if desired. Alternatively, signal via 34 can extend through each of the flex signal pad 30 and the flex signal conductor 26 along the transverse direction T.

Figure 2D:
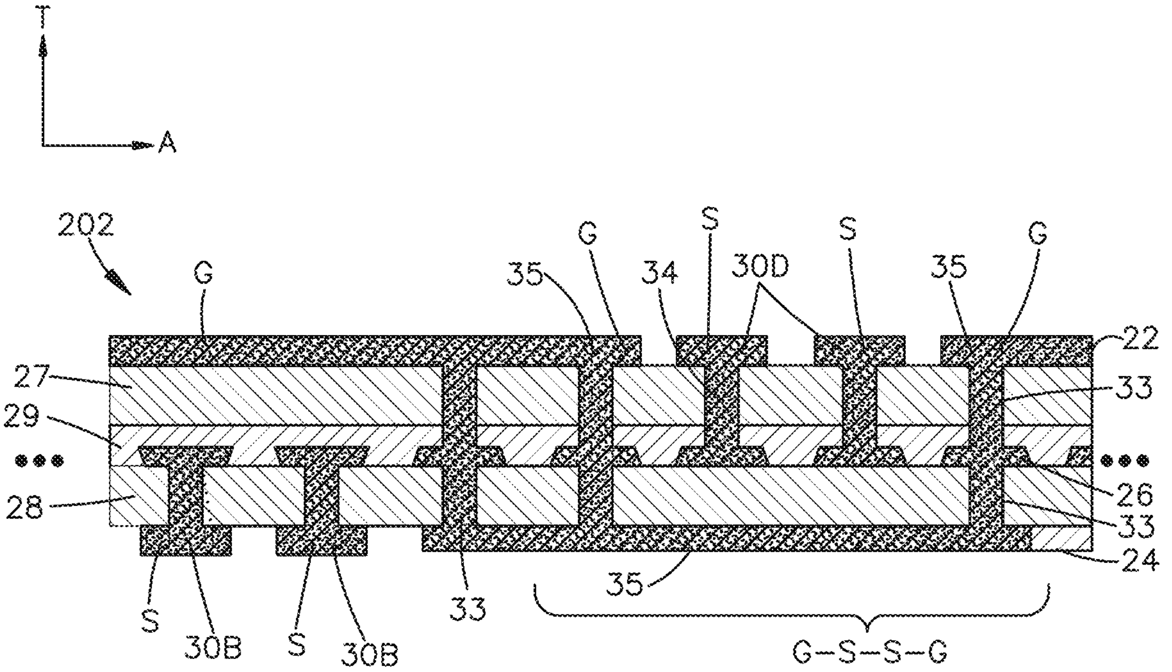
FIG. 2D is a cross-section of a portion of the flex circuit shown in FIG. 2A through a mating region at a second circuit end.

FIG. 2D depicts a cross-sectional view of a second circuit end 136 of the flex circuit 20. Unlike the first circuit end 134 depicted in FIG. 2C which shows a single-sided connection, FIG. 2D depicts a double-sided connection in which electrical connections can be made to both the first and second flex circuit sides 23A and 23B. The fourth differential flex signal pair pads 30D can be substantially coplanar with the first electrically conductive layer 22, and the second differential flex signal pair pads 30B can be substantially coplanar with the second electrically conductive layer 24 to form a double-sided flex circuit. Further, the fourth differential flex signal pair pads 30D can be offset with respect to the sequentially adjacent and opposite second differential flex signal pair pads 30B along the lateral direction A. In this example, anti-pads 32 can be a first plurality of anti-pads 32A that can separate and electrically isolate the fourth differential flex signal pair pads 30D from the first electrically conductive layer 22. The flex circuit 20 can include a second plurality of anti-pads 32B that can separate and electrically isolate the second differential flex signal pair pads 30B from the second electrically conductive layer 24.

Figure 2E:
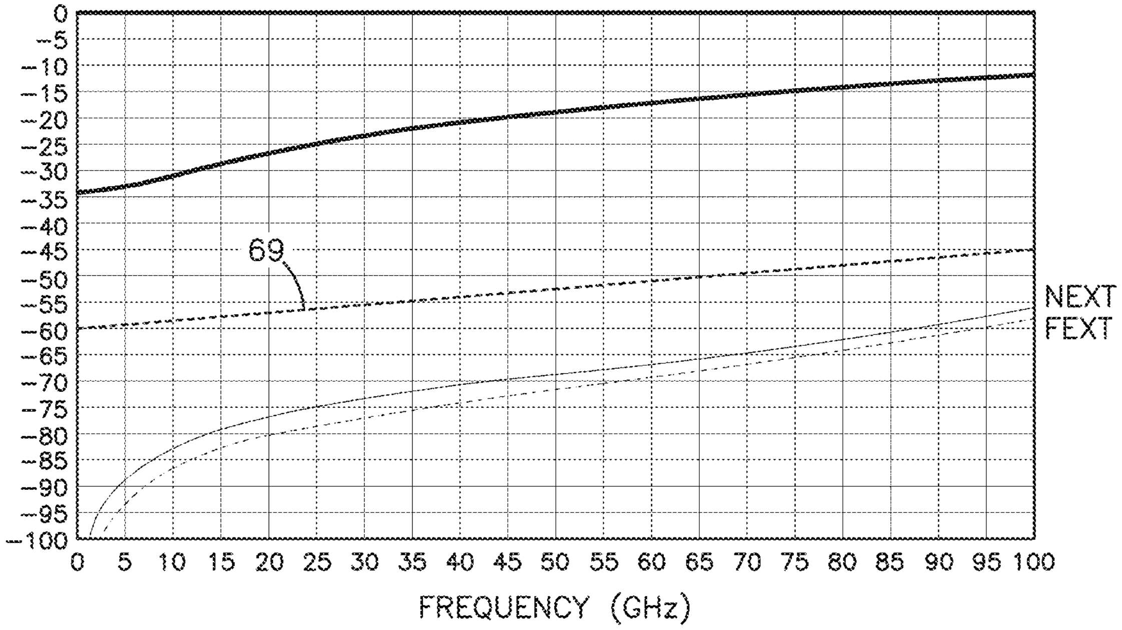
FIG. 2E is a chart that plots NEXT, FEXT, IR, and RL as a function of operating frequency for the flex circuit of FIGS. 2A-2D.

FIG. 2E shows modeled signal integrity data of the flex circuit 20 of FIGS. 2A-2D, including worst-case multi-active asynchronous far-end cross talk (FEXT), worst-case multi-active asynchronous near-end cross talk (NEXT), insertion loss (IL) and return loss (RL) that occurs when transmitting signals along respective flex signal conductors 26. The length of the flex circuit 20 is 3.65 mm, end-to-end. Values for these parameters are plotted against the frequency of the signals that propagate along the flex signal conductors 26. Reference line 59 is in the same position as on the earlier FIG. 1F.

As shown, the modeled flex circuit 20 can be configured to transmit data at frequencies up to approximately 80 GHz along the flex signal conductors 26 while producing no more than approximately −60 dB worst-case multi-active asynchronous cross talk. For instance, the modeled flex circuit 20 can be configured to transmit data at frequencies up to approximately 55 GHz along the flex signal conductors 26 while producing no more than approximately −65 dB worst-case multi-active asynchronous near-end cross talk. Additionally, the modeled flex circuit 20 can be configured to transmit data along the flex signal conductors 26 at frequencies up to approximately 100 GHz while producing no more than approximately −55 dB worst-case multi-active asynchronous cross talk. At 60 GHz the FEXT and NEXT values are approximately −65 dB and −68 dB, respectively. In still other examples, the modeled flex circuit 20 can be configured to transmit data along the flex signal conductors 26 at frequencies up to approximately 70 GHz with no more than approximately −15 dB return loss. Comparison with the reference line 59 helps to illustrate that the crosstalk of the flex circuit with two ground conductors between flex differential signal pairs S1, S2 is in the range of approximately 10 to 15 dB lower than that of the flex circuit 20 with a single flex ground conductor G between flex differential signal pairs S1, S2 (shown in FIG. 1F) over much of the frequency range up to 100 GHz.

If FEXT and NEXT values of −65 dB and −68 dB, respectively, are acceptable in a communication system, then the modeled flex circuit 20 may be used to transmit information at data transfer rates up to approximately 120 Gbps. Specifically flex circuit 20 may be part of a system in which the data transfer rate is at least approximately 12 gigabits per second up to approximately 112 gigabits per second, including approximately 15 gigabits per second, approximately 20 gigabits per second, approximately 25 gigabits per second, approximately 30 gigabits per second, approximately 35 gigabits per second, approximately 40 gigabits per second, approximately 45 gigabits per second, approximately 50 gigabits per second, approximately 55 gigabits per second, approximately 60 gigabits per second, approximately 65 gigabits per second, approximately 70 gigabits per second, approximately 75 gigabits per second, approximately 80 gigabits per second, approximately 85 gigabits per second, approximately 90 gigabits per second, approximately 95 gigabits per second, approximately 100 gigabits per second, approximately 105 gigabits per second, and approximately 110 gigabits per second.

Extrapolation of the modeling results shown in FIG. 2E to higher frequencies suggests that FEXT and NEXT value at 130 GHz will be no more than −45 dB. Therefore, assuming −45 dB is an acceptable crosstalk limit in the electrical communication system, the flex circuit 20 may be utilized to transmit signals to approximately 256 Gbps.

While FIGS. 1A-1F and their associated description disclose a three-layer flex circuit 20 with a G-S-S repeating pattern and FIGS. 2A-2E and their associated description disclose a three-layer flex circuit 20 with a G-S-S-G repeating pattern, it should be appreciated a flex circuit 20 may be arranged to have both types of repeating patterns. For example, it may be beneficial to add an extra flex ground conductor 21 between groups of transmit flex differential signal pairs S1, S2 and groups of receive flex differential signal pairs S1, S2. Thus, most flex differential signal pairs S1, S2 can be separated by a single flex ground conductor 21, but some flex differential signal pairs S1, S2 may be separated by a double flex ground conductor 21.

The flex circuit 20 of FIGS. 1A-1F (G-S-S repeating pattern) can have a greater density of flex signal conductors 26 than the flex circuit 20 of FIGS. 2A-2D (G-S-S-G repeating pattern); however, the G-S-S-G repeating pattern can provide greater signal integrity as evidenced by lower FEXT and NEXT values for the same frequency. Depending on the system requirements, either the G-S-S repeating pattern, G-S-S-G repeating pattern, or a mixture of the two repeating patterns may be advantageous. Alternatively, the flex signal conductors 26 can be single ended, that is having a single flex signal conductor 26 surrounded by or flanked on both sides by flex ground conductors 21. In this case, the repeating pattern can be simply S-G.

Figure 3A:
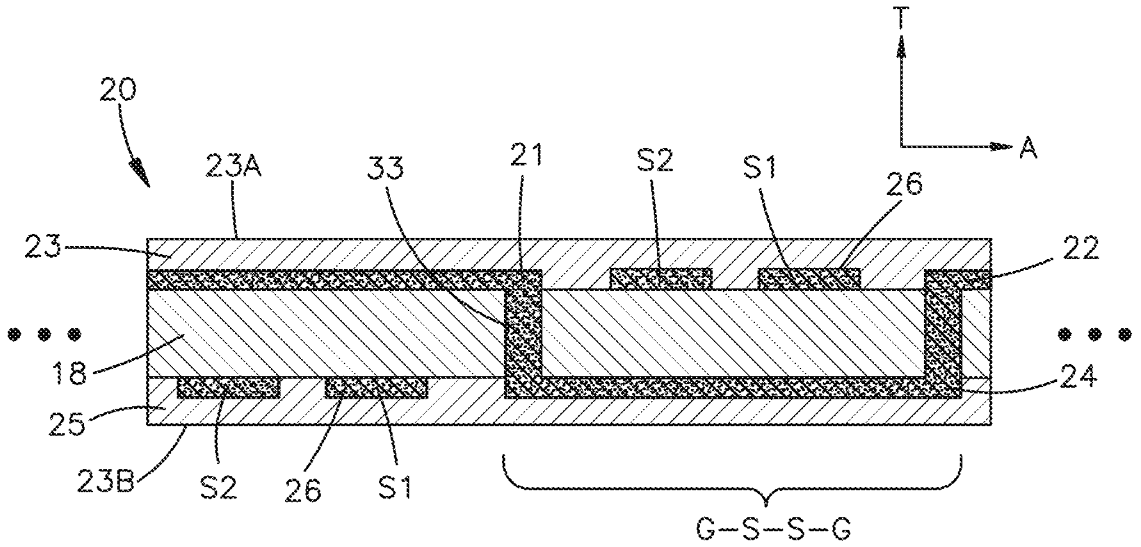
FIG. 3A is a cross-section of a portion of the flex circuit having two-layers.

FIG. 3A shows a portion of a cross-section of a two-layer flex circuit 20 away from the first and second circuit ends 134, 136. Unlike the three-layer flex circuits 20 disclosed above, the flex circuit 20 of FIG. 3A can have only two electrically conductive layers, the first electrically conductive layer 22 and the second electrically conductive layer 24. The electrically conductive layers 22 and 24 can be separated by a central dielectric layer 18. The first electrically conductive layer 22 may be covered by a first outer dielectric layer 23. Similarly, the second electrically conductive layer 24 may be covered by a second outer dielectric layer 25. Outer surfaces of the first outer dielectric layer 23 and second outer dielectric layer 25 can form the first flex circuit side 23A and second flex circuit side 23B of the flex circuit 20 along the transverse direction, T. Flex signal conductors 26 may be formed in both the first and second electrically conductive layers 22 and 24. Optional ground vias 33 may connect ground regions of both the first and second electrically conductive layers 22 and 24.

The two-layer flex circuit 20 depicted in FIG. 3A can have adjacent flex differential signal pairs S1, S2 positioned on opposite, first and second flex circuit sides 23A and 23B of the flex circuit 20. In other embodiments, all the flex differential signal pairs S1, S2 may be positioned on a single side of the flex circuit 20, either first flex circuit side 23A or second flex circuit side 23B. In still other embodiments, all flex differential signal pairs S1, S2 that transmit signals may be on the first flex circuit side 23A of the flex circuit and all flex differential signal pairs S1, S2 that receive signals may be on the second flex circuit side 23B.

For brevity, the first and second circuit ends 134, 136 of the flex circuit 20 shown in FIG. 3A are not shown, but flex signal pads 30 and flex ground pads 35 may be arranged as shown in FIG. 1D, 1E, 2C, or 2D.

Use of a two-layer flex circuit 20 instead of a three-layer flex circuit has some advantages and disadvantages. Advantageously a two-layer flex circuit 20 may be less expensive and more flexible than a three-layer flex circuit 20. These advantages can come with potential disadvantages such as higher propagation losses and greater crosstalk.

Figure 3B:
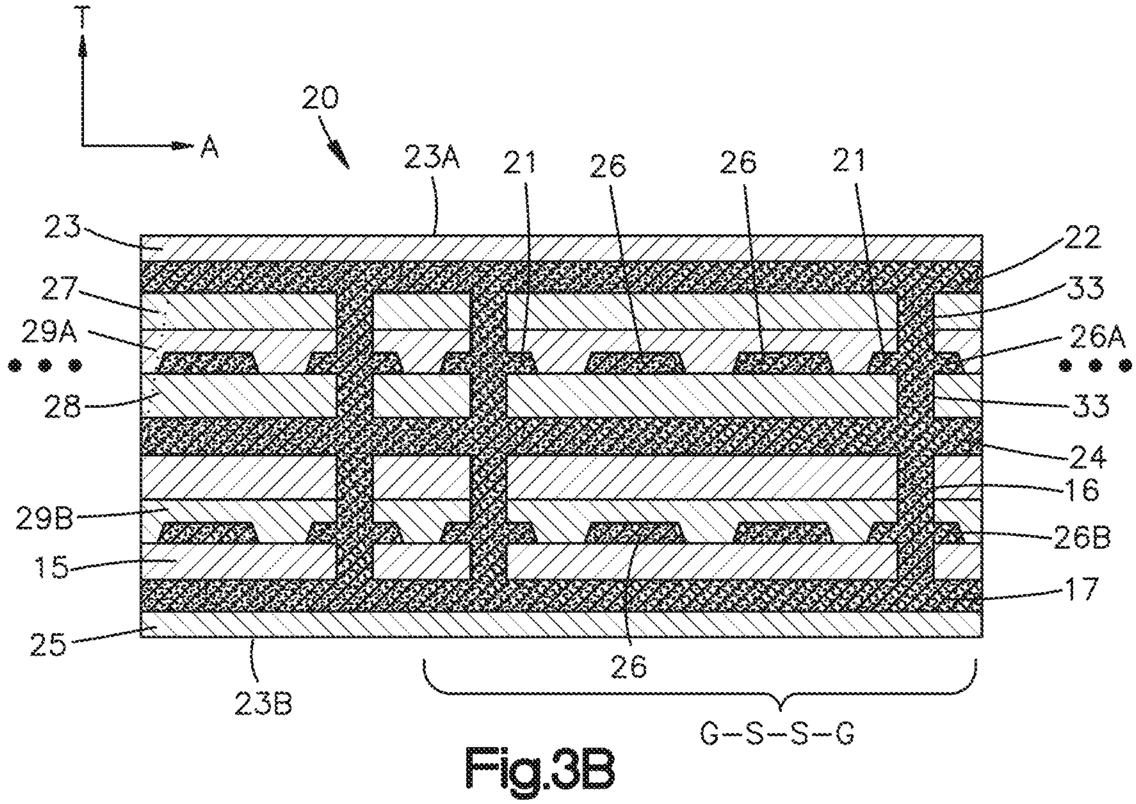
FIG. 3B is a cross-section of a portion of the flex circuit having five-layers.

FIG. 3B shows a portion of a cross-section of a five-layer flex circuit 20 away from the first and second circuit ends 134, 136. The five-layer flex circuit 20 depicted in FIG. 3B can have a repeating G-S-S-G pattern, but any of the previously described repeating patterns may be used with a five-layer flex circuit 20. The flex circuit 20 may have two opposing first and second flex circuit sides 23A and 23B. The opposing first and second flex circuit sides 23A and 23B may be covered by a first outer dielectric layer 23 and a second outer dielectric layer 25, respectively. There may be three electrically conductive layers, first electrically conductive layer 22, second electrically conductive layer 24, and third electrically conductive layer 17. The first electrically conductive layer 22, second electrically conductive layer 24, and third electrically conductive layer 17 may serve as ground planes. Situated between the first electrically conductive layer 22 and the second electrically conductive layer 24 may be a first electrical signal conductor layer 26A. Situated between the second electrically conductive layer 24 and the third electrically conductive layer 17 may be a second electric signal conductor layer 26B. Situated between the first electrically conductive layer 22 and the first electrical signal conductor layer 26A may be a first inner dielectric layer 27 and a first bond sheet 29A. Situated between the first electrical signal conductor layer 26A and the second electrically conductive layer 24 may be a second inner dielectric layer 28. Situated between the second electrically conductive layer 24 and the second electrical signal conductor layer 26B may be a third inner dielectric layer 16 and a second bond sheet 29B. Situated between the second electrical signal conductor layer 26B and the third electrically conductive layer 17 may be a fourth inner dielectric layer 15. The first and second bond sheets 29A and 29B may help to adhesively connect layers of the flex circuit 20 together. Ground vias 33 may extend between the first electrically conductive layer 22, flex ground conductors 21 in the first electrical signal conductor layer 26*a*, the second electrically conductive layer 24, flex ground conductors 21 in the second electrical signal conductor layer 26*b* and the third electrically conductive layer 17. As described earlier in some embodiments the ground vias 33 may be omitted or may be in a different arrangement than that shown in FIG. 3B to minimize electrical resonances in the flex circuit 20. While FIG. 3B shows an exemplary arrangement of a five-layer flex circuit 20, in other embodiments the arrangement of dielectric layers and bonding sheets may be modified, and additional layers or sheets may be added or omitted.

Although not shown in FIG. 3B, at the end regions of the five-layer flex circuit 20, signal vias 34 may route first and second flex signal conductors 26 to flex signal pads 30 in the first and third electrically conductive layers 22, 17 in a manner similar to that described relative to FIGS. 1C-1E and 2D-2E. Flex signal pads 30 can be all located in the first electrically conductive layer 22, all located in the third electrically conductive layer 17, or some flex signal pads 30 can be located in both the first electrically conductive layer 22 and the third electrically conductive layer 17.

Wrapping up possible construction details of the flex circuits 20 described herein, a flex circuit 20 can include a first circuit end 134, an opposed second circuit end 136, a first flex circuit side 23A, and an opposite second flex circuit side 23B. A first electrically conductive layer 22 can be positioned adjacent to the first flex circuit side 23A. A second electrically conductive layer 24 can be positioned opposite the first electrically conductive layer 22, adjacent to the second flex circuit side 23B. A plurality of flex signal conductors 26 can be disposed between the first and second electrically conductive layers 22, 24. A first plurality of flex signal pads 30, which can include first differential flex signal pair pads 30A, can be positioned at the first circuit end 134. A second plurality of flex signal pads 30, which can include second differential flex signal pair pads 30B, can be positioned at the second circuit end 136. The first plurality of flex signal pads 30 can all be positioned on or adjacent to the first flex circuit side 23A and the second plurality of flex signal pads 30 can all be positioned on or adjacent to the second flex circuit side 23B.

A third plurality of flex signal pads 30, which can include third differential flex signal pair pads, can all be positioned at the first circuit end 134 and can all be positioned on or adjacent to the second flex circuit side 23B. The first differential flex signal pair pad 30A of the first plurality of flex signal pads 30 can be offset from an adjacently opposed third differential flex signal pair pad of the second plurality of flex signal pads 30 such that a line perpendicular to both the first and second flex circuit sides passes through one of the flex signal pads 30 of the first differential flex signal pair pads 30A but not either one of the flex signal pads 30 of the third differential flex signal pair pads. Stated another way, sequentially adjacent and opposite first and third differential signal pair pads can be offset by more than a row pitch. Sequentially adjacent and opposite first and third differential signal pair pads can also be offset by a row pitch or by more than no offset but more less than a full row pitch. Sequentially adjacent and opposite second and fourth differential signal pair pads 30B, 30D can be offset by more than a row pitch. Sequentially adjacent and opposite second and fourth differential signal pair pads 30B, 30D can also be offset by a row pitch or by more than no offset but more less than a full row pitch.

The first differential flex signal pair pads 30A, the third differential flex signal pair pads or both can be spaced apart from one another such that at least two-hundred and fifty-six of the first differential flex signal pair pads 30A, the third differential flex signal pair pads or both fit, whether on single flex circuit 20 or more than one flex circuit 20, within an area of approximately 500 square millimeters or approximately 550 square millimeters or approximately 600 square millimeters or approximately 650 square millimeters or approximately 700 square millimeters or approximately 750 square millimeters or approximately 800 square millimeters.

The first plurality of flex signal pads 30 can define first differential flex signal pair pads 30A that can be spaced apart from one another such that a row of at least sixty-four first differential flex signal pair pads 30A fit along a first die package side 178 having a length greater than 50 mm but not more than approximately 75 mm or having a length greater than 55 mm but not more than approximately 80 mm or having a length greater than 60 mm but not more than approximately 85 mm or having a length greater than 65 mm but not more than approximately 90 mm or having a length greater than 70 mm but not more than approximately 95 mm or having a length greater than 75 mm but not more than approximately 100 mm, 105 mm or 110 mm.

A fourth plurality of flex signal pads 30, which can include fourth differential flex signal pair pads 30D, can all be positioned at the second circuit end 136 and all on the first flex circuit side 23A. The third differential flex signal pair pads and adjacently opposed the fourth differential flex signal pair pads 30D can be offset from one another such that a line perpendicular to both the first and second flex circuit sides 23A, 23B passes through one flex signal pad 30 of the second differential flex signal pair pad 30B but not either one of the flex signal pads 30 of the fourth differential flex signal pair pad 30D. The second and fourth differential flex signal pair pads 30B, 30D can also be offset by a row pitch or by more than no offset but more less than a full row pitch. An electrical flex connector 172 can be attached to the second circuit end 136 and can be configured to receive a mating cable connector 174. Respective coaxial and/or twin axial cables 79 can be directly attached to respective ones of the third differential flex signal pair pads, the fourth differential flex signal pair pads 30D, or both.

Flex ground pads 35 can be positioned at the first circuit end 134 on the first flex circuit side 23A. Flex ground pads 35 can be positioned at the second circuit end 136 on or adjacent to the second flex circuit side 23B. Flex ground pads 35 can be positioned at the first circuit end 134 on or adjacent to the second flex circuit side 23B. Flex ground pads 35 can be positioned at the second circuit end 136 on or adjacent to the first flex circuit side 23A. The flex signal pads 30, the flex ground pads 35 or both can be devoid of fusible elements prior to use and during use. The flex circuit 20 can be made from liquid crystal polymer (LCP) material. The flex circuit 20 can be configured to transmit data at frequencies up to 55 GHz while producing no more than −60 dB worst-case multi-active asynchronous cross talk. The flex circuit can be configured to transmit data at frequencies up to 55 GHz while producing no more than −65 dB worst-case multi-active asynchronous near-end cross talk. The flex circuit can be configured to transmit data at frequencies up to 55 GHz while producing no more than −68 dB worst-case multi-active asynchronous far-end cross talk. The flex circuit can be configured to transmit data at frequencies up to 100 GHz while producing no more than −50 dB worst-case multi-active asynchronous cross talk.

A flex circuit 20 can include a first circuit end 134 and a second circuit end 136. The first circuit end 134 can have at least two hundred and fifty-six differential flex signal pair pads. The first circuit end 134 can have a first flex width d1 that is sized and shaped to fit on a first die package side 178 or second package side 180 or third package side 182 or fourth package side 184 of a die package substrate 74 that is approximately 60 mm to approximately 100 mm in length, approximately 70 mm to approximately 90 mm in length, or approximately 75 mm to approximately 85 mm in length. The second circuit end 136 can be sized and shaped to receive at least 128 twin axial cables 79 or at least 256 coaxial cables 79 that are each 32 AWG to 40 AWG, or 32 AWG to 36 AWG, or 33 AWG to 35 AWG. The second circuit end 136 can have a second width d2 between 95 mm and 120 mm.

The flex circuit 20 can include a first flex circuit side 23A, an opposed second flex circuit side 23B and a plurality of flex signal pads 30. Flex signal pads 30 can be arranged as first differential flex signal pair pads 30A on or adjacent to the first flex circuit side 23A, adjacent to the first circuit end 134. Third differential flex signal pair pads can be arranged on or adjacent to the second flex circuit side 23B, adjacent to the first circuit end 134. The first differential flex signal pair pads 30A can be offset from the sequentially adjacent and opposite third differential flex signal pair pads by a row pitch, by more than a row pitch, or by less than a full row pitch. Flex signal pads 30 can also be arranged as fourth differential flex signal pair pads 30D on or adjacent to the first flex circuit side 23A and adjacent to the second circuit end 136. Second differential flex signal pair pads can be positioned on or adjacent to the second flex circuit side 23B and adjacent to the second circuit end 136. The second differential flex signal pair pads 30B can be offset from the sequentially adjacent and opposite fourth differential flex signal pair pads 30D by a row pitch, by more than a row pitch, or by less than a full row pitch.

Examples of electrical communication assemblies 40 will now be described in more detail. The signal integrity data shown and described can apply to all such electrical communication systems including at least one flex circuit 20, unless otherwise indicated.

Referring now to FIGS. 4A-4B, an electrical communication assembly 40 can include the first electrical connector 42 that can further include a plurality of first electrical contacts 44 including first electrical ground contacts 45 and first electrical signal contacts 47, and a dielectric or electrically insulative first connector housing 46 that supports the first electrical contacts 44. The first electrical contacts 44 of the first electrical connector 42 can be configured to be connected physically, electrically or both with the flex signal pads 30 and flex ground pads 35 of the flex circuit 20. Thus, the first electrical signal contacts 47 of the first electrical connector 42 can be placed in electrical communication with respective ones of the flex signal conductors 26 of the flex circuit 20, and the first electrical ground contacts 45 of the first electrical connector 42 can be placed in electrical communication with respective ones of the flex ground conductors 21 of the flex circuit 20. In one example, the electrical connector 42 can be configured to mate with the flex circuit 20 shown, for example in FIG. 2C, such that the first electrical contacts 44 of the first electrical connector 42 physically connect with, electrically connect with or both physically and electrically connector with respective flex signal pads 30 and respective flex ground pads 35 of the flex circuit 20 to define a separable interface.

The first electrical contacts 44 can be profiled. For example, profiled can mean that one or more of the first electrical contacts 44 can be stamped but not formed. That is, they can be cut from a sheet of metal having a material thickness that defines the width of the first electrical contacts 44 along the lateral direction A. In particular, they can be cut from the sheet of metal so as to have a profile that defines their size and shape in a plane that is defined by the longitudinal direction L and the transverse direction T. As a result, in one example, the electrical contacts 44 can remain unbent or unformed after they are cut from the sheet of metal. Alternatively, the electrical contacts 44 can be stamped and formed from the sheet of metal as desired. The first electrical contacts 44 can be arranged in a single row that extends along the lateral direction A, such as the illustrated a broad side to broad side arrangement or in an edge-to-edge arrangement.

The first electrical connector 42 can define a slot or receptacle 48 that extends into a mating end of the first connector housing 46. The receptacle 48 can be configured to receive the flex circuit 20 in a mating direction so as to mate the first electrical contacts 44 with respective flex signal pads 30 and flex ground pads 35. First ground mating ends 51 of the first electrical ground contacts 45 of the first electrical connector 42 can be offset in the longitudinal direction L with respect to first signal mating ends 49 of the first electrical signal contacts 47. Alternatively, the first ground mating ends 51 of the first electrical ground contacts 45 and the first signal mating ends 49 of the first electrical signal contacts 47 can be in line with each other along the lateral direction A. The first electrical connector 42 and the flex circuit 20 can mate along a respective mating direction which can be defined by the longitudinal direction L. The first electrical contacts 44 can define a surface that faces the flex circuit 20 in a first direction, and the first connector housing 46 can define a void 50 that can be aligned with the surface in a second direction opposite the first direction. The void 50 can be sized and shaped as desired for the purposes of impedance matching, such as at the mating interface between the flex circuit and the first electrical connector 42.

The first electrical contacts 44 can each define respective first mounting ends 52 that are configured to be mounted to a complementary electrical component. The electrical communication assembly 40 can include the complementary electrical component, which can be placed in electrical communication with the flex circuit 20 through the first electrical connector 42. The complementary electrical component can be configured as a first substrate 54, such as a printed circuit board (PCB) or an IC die package substrate. The first mounting ends 52 can define a first mounting interface 53 that can face and abut the first substrate 54. Thus, a first mounting interface 53 can be mounted onto a major outer surface 55 of the first substrate 54 that is coplanar with the first mounting interface 53.

Figure 4C:
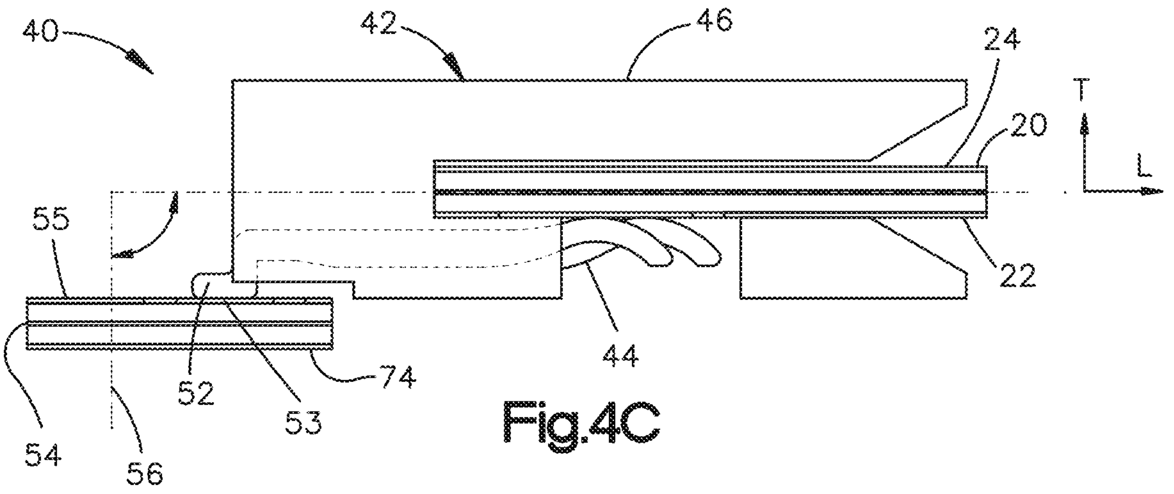
FIG. 4C is a side view of an electrical communication assembly similar to FIG. 4A, but showing a different angle between the flex circuit and substrate.
Figure 4D:
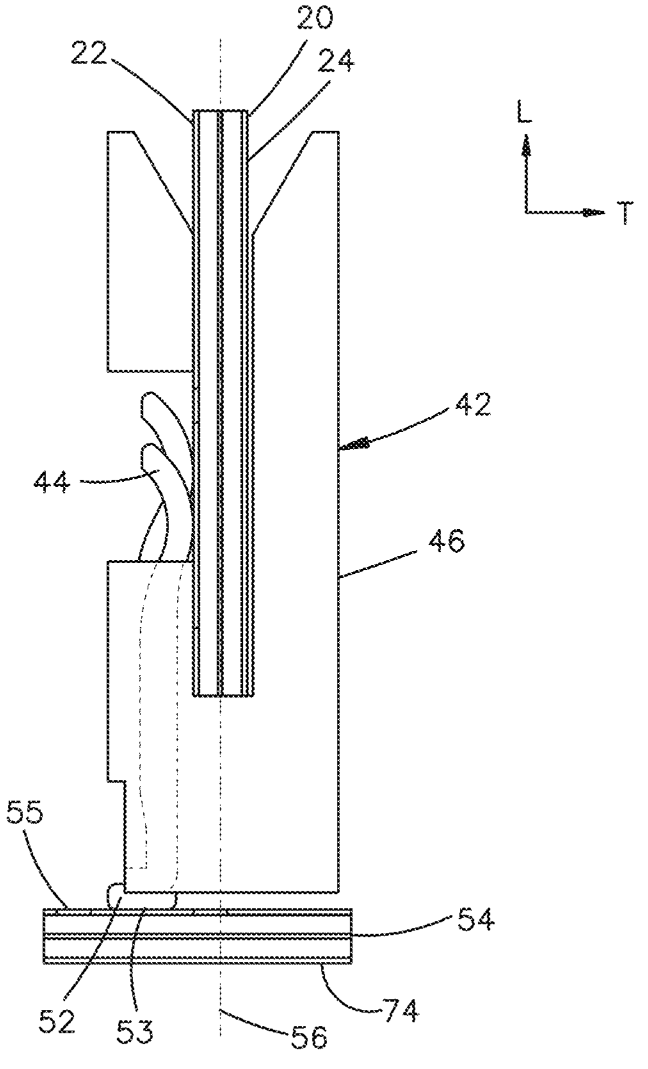
FIG. 4D is a side view of an electrical communication assembly similar to FIG. 4A, but showing a different angle between the flex circuit and substrate.

The first mounting interface 53 can be oriented such that a straight reference line 56 that is oriented perpendicular to the first mounting interface 53, and thus the major outer surface 55 of the first substrate 54, defines an angle with respect to a plane that includes the lateral direction A and the longitudinal direction L of the flex circuit 20. In one example, the angle can be defined by the reference line 56 and the longitudinal direction L of the flex circuit 20. The angle can be in a range up to approximately 90 degrees. The angle illustrated in FIG. 4A can be approximately 60 degrees. In another example illustrated in FIG. 4C, the angle can be approximately 90 degrees. In still another example illustrated in FIG. 4D, the angle can be approximately 0 degrees, such that the reference line 56 can be oriented along the longitudinal direction.

Figure 5A:
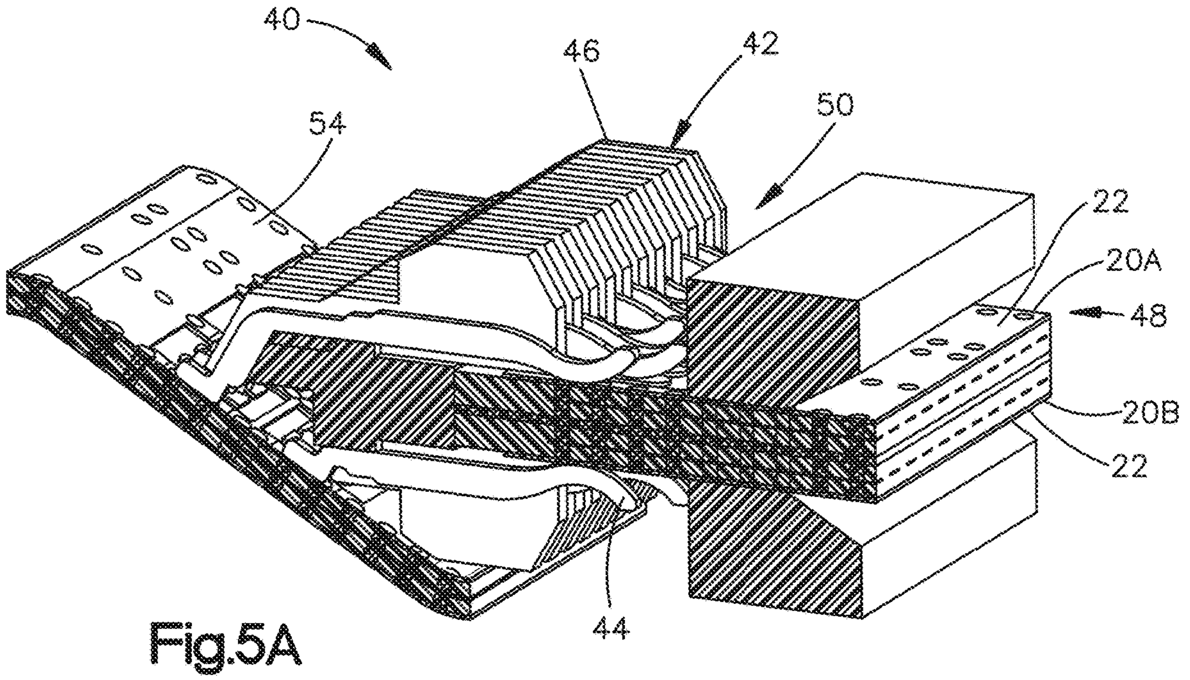
FIG. 5A is a perspective view of an electrical communication assembly similar to FIG. 4A, but showing the electrical connector mated to a pair of flex circuits.
Figure 5B:
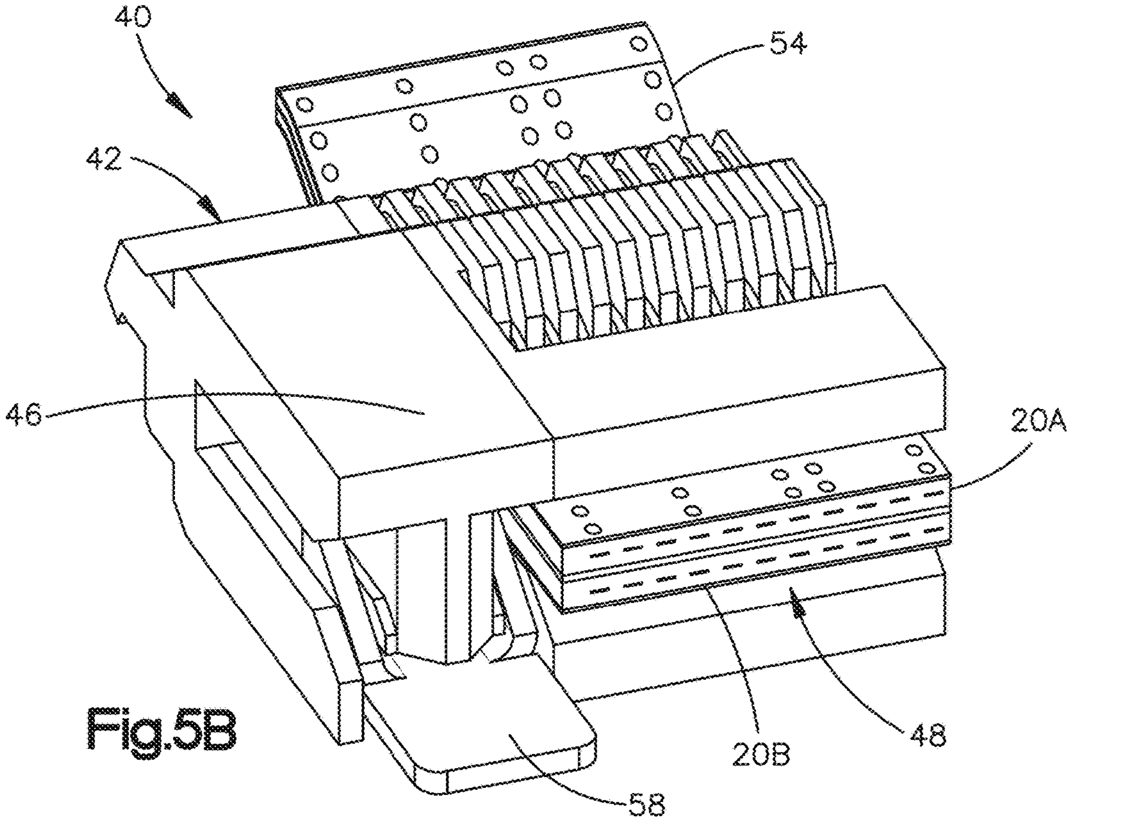
FIG. 5B is another perspective view of an electrical communication assembly of FIG. 5A.

Referring now to FIGS. 5A and 5B, the first electrical connector 42 can be configured such that the first electrical contacts 44 are arranged in first and second rows. In one example, as illustrated, the first row of electrical contacts 44 can mate with corresponding ones of the flex signal pads 30 of a first one 20A of the flex circuits 20 as described above, and the second row of first electrical contacts 44 can mate with the corresponding ones of the flex signal pads 30 of a second one 20B of the flex circuits 20 described above. Mating can occur at respective first circuit ends 134 of the first and second ones 20A, 20B of flex circuits 20. Thus, all flex signal pads 30 of each of the first and second ones 20A, 20B of the flex circuits 20 described above can be coplanar with the respective first electrically conductive layer 22, and all flex ground pads 35 of each of the first and second ones 20A, 20B of the flex circuits 20 described above can be defined by the first electrically conductive layer 22. The respective second electrically conductive layers 24 of the first and second ones 20A, 20B of the flex circuits 20 can face each other. First and second ones 20A and 20B of the flex circuits may be either a two-layer, three-layer flex circuit, or the first one 20A may be a two-layer and the second one 20B may be a three-layer flex circuit. Each of the first and second ones 20A and 20B of the flex circuits 20 can have a single-sided connection at the respective first circuit ends 134 of the first and second ones 20A and 20B.

Alternatively, the first and second ones 20A, 20B of the flex circuits 20 can be combined into a single flex circuit, such as the five-layer flex circuit shown in FIG. 3B, whereby a first plurality of flex signal pads 30 can be substantially coplanar with the first electrically conductive layer 22, and a first plurality of flex ground pads 35 can be defined by the first electrically conductive layer 22. The first row of first electrical contacts 44 can mate with the first plurality of flex signal pads 30 and the first plurality of first flex ground pads 35. Similarly, a second plurality of the flex signal pads 30 can be substantially coplanar with the second electrically conductive layer 24, and a second plurality of flex ground pads 35 can be defined by the second electrically conductive layer 24. Thus, the second row of first electrical contacts 44 can mate with the second plurality of flex signal pads 30 and a second plurality of first flex ground pads 35. The single flex circuit 20 can have a double-sided connection at respective first circuit ends 134 of the first and second ones 20A, 20B of flex circuits 20 or at the respective second circuit ends 136 of first and second ones 20A, 20B of flex circuits 20.

The first electrical connector 42 can be configured to mate with at least one flex circuit 20 or two or more stacked first and second ones 20A, 20B of flex circuits 20. As shown in FIG. 5B, the first electrical connector 42 can further include at least one latch 58 that is configured to move from a locked position to an unlocked position. When in the locked position, the at least one latch 58 can be configured to retain a flex circuit 20 in its mated position with respect to the first electrical connector 42. Thus, an engaged or closed or locked latch 58 resists a backout force applied to the flex circuit 20 in a direction opposite the mating direction. When the latch 58 is in the unlocked position, the flex circuit 20 can be unmated and removed from the first electrical connector 42 in response to the backout force. It can thus be said that the latch 58 is configured to releasably lock the at least one flex circuit 20 in the mated position with the first electrical connector 42.

Figure 6A:
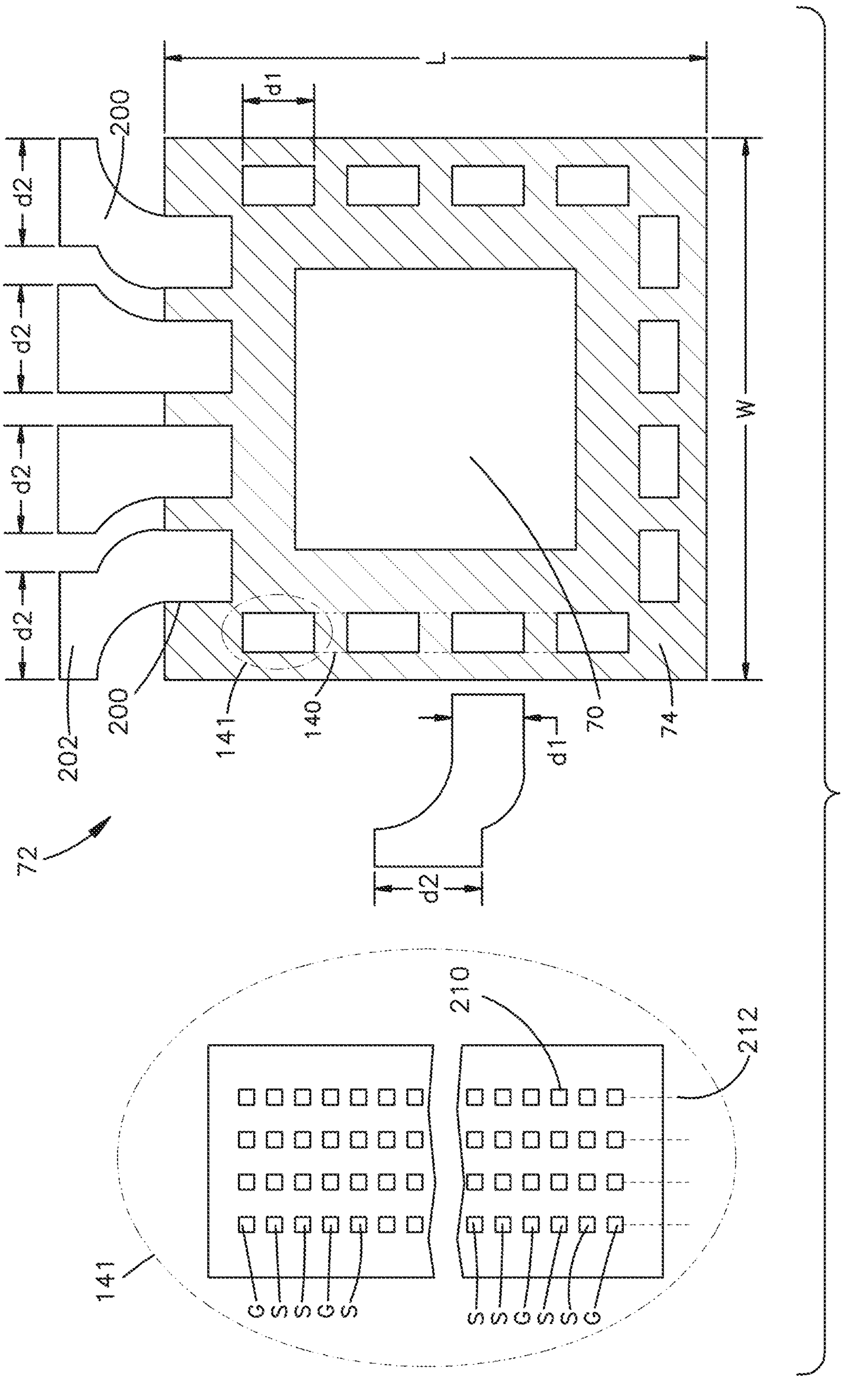
FIG. 6A is a schematic top view of an IC die package 72 connected to a plurality of flex circuits.
Figure 6B:
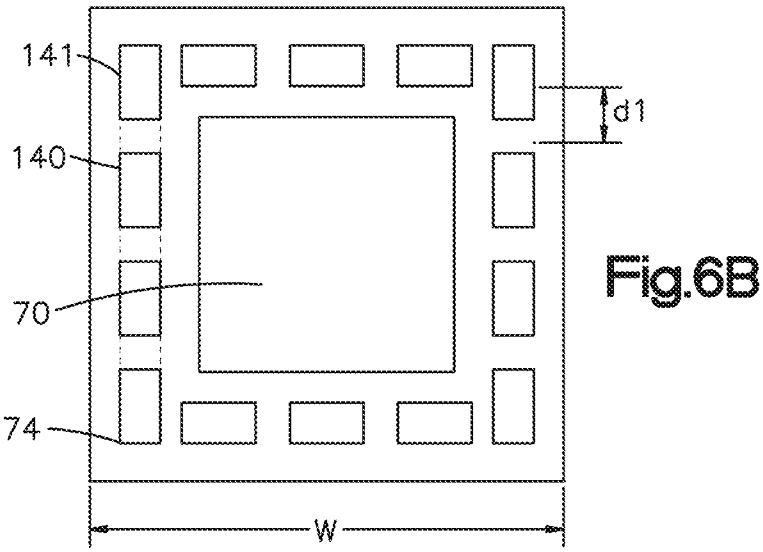
FIG. 6B is a schematic top view of an IC die package 72 having different die package footprints on different side of the IC die package.

FIG. 6A is a schematic top view of an IC die package 72. The IC die package 72 can include a die package substrate 74 and can include an IC die 70 mounted to the die package substrate, such as centrally mounted. The IC die 70 can be approximately 40×40 mm square. The IC die 70 can be SMT mounted to the die package substrate 74, such as be solder balls. The IC die 70 can be directly mounted to the first major surface 200 of the die package substrate 74. The die package substrate 74 can have a width W and a length L. The width W and the length L of the die package substrate 74 may be equal, i.e., the die package substrate 74 can be square. The width W and length L of the die package substrate 74 may be at least approximately 50 mm, such as at least approximately 70 mm, at least approximately 75 mm, at least approximately 80 mm, at least approximately 85 mm, at least approximately 90 mm, at least approximately 95 mm, at least approximately 100 mm, at least 105 mm or at least 110 mm. A die package footprint 140 may be arranged adjacent to a first major surface 200 of the die package substrate 74, such as the surface the die package substrate 74 that carries the IC die 70. A die package footprint 140 may be arranged adjacent to a second major surface 202 of the die package substrate 74. In some embodiments, both first and second major surfaces 200, 202 may have a die package footprint 140, so that electrical connection may be made to both first and second major surfaces 200, 202 of the die package substrate 74. At least two, at least three or at least four respective first, second, third and fourth die package sides 178, 180, 182, 184 of the die package substrate 74 may have an adjacent die package footprint 140 as generally shown in FIG. 6A. Each die package footprint 140 can define a die substrate mating region on the die package substrate 74 where electrical connections to corresponding ones of die package contacts 210 may be made. Each die package footprint 140 may be undivided or may be divided into a plurality of spaced apart die package footprint sections 141. For example, there may be one, two, three, four, five, or six die package footprint sections 141 on a respective one, two, three or four of the first, second, third and fourth die package sides 178, 180, 182, 184 of the die package substrate 74. All of the first, second, third and fourth die package sides 178, 180, 182, 184 can have the same length or different lengths. Each die package footprint 140 may also have a single section, i.e., the row of package pads 162 may be continuous along the length of the die package footprint 140. Each respective one of the first, second, third and fourth die package sides 178, 180, 182, 184 may have equal number of die package footprint sections 141 as shown in FIG. 6A; however, in other embodiments a different number of die package footprint sections 141 may be present on different first, second, third and fourth die package sides 178, 180, 182, 184 of the die package substrate 74. Such an arrangement is shown in FIG. 6B in which two opposing sides of the die package substrate 74, such as first and third die package sides 178, 182 or second and fourth die package sides 180, 184 can each have three die package footprint sections 141 and the remaining two opposing sides of the die package substrate 74 have four die package footprint sections 141. This arrangement can eliminate dead space at the corners of the die package substrate 74 such as that shown in FIG. 6A. More generally it may be said that the die package footprint 140 on at least one of the first, second, third and fourth die package sides 178, 180, 182, 184 of the die package substrate 74 may be different than the die package footprint 140 on the opposed or opposite side of the die package substrate 74. Each of the die package contacts 210 may be arranged in a series of package rows 212 oriented parallel to an adjacent, respective first, second, third and/or fourth die package sides 178, 180, 182, 184 of the die package substrate 74. Along a respective package row 212, the die package contacts 210 may be arranged in a suitable pattern of differential signal pair and ground contacts, such as a repeating pattern selected from G-G-S-S, G-S-S, and G-S. FIG. 6A shows an exemplary G-S-S pattern, but other patterns may be used as previously described.

Each die package footprint section 141 may be configured to directly mate with a single flex circuit 20 or a plurality of stacked flex circuits 20, such as the first and second ones 20A, 20B of the flex circuits 20 depicted in FIGS. 5A and 5B. Alternatively, as discussed later, each die package footprint section 141 can be configured to receive or be received in or on a first electrical connector 42, second electrical connector 60, communication module 71, third electrical connector 80, package connector 138, anisotropic conductive film 164, or some other electrical connector or electrical component. The first electrical connector 42 can be configured to directly receive at least one flex circuit 20. The second electrical connector 60 can be configured to carry a flex circuit 20. The third electrical connector 80 can be configured to carry a flex circuit 20, and the third electrical connector 80 can be configured to be received in a mating connector, such as receptacle connector 82.

The flex circuit 20 may have a first circuit end 134 and a second circuit end 136. The first circuit end 134 can be configured to mate directly or indirectly with the die footprint section 141. The flex circuit 20 may flare such that a first flex width d1 of the flex circuit 20 on the first circuit end 134 is smaller than the second flex width d2 at the second circuit end 136. A quantity of d2/d1, which is indicative of a width difference between the ends, may be greater than approximately 1.2, 1.5, 2, 2.5, or 3. Flaring of the flex circuit 20 between the first circuit end 134 and the second circuit end 136 can enable a pitch between flex signal pads 30 and/or flex ground pads 35 on the second circuit end 136 to be greater than the pitch between flex signal pads 30 and/or flex ground pads 35 on the first circuit end 134. Having a larger pitch may facilitate making electrical connections to the second end 136 of the flex circuit 20 as described in more detail below.

The die package substrate 74 can carry at least 1024 differential signal pairs on only the first major surface 200, on only the second major surface 202, or on both the first and second major surfaces 200, 202 of the die package substrate 74. The die package footprints 140 can be arranged such that at least 1024 differential signal pairs are defined by only the first major surface 200, only the second major surface, or by both the first and second major surfaces 200, 202 of the die package substrate 74. At least two of the respective first, second, third and fourth die package sides 178, 180, 182, 184 can each be configured to receive a corresponding flex circuit 20 either through direct connects between corresponding flex signal pads 30 and/or flex ground pads 35 and corresponding package pads 162 or indirectly through a BGA-LGA connector, on a first electrical connector 42, second electrical connector 60, communication module 71, third electrical connector 80 in combination with the receptacle connector 76, package connector 138, anisotropic conductive film 164, a direct compression connector or other suitable electrical connectors or electrical components.

An IC die package 72 can include an IC die 70 and a die package substrate 74 that can define first, second, third and fourth die packages sides 178, 180, 182, 184. Each of the individual die package sides 178, 180, 182, 184 can be no longer than approximately 105 mm or approximately 110 mm or approximately 115 mm or approximately 120 mm, such as approximately 70 mm, approximately 75 mm, approximately 80 mm, approximately 85 mm, approximately 90 mm, etc. At least one hundred and twenty-eight or at least two hundred and fifty-six package pads 162 can be defined on each of the first, second, third, and fourth die package sides 178, 180, 182, 184. Each of the package pads 162 can be configured to be attached directly to a flex circuit 20 or indirectly, as discussed above. An electrical communication system 220 can include the IC die package 72 described herein and one or more flex circuits 20 physically attached, electrically attached or both to respective ones of the package pads 162.

A die package substrate 74 can include first, second, third and fourth die packages sides 178, 180, 182, 184. Each of the individual die package sides 178, 180, 182, 184 can be at least 50 mm in length, but no longer than approximately 75 mm, approximately 80 mm, approximately 85 mm, approximately 90 mm, approximately 95 mm, approximately 100 mm, approximately 105 mm, approximately 110 mm, or approximately 115 mm. At least one hundred and twenty-eight or at least two hundred and fifty-six package pads 162 can be defined on each of the respective first, second, third, and fourth die package sides 178, 180, 182, 184. Each of the package pads 164 can be configured to be attached to a flex circuit 20 directly or indirectly.

A die package substrate 74 can include a first major surface 200 and an opposed second major surface 202. At least 1024 differential signal pair pads can be carried by only the first major surface 200, only the second major surface 202, or a combination of the first and second major surfaces 200, 202. At least 1024 differential signal pair pads can be arranged with at least two-hundred and fifty-six differential signal pair pads on each of the respective first, second, third and fourth package sides 178, 180, 182, 184. The at least 1024 differential signal pair pads can be SMT pads or compression pads.

Figure 6C:
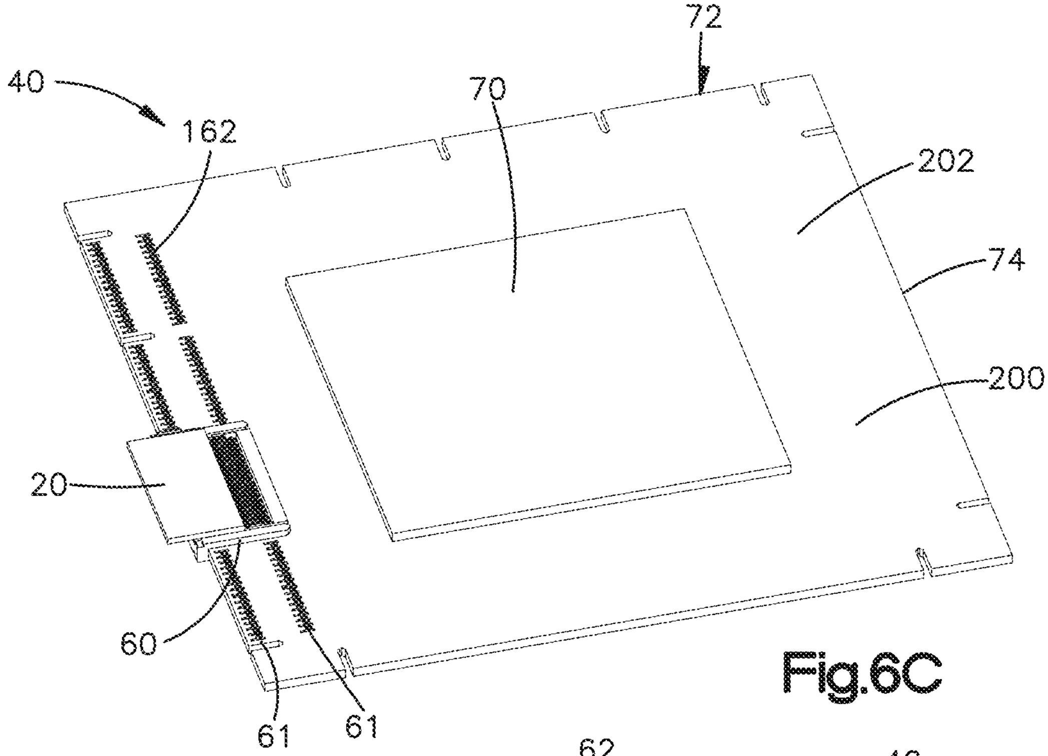
FIG. 6C is a perspective view of an electrical communication assembly in another example.
Figure 6D:
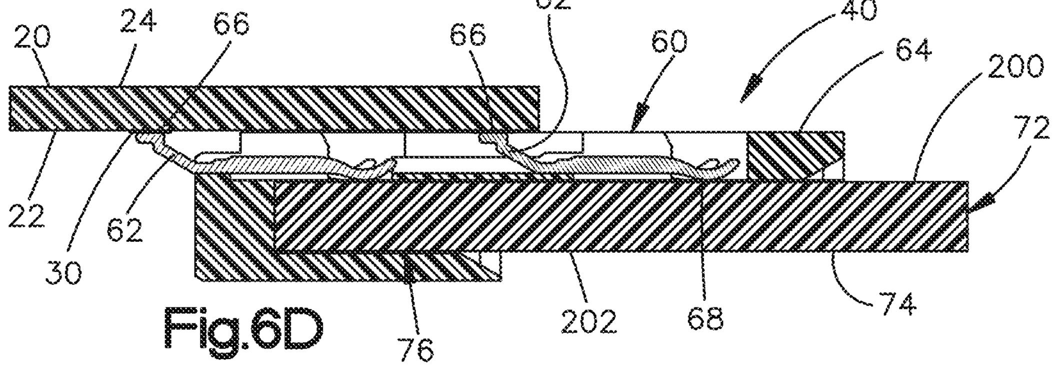
FIG. 6D is a sectional side elevation view of the electrical communication assembly of FIG. 6C.
Figure 6E:
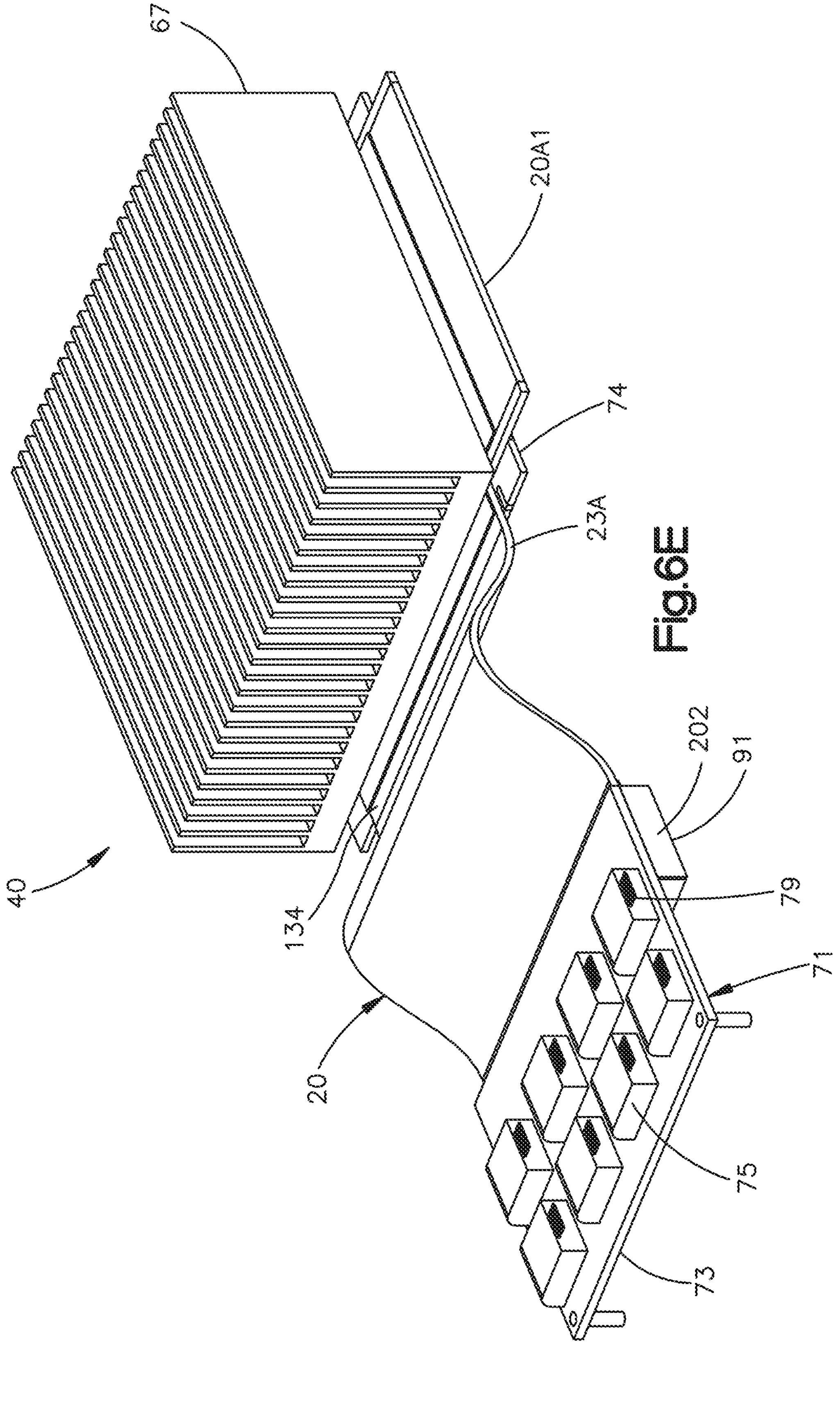
FIG. 6E is a perspective view of an electrical communication assembly similar to the assembly of FIG. 6C, but showing multiple flex circuits that extend from the die package substrate to respective communication modules.
Figure 6F:
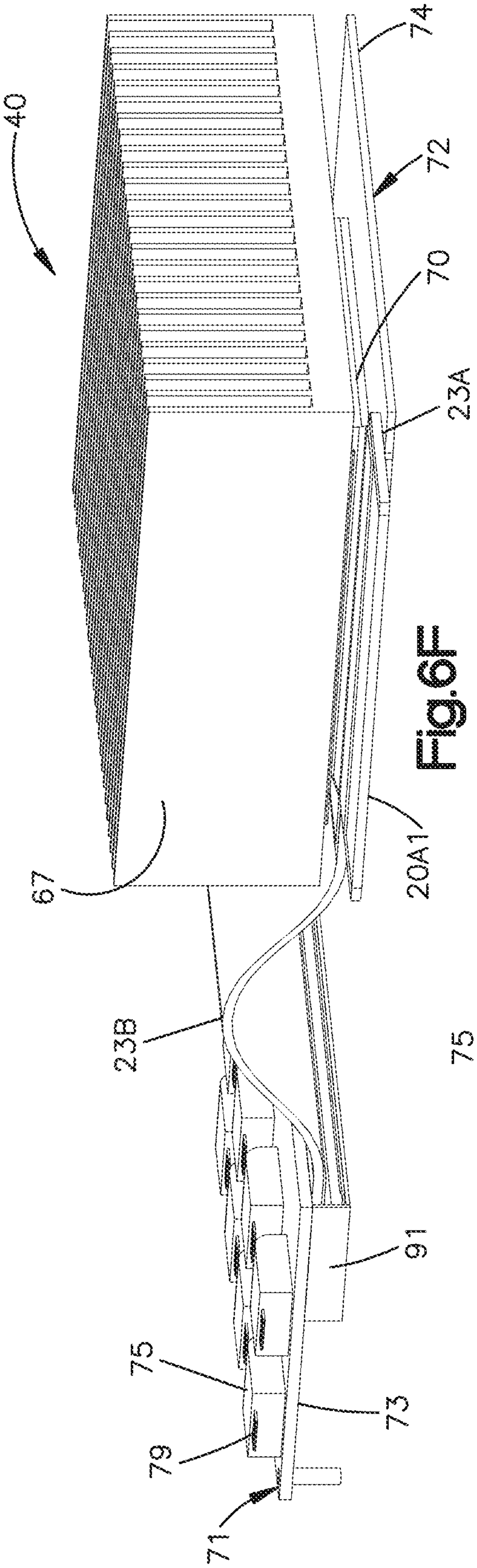
FIG. 6F is a perspective view of the electrical communication assembly of FIG. 6E, showing the termination of a first circuit end of a flex circuit to the die package substrate.
Figure 6G:
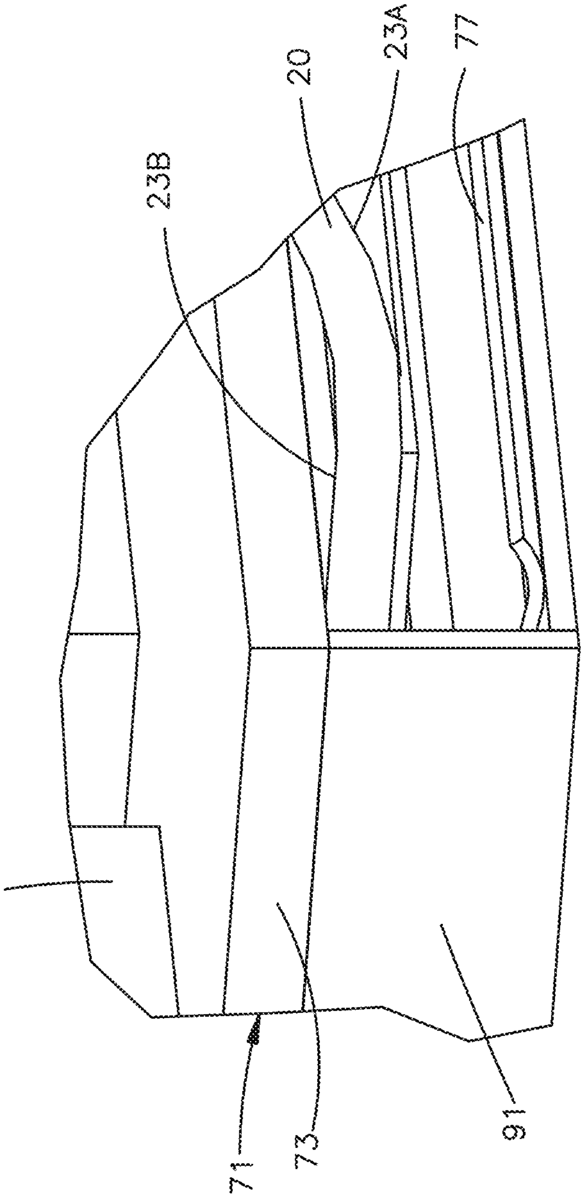
FIG. 6G is a perspective view of a portion of the electrical communication assembly of FIG. 6F, showing the termination of a second circuit end of the flex circuit to a communication module.

Referring now to FIGS. 6C-6G the electrical communication assembly 40 can include a second electrical connector 60 that is configured to be mounted the first circuit end 134 of the flex circuit 20. The second electrical connector 60 can have a plurality of second electrical contacts 62 including second electrical ground contacts and second electrical signal contacts that can be arranged in differential signal pairs, and a second dielectric connector housing 64 that can support the second electrical contacts 62. The second electrical contacts 62 of the second electrical connector 60 can be configured to be placed in electrical communication with the flex signal conductors 26 of the flex circuit 20 or in physical connection with a respective one of the flex signal pads 30. For instance, the second electrical contacts 62 can be soldered to the flex circuit 20 in some examples. In particular, the second electrical contacts 62 may have respective second mounting ends 66 that are configured to be mounted to the flex circuit 30, such as to respective flex signal pads 30, thereby placing the second electrical contacts 62 in electrical communication with the flex signal conductors 26 of the flex circuit 20. The second electrical contacts 62 can be mounted to the flex signal pads 30 of the flex circuit 20 that are aligned with each other in a single row in the lateral direction, A. Alternatively, the flex signal pads 30 can be alternatively located as desired. For instance, the second electrical contacts 62 can define two or more rows of second mounting ends 66 displaced in the longitudinal direction L that are configured to be mounted to respective flex signal pads 30 of the flex signal conductors 26 of the flex circuit 20. FIGS. 6B and 6C show an example of an electrical communication system 40 with two rows.

The second electrical connector 60, and in particular the second electrical contacts 62, can be configured to place the flex circuit 20 in electrical communication with the IC die 70 of the IC die package 72 that includes the die package substrate 74 and the IC die 70 mounted on the die package substrate 74. The die package substrate 74 can be configured as a PCB. The communication assembly 40 can further include a heat sink 67 (FIG. 6F) that can be in thermal communication with the IC die 70 and configured to dissipate heat from the IC die 70 during operation. The second electrical connector 60 can define a second receptacle 76 that can be sized to receive an edge of a respective first, second, third and/or fourth package side 178, 180, 182, 184 of the die package substrate 74 such that second mating ends 68 of the second electrical contacts 62 can mate with the die package substrate 74 so as to define a separable interface therebetween. For instance, the first row of second electrical contacts 62 can mate with the first major surface 200 of the die package substrate 74. A second row of second electrical contacts 62 can also mate with the first major surface 200 of the die package substrate 74. Alternatively, the second row of second electrical contacts 62 can mate with the second major surface 202 of the die package substrate 74 that is opposite the first major surface 200 along the transverse direction T. The flex circuit 20 can be oriented substantially parallel to the die package substrate 74.

In the example shown in FIGS. 6A-6F, the flex circuit 20 can be single-sided. In particular, the flex signal pads 30 can be disposed at the first flex circuit side 23A of the first circuit end 134 so as to mate with the die package substrate 74. The flex signal pads 30 can be disposed at the second flex circuit side 23B at the second circuit end 136 so as to mate with a module substrate 73. The second circuit end 134 of the flex circuit 20 can be mated to a first surface of the module substrate 73 that is opposite a second surface of the module substrate 73 to which fourth electrical connectors 75 are mounted. The first surface can be opposite the second surface. Alternatively, the flex circuit 20 and the fourth electrical connectors 75 can be mounted to the same surface of the module substrate 73.

The flex circuit 20 can be mated to the die package substrate 74 in any manner as desired. In one example, the communication assembly 40 can include a first compression clip (not shown) that is compressed between the die package substrate 74 and the heat sink 67. The first circuit end 134 of the flex circuit 20 can be positioned between the first compression clip and the die package substrate 74. A compression force of the first compression clip can be applied to the flex circuit 20, thereby urging the flex circuit 20 against the die package substrate 74 and establishing an electrical connection between the flex signal pads 30 at the first circuit end 134 of the flex circuit 20 and the die package substrate 74. The compression force of the first compression clip can further maintain contact of the flex signal pads 30 of the flex circuit 20 against the die package substrate 74. In one example, the flex signal pads 30 at the first flex circuit side 23A of the flex circuit 20 can be placed against the die package substrate 74 so as to mate the flex circuit 20 to the die package substrate 74. The flex signal pads 30 of the flex circuit 20 can be placed directly against corresponding package pads 162 of the die package substrate 74 or can be placed against respective first electrical contacts 44 that, in turn, are mated to respective package pads 162 of the die package substrate 74 or can be mated to the die package substrate 74 in accordance with any suitable alternative manner as described herein.

The flex circuit 20 can be similarly mated to the module substrate 73. In particular, the communication module 71 can include a housing mount 91 that is supported by or relative to the module substrate 73. A respective second compression clip 77 can be compressed between the housing mount 91 and the module substrate 73. The second circuit end 202 of the flex circuit 20 can be positioned between the second compression clip 77 and the module substrate 73, such that the compression force of the second compression clip 77 is applied to the flex circuit 20, thereby urging the flex circuit 20 against the module substrate 73, thereby establishing an electrical connection between the flex signal pads 30 at the second circuit end 136 of the flex circuit 20 and the module substrate 73. A force generated by the second compression clip 77 can further maintain compression of the flex signal pads 30 of the flex circuit 20 against the module substrate 73. In one example, the flex signal pads 30 at the second flex circuit side 23B of the flex circuit 20 can be placed against the module substrate 73 so as to mate the flex circuit 20 to the module substrate 73. The flex signal pads 30 of the flex circuit 20 can be placed directly against package pads 162 of the module substrate 73 or can be placed against respective first or second electrical contacts 42, 62 or receptacle contacts 94 that, in turn, can be mated to or mounted to corresponding package pads 162 of the die package substrate 74, or can be mated to the module substrate 73 in accordance with any suitable alternative manner as described herein.

As shown in FIG. 6C, the package pads 162 of the die package substrate 74 can be arranged in one or more rows 61, including two rows 61, three rows 61, four rows, 61 or more rows 61 as desired. The rows 61 can be oriented substantially parallel to each other. Thus, the flex signal pads 30 of the flex circuit 20 can similarly be arranged in more than one row to be placed in electrical communication with respective ones of the rows 61 of package pads 162 of the die package substrate 74. The rows of flex signal pads 30 (see FIG. 2A) can be oriented parallel to each other and displaced along the longitudinal direction L associated with the mating flex circuit 20. Ground contact pads 35 can be disposed between and aligned with adjacent flex signal pads 30 or respective pairs of flex signal pads 30 along each row as desired.

Referring now to FIGS. 7A-7E, the electrical communication assembly 40 can include a third electrical connector 80, which can be referred to as a first plug connector, and an edge-card type of receptacle connector 82 that is configured to mate with the third electrical connector 80. The third electrical connector 80, in turn, can be configured to be placed in physical communication, electrical communication or both with a respective electrical component such as the flex circuit 20, thereby placing the flex circuit 20 in electrical communication with the receptacle connector 82. The receptacle connector 82 can be mounted directly or indirectly to an electrical component such as a second substrate 81 or PCB, thereby placing the second substrate 81 in electrical communication with the flex circuit 20 through the receptacle connector 82 and the electrical connector 80.

For instance, the third electrical connector 80 can include a dielectric third connector housing 89 and plurality of third electrical contacts 84 supported by the third connector housing 89. The third electrical contacts 84 can be profiled in the manner described above. Alternatively, the third electrical contacts 84 can be stamped and formed and can be positioned edge-to-edge such as edge side facing contacts. The third electrical contacts 84 can include third signal contacts 86 and third ground contacts 88 in the manner described above.

Third electrical connector 80 can be configured to mate with receptacle connector 82 along the longitudinal direction L. The third electrical connector 80 can be sized to receive the flex circuit 20, thereby placing the third electrical connector 80 in electrical communication with the flex circuit 20. In particular, the third electrical contacts 84 can be arranged in first and second rows 92A and 92B that each extend along opposite sides of the third connector housing 89 that are opposite each other along the transverse direction T. Each of the first and second rows 92A and 92B can be oriented along the lateral direction A. The third electrical contacts 84 can each have third mounting ends 85 that are each disposed at opposite sides of the receptacle connector 82 with respect to the transverse direction T. The first row 92A of third electrical contacts 84 can be placed in electrical communication with respective flex signal pads 30 and respective flex ground pads 35 of the flex circuit 20 as described above, and the second row 92B of third electrical contacts 84 can each be placed in electrical communication with respective flex signal pads 30 and respective flex ground pads 35 as described above. The flex signal pads 30 and the flex ground pads 35 can each be positioned on the first flex circuit side 23A of the flex circuit 20 and on the second flex circuit side 23B of the flex circuit 20.

In one example, the third electrical connector 80 can mounted to the flex circuit 20 such that the interface between the third mounting ends 85 of the third electrical contacts 84 are permanently affixed to respective flex signal pads 30 of the flex circuit 20. Accordingly, the interface between third electrical connector 80 and the flex circuit 20 is not separable. In other examples, the third electrical connector 80 can be mated to the flex circuit 20 so as to define a separable interface between the third electrical connector 80 and the flex circuit 20. As described above, a first contact row of first plurality of flex signal conductors 26 and their corresponding flex signal pads 30 and flex ground pads 35 of the flex circuit 20 can be offset with respect to an immediately adjacent second contact row of a second plurality of flex signal conductors 26 and their corresponding flex signal pads 30 and flex ground pads 35 of the flex circuit 20 along the transverse direction T. Accordingly, all differential signal pairs in the first row 92A of third electrical contacts 84 can be offset with respect to all of the differential signal pairs of the second row 92B of third electrical contacts 84, along the transverse direction T. Stated another way, at least one signal conductor in a differential signal pair in the first contact row can face a ground conductors in the second contact row, and vice versa.

The third electrical contacts 84 can each extend along opposite sides of the third connector housing 89 that are opposite each other along the transverse direction T to define third mating ends 87 that are each respectively positioned opposite the third mounting ends 85 and are each configured to mate with the receptacle connector 82. In one example, the third mating ends 87 and third mounting ends 85 of immediately adjacent ones of the third electrical contacts 84 can jog away from each other in the lateral direction A. The third electrical contacts 84 of each of the first and second rows 92A and 92B can be spaced from each other along the lateral direction A by a center-to-center contact pitch. The contact pitch can be approximately 0.5 mm or any suitable alternative contact pitch as desired.

With continuing reference to FIGS. 7A-7E, the receptacle connector 82 can have or define a receptacle housing 90, such as a card edge housing, that defines a receptacle 92, and electrical receptacle contacts 94, such as edge card receptacle contacts, arranged in first and second receptacle rows 96A and 96B disposed at opposite sides of a slot in the receptacle 92. The first and second receptacle rows 96A and 96B of receptacle contacts 94, such as edge-card receptacle contacts, can be opposite each other along a transverse direction T. In one example, the receptacle housing 90 can have a maximum width along the transverse direction T that is in a range from approximately 1 mm to approximately 4 mm. For instance, the width can be approximately 2 mm. Adjacent ones of the receptacle contacts 94 can be spaced from each other along a center-to-center contact pitch from approximately 0.3 mm to approximately 2 mm, such as approximately 1.2 mm.

The receptacle contacts 94 can each define respective receptacle mating ends 98 and receptacle mounting ends 100 positioned opposite to the receptacle mating ends 98 along the longitudinal direction L. The receptacle mating ends 98 can be configured to mate with the third mating ends 87 of the third electrical contacts 84 of the third electrical connector 80, so as to define a separable interface therebetween. In particular, the receptacle housing 90 can receive a plug end of the third connector housing 89 in the receptacle 92, so as to mate the receptacle connector 82 with the third electrical connector 80. In one example, an entire width of the third connector housing 89, along the transverse direction T, can be sized to be inserted into the receptacle housing 90 so as to mate the third electrical connector 80 with the receptacle connector 82. In one example, respective receptacle mating ends 98 of the receptacle contacts 94 can be configured to wipe along the third mating ends 87 a wipe distance that can be less than approximately 2 mm as they are mated to each other. In one example, the wipe distance can be approximately 0.5 mm. In one example, mating surfaces of the third mating ends 87 and receptacle mating ends 98 can be unpolished along their respective wiping surfaces. The unpolished wiping surface can include small irregularities that help break through any oxide or organic film that may be present on the wiping surfaces reducing the contact resistance. In one example, the third connector housing 89 can define a third housing portion 83 that is coplanar with at least one of the third electrical contacts 84 in a plane that includes the longitudinal direction L and the lateral direction A, and the third housing portion 83 can be configured to abut the receptacle housing 90 in the receptacle 92 when the third electrical connector 80 is fully mated with the receptacle connector 82. The receptacle mounting ends 100 can each be configured to mount to an electrical component such as the substrate 81 or PCB. As a result, the second substrate 81 can be placed in electrical communication with the flex circuit 20. The second substrate 81 can be oriented substantially orthogonal to the flex circuit 20. Immediately adjacent signal contacts of differential signal pairs of the receptacle contacts 94 of the receptacle connector 82 can jog away from each other at each of the receptacle mating ends 98 and the receptacle mounting ends 100. Jogging respective ones of the receptacle contacts 94 can increase the mechanical tolerances allowable in the mating process while helping to maintain a more uniform impedance through the electrical communication assembly 40.

The receptacle contacts 94 can each be loaded into the receptacle housing 90 in any manner as desired. For instance, the receptacle housing 90 can define a plurality of receptacle housing slots 102 that are each open to at least one outer surface of the receptacle housing 90. The at least one outer surface can be defined by opposed outer surfaces that are opposite each other along the transverse direction T. The receptacle contacts 94 can each be loaded into the receptacle housing slots 102 in an attachment direction that is in a plane that is perpendicular to the longitudinal direction L. In one example, the attachment direction can be oriented along the transverse direction T. If desired, the receptacle contacts 94 can be insert molded in a retention housing that prevents the receptacle contacts 94 from being removed from the receptacle housing slots 102 in a removal direction substantially opposite the attachment direction. In another example, the receptacle contacts 94 can be insert molded in the receptacle housing 90.

In one example, the third electrical contacts 84 or receptacle contacts 94 of one of the third electrical connector 80 and the receptacle connector 82 can be made differently than the third electrical contacts 84 or receptacle contacts 94 of the other of the third electrical connector 80 and the receptacle connector 82. For instance, the third electrical contacts 84 or receptacle contacts 94 of the one can be profiled, while the third electrical contacts 84 or receptacle contacts 94 of the other can each be stamped and formed. In one example, the receptacle contacts 94 of the receptacle connector 82 can each be profiled, and the third electrical contacts 84 of the third electrical connector 80 can each be stamped and formed. In one example, none of the third electrical contacts 84 or the receptacle contacts 94 of the third electrical connector 80 or the receptacle connector 82, respectively, circumscribe a respective mating contact of the other of the third electrical connector 80 and the receptacle connector 82, respectively. In other words, the connection cannot be made through a pin and socket style electrical connection.

Figure 7A:
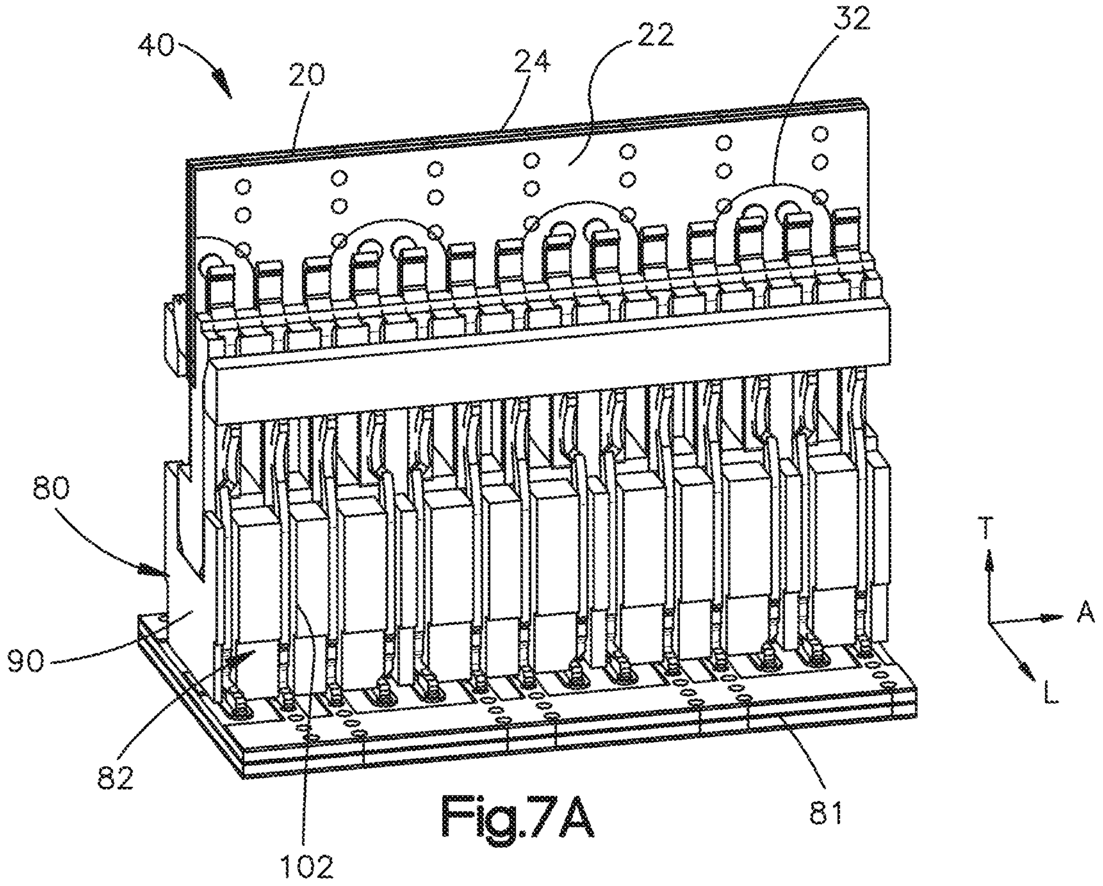
FIG. 7A is a perspective view of an electrical communication assembly of another example, including a substrate, a flex circuit, an electrical edge-card receptacle connector, and an electrical connector, wherein the electrical connector is configured to be mounted to the flex circuit, the receptacle connector is configured to be mounted to the substrate, and the receptacle connector is configured to receive the electrical connector so as to mate the receptacle connector to the electrical connector.
Figure 7B:
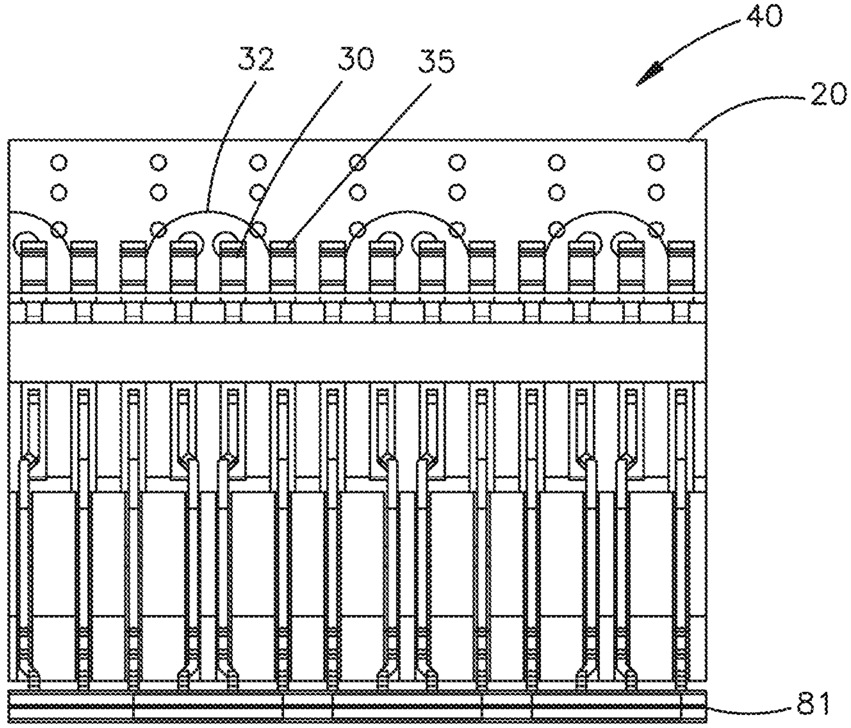
FIG. 7B is a side view of the electrical communication assembly of claim 7A.
Figure 7D:
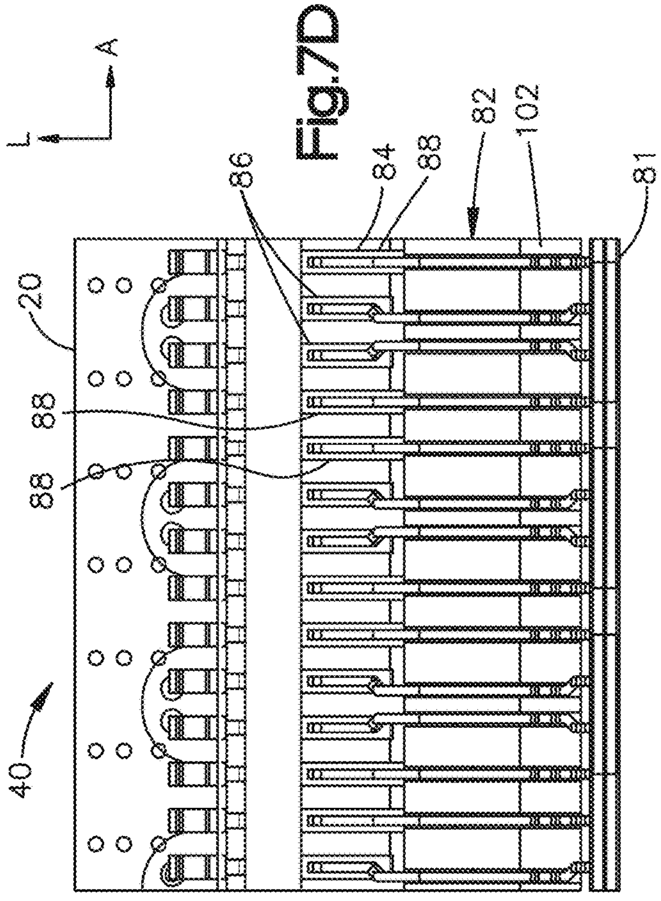
FIG. 7D is another side view of the electrical communication assembly of FIG. 7A.
Figure 7E:
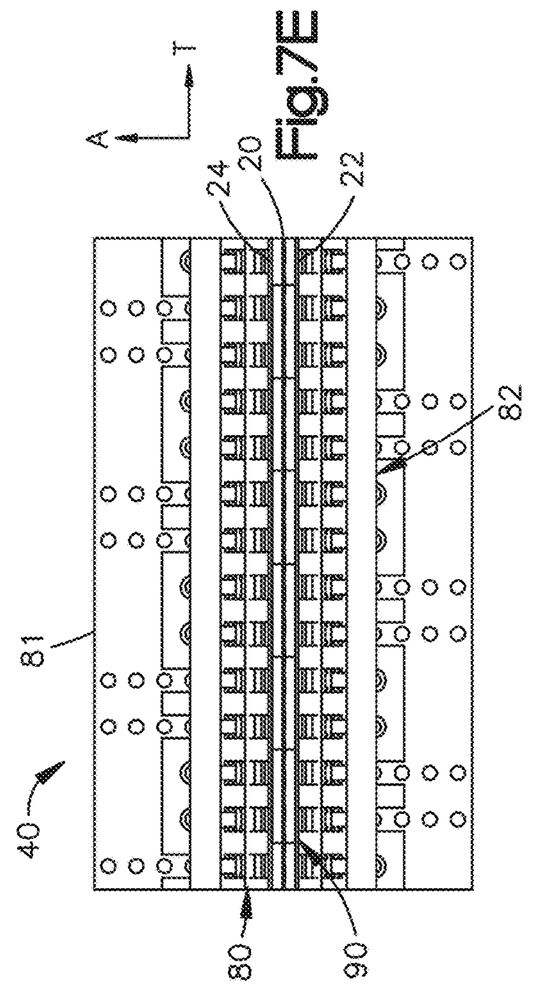
FIG. 7E is a top view of the electrical communication assembly of FIG. 7A.
Figure 7C:
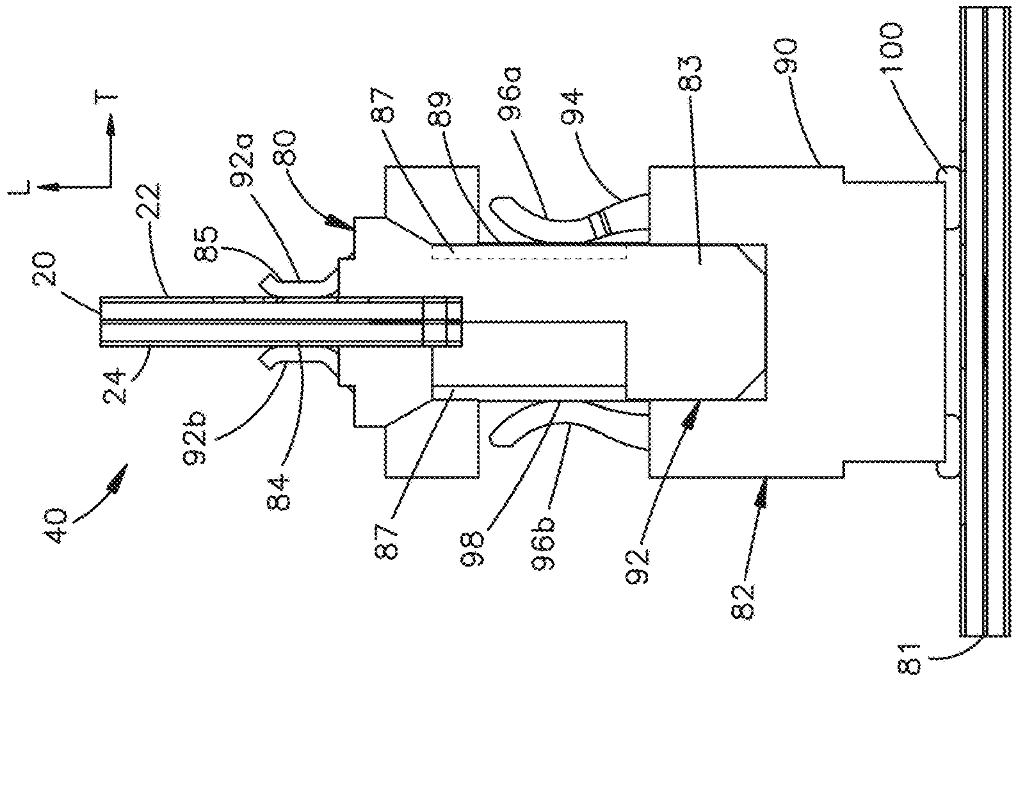
FIG. 7C is an end elevation view of the electrical communication assembly of FIG. 7B.

As shown in FIG. 7C, when the receptacle connector 82 is mated with the third electrical connector 80, a cross-section of the electrical communication assembly 40 can include, in sequence from left to right, a first receptacle contact 94 of the receptacle connector 82, a first third electrical contact 84 of the third electrical connector 80, a portion of the third connector housing 89 that can be configured as a plug, a second third electrical contact 84 of the third electrical connector 80, and a second electrical contact 94 of the receptacle connector 82.

Referring now also to FIGS. 8A-8E, the receptacle connector 82 is configured to mate with the third electrical connector 80 described above, which can also be referred to as a first plug connector or first electrical edge-card plug connector. The receptacle connector 82 can also be configured to mate with a second plug connector 110, such an electrical edge-card plug connector. Thus, the receptacle connector 82 can be configured to selectively individually mate with the third electrical connector 80 that can be in electrical communication with the flex circuit 20, the second plug connector 110 that can be mounted to, and thus in electrical communication with, second substrate 81 such as a PCB, or both. In other words, the receptacle connector 82 can mate with either the first plug connector or third electrical connector 80 or the second plug connector 110.

The description of the third electrical connector 80 can apply to the second plug connector 110, with the exception that the second plug connector 110 can include at least one ground commoning bar 128*a*, 128*b* and can be configured to be mounted to a second substrate 114 as opposed to the flex circuit 20, as will now be described. The second plug connector 110 can be configured to be received in the receptacle 92 of the receptacle connector 82. The second plug connector 110 can include a second plug connector housing 116 that can be configured to be inserted into the receptacle housing 90 along a longitudinal direction L so as to mate the receptacle connector 82 to the second plug connector 110. In some examples, an entire width of the second plug connector housing 116 along the transverse direction T can be sized to be inserted into the receptacle housing 90. The second plug connector 110 can include one or more electrical plug contacts 118 arranged in first and second plug rows 120A and 120B that can each extend along opposite sides of the second plug connector housing 116 that are opposite each other along the transverse direction T. Each of the first and second plug rows 120A and 120B of electrical plug contacts 118 can include electrical signal contacts and/or electrical ground contacts in the manner described above. Thus, each of the first and second plug rows 120A, 120B can include pairs of differential signal contacts separated by at least one of the ground contacts, which can be defined by a single ground contact or a pair of the ground contacts. The plug contacts 118 of each of the first and second plug rows 120A and 120B can be spaced from each other along a center-to-center contact pitch distance in a range from approximately 0.3 mm to approximately 1.5 mm, such as approximately 1.2 mm along the lateral direction A.

In one example, the receptacle mating ends 98 of the receptacle contacts 94 can be configured to wipe along respective plug mating ends 122 of the plug contacts 118 a wipe distance that can be less than approximately 2 mm as they are mated to each other. In one example, the wipe distance can be approximately 0.5 mm. In one example, mating surfaces of the receptacle mating ends 98 and the respective plug mating ends 122 can be unpolished along their respective wiping surfaces. In one example, the second plug connector housing 116 can define a second plug housing portion 117 that can be coplanar with at least one of the plug contacts 118 in a plane that includes the longitudinal direction L and the lateral direction A, and the second plug housing portion 117 can be configured to abut the receptacle housing 90 within the receptacle 92 when the receptacle connector 82 is fully mated with the second plug connector 110.

The plug contacts 118 can each define respective plug mounting ends 124, such that the plug mounting ends 124 of each of the first and second plug rows 120A and 120B can be mounted to a respective electrical component such as the second substrate 114 that can be configured as a PCB. When the second plug connector 110 is mounted to the second substrate 114 and the receptacle connector 82 is mounted to the substrate 81, the substrate 81 and the second substrate 114 can be spaced from each other so as to define a stack height in a range from approximately 2 mm to approximately 4 mm. along the longitudinal direction L. In one example, the stack height can be approximately 3 mm.

In one example, the receptacle contacts 94 or the plug contacts 118 of one of the receptacle connector 82 and the second plug connector 110 are made differently than the third electrical contacts 84 or the plug contacts 118 of the other of the receptacle connector 82 and the second plug connector 110. For instance, respective receptacle contacts 94 or plug contacts 118 of either the receptacle connector 82 or the second plug connector 110 can be profiled, while the of the other one of the receptacle connector 82 or the second plug connector 110 can have stamped and formed receptacle contacts 94 or plug contacts 118. In one example, the receptacle contacts 94 of the receptacle connector 82 can be profiled, and the plug contacts 118 of the plug connector 110 can be stamped and formed. In one example, none of the receptacle contacts 94 or the plug contacts 118 circumscribes a respective mating contact of the other. Stated another way, the receptacle contacts 94 and the plug contacts 110 can define respective shapes other than pin in socket.

Figure 8C:
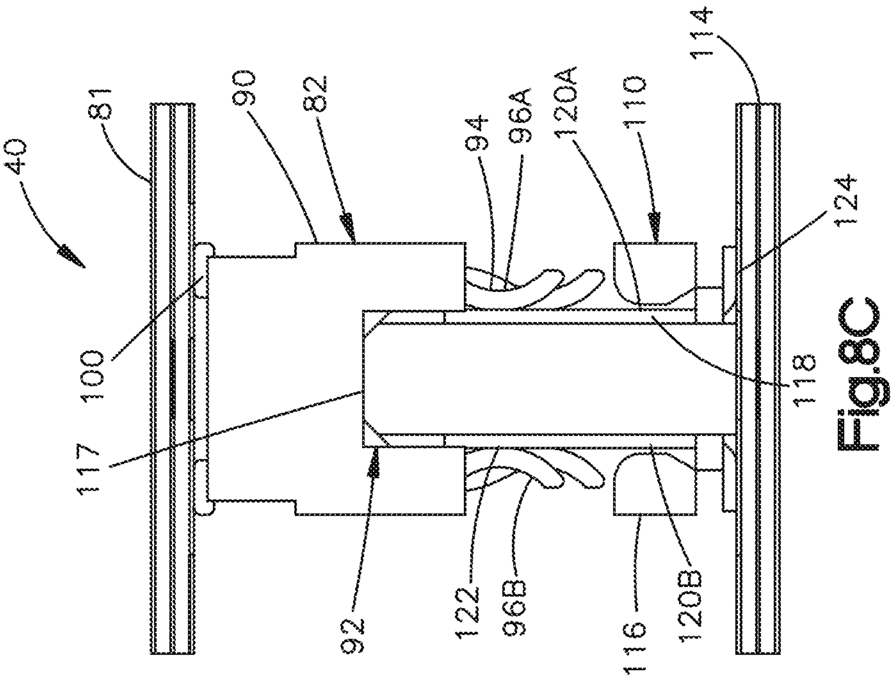
FIG. 8C is a sectional side view of the electrical communication assembly of FIG. 8A.
Figure 8A:
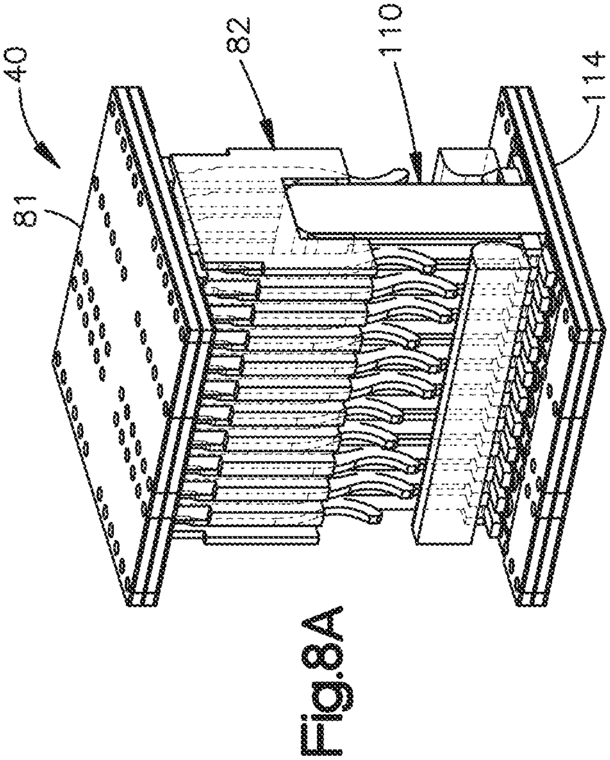
FIG. 8A is a perspective view of an electrical communication assembly in another example with portions removed for the purpose of clarity, the electrical communication assembly includes first and second substrates, the edge-card receptacle connector of FIG. 7A configured to be mounted to the first substrate, and a plug connector configured to be mounted to the second substrate and mated to the receptacle connector.
Figure 8B:
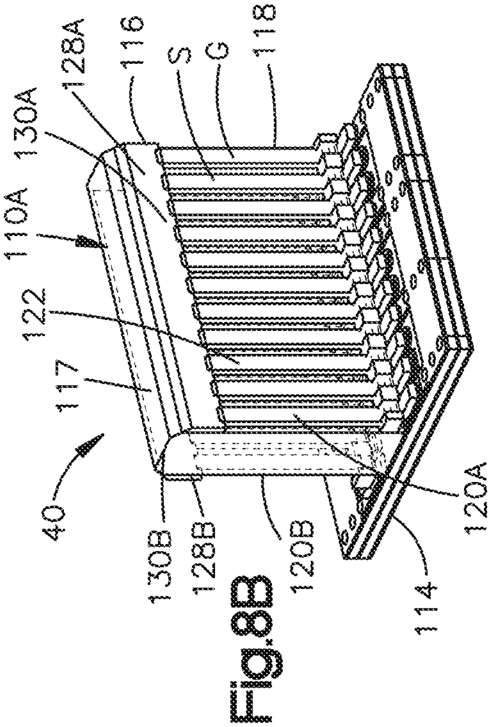
FIG. 8B is a perspective view of the plug connector of FIG. 8A.
Figure 8E:
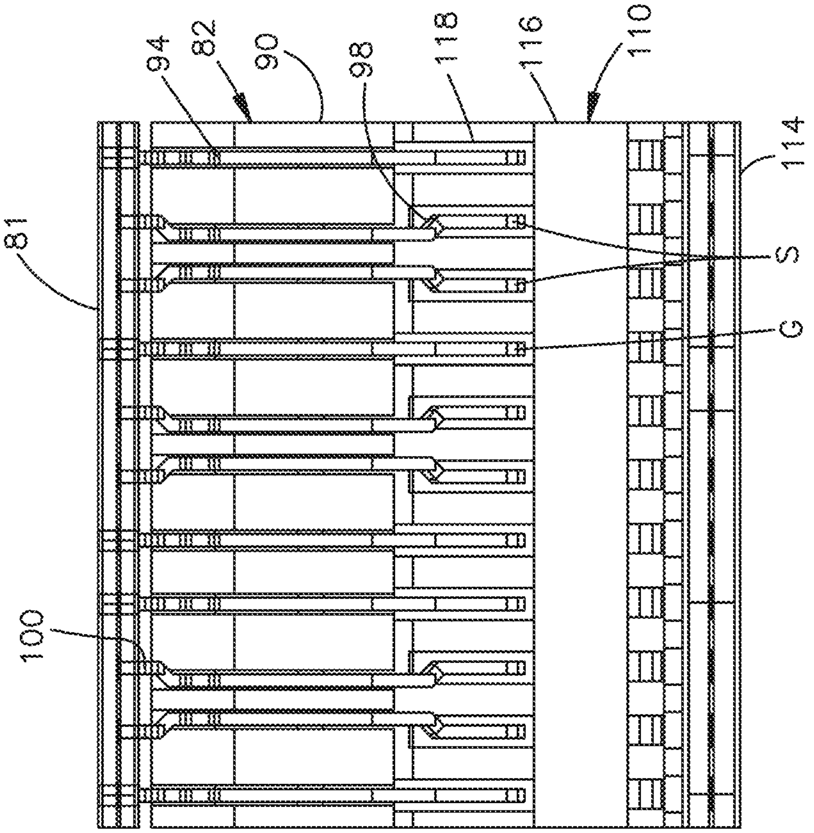
FIG. 8E is a side view of the electrical communication assembly of FIG. 8A.
Figure 8D:
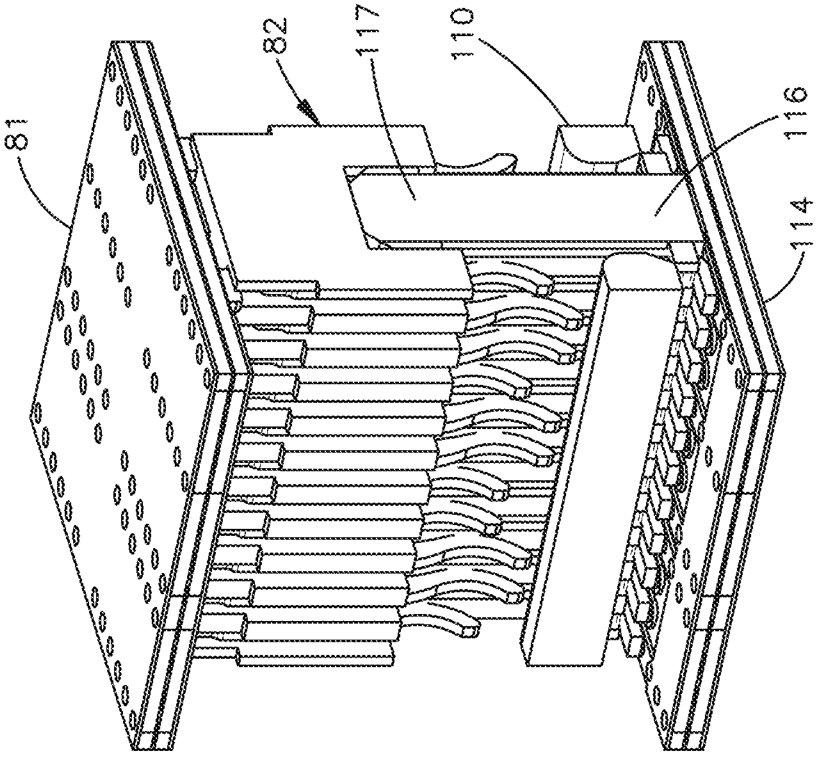
FIG. 8D is another perspective view of the electrical communication assembly of FIG. 8A.

As shown in FIG. 8C, when the receptacle connector 82 is mated with the second plug connector 110, a cross-section of the electrical communication assembly 40 includes, in sequence from left to right, a first receptacle contact 94 of the receptacle connector 82, a first plug contact 118 of the second plug connector 110, a plug housing portion 117 of the second plug connector housing 116, a second plug contact 118 of the second plug connector 110, and a second receptacle contact 94 of the receptacle connector 82.

The second plug connector 110 can further include first and second electrically conductive ground commoning bars 128*a* and 128*b* that place at least some, up to all, of the ground contacts of the plug contacts 118 of the first and second plug rows 120A and 120B, respectively, in electrical communication with each other. In particular, the each of the first and second ground commoning bars 128*a* and 128*b* can each extend from at least some, up to all, of the ground contacts of the respective one of the first and second plug rows 120A and 120B of plug contacts 118 to a location spaced from the mating ends of signal or differential signal plug contacts 118 of the first and second rows 120A and 120B, respectively, in the longitudinal or mating direction. In one example, the first and second ground commoning bars 128*a* and 128*b* can each define respective, opposed first and second major bar surfaces 130*a* and 130*b* that can each flare inward or converge towards each other as they extend in the mating direction. For instance, the first and second ground commoning bars 128*a* and 128*b* can each define opposed, respective first and second major bar surfaces 130*a*, 130*b*, respectively, that can both flare toward each other as they extend in the mating direction. The first and second major bar surfaces 130*a*, 130*b* can each flare linearly toward each other in one example.

It should be appreciated that any of the electrical contacts or conductors of the electrical communication assembly 40 can be made from any suitable electrically conductive material, such as a metal. Any of the electrical connectors described herein can include magnetic absorbing material and/or electrically conductive lossy material as desired.

Inclusion of absorptive or lossy material may help reduce cavity resonances in the electrical communication assembly 40. Inclusion of electrically conductive lossy materials may help reduce resonances that may be present in the assembly. Any electrically insulative elements of the electrical communication assembly 40 can be made from any suitable dielectric material such as a plastic, glass, ceramic or any suitable electrically nonconductive lossy material. In another example, it should be appreciated that any suitable component or components of the electrical communication assembly 40 can be constructed as described in PCT publication NO. WO2020014597, hereby incorporated by reference in its entirety.

It should be understood that the foregoing description is only illustrative of the present invention. Various alternatives and modifications can be devised by those skilled in the art without departing from the present invention. For instance, while the electrical connectors described herein are shown as mated with or mounted to the flex circuit 20 described above with reference to one of FIGS. 1A-1F and 2A-2F, it is appreciated that the electrical connectors can alternatively be mated with or mounted to the flex circuit 20 described above with respect to the other of figures in the present disclosure. In particular, the flex circuit need not be a three-layer flex circuit, but can have two, five, or any number of conductive layers. The present invention is intended to embrace all such alternatives, modifications, and variances that fall within the scope of the appended claims.

Figure 9:
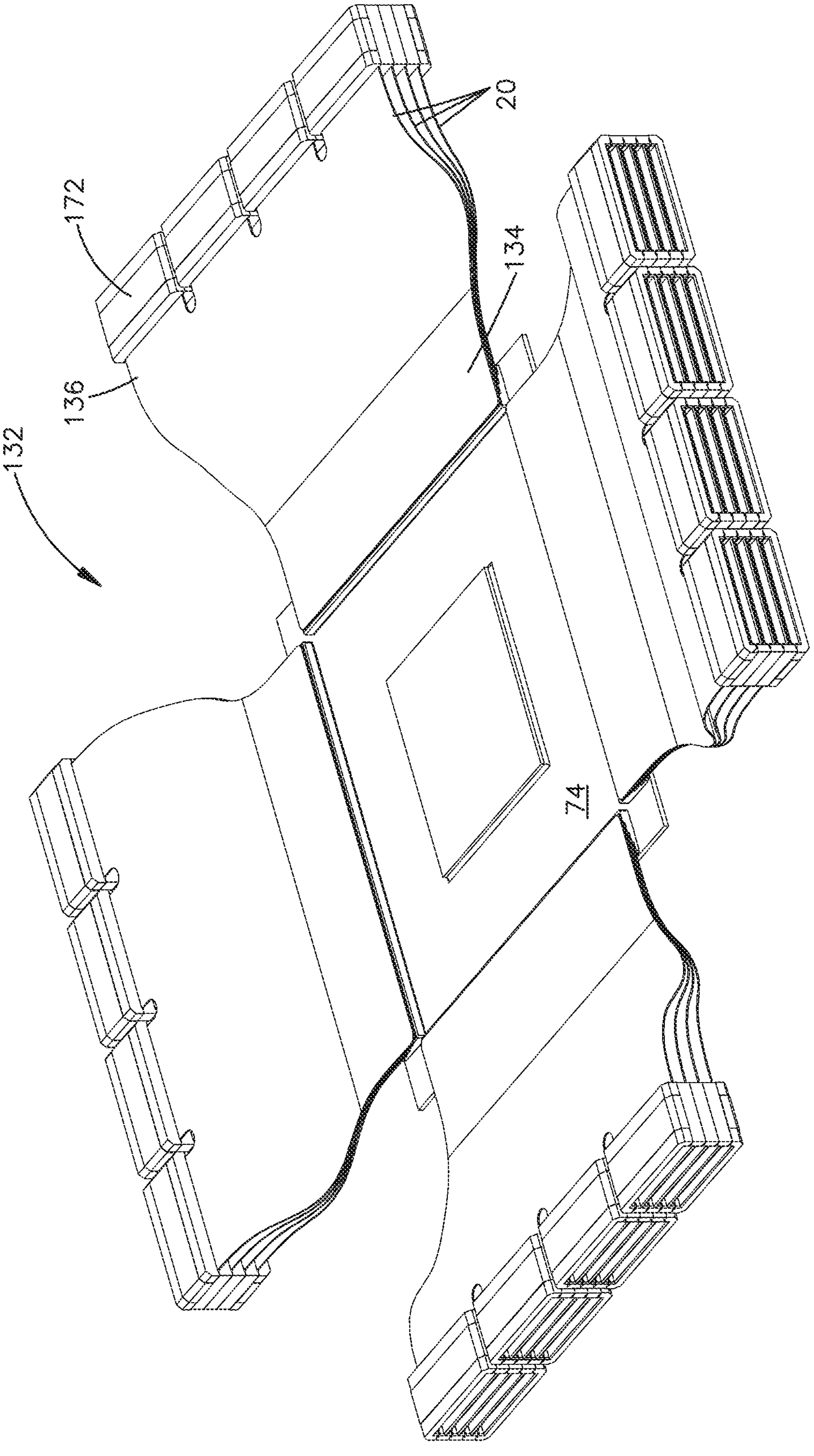
FIG. 9 is a top perspective view of a high-density interconnect attached to a die package substrate in another example.

Referring now to FIG. 9, a high-density interconnect 132 is shown.

In one or more embodiments, the flex circuits 20 may fan or flare out, get wider or diverge from the first circuit end 134 to the second circuit end 136. Therefore, an interconnect density can fan or flare out from the die package substrate 74 to the second circuit end 136. For example, the interconnector density can fan out from an approximate 300-micron (approximately 0.3 mm) pitch to an approximate 600-micron (approximately 0.6 mm) pitch. An advantage is that die package substrates 74 can be 50 mm to 110 mm or 115 mm or 120 mm square, with 70 mm to 90 mm square being currently the most popular sides. Cable 79, such as twin axial cable, has a tight cable conductor pitch but the extruded insulation around the first and second cable conductors, shielding, an outer jacket and perhaps a drain wire make each twin axial cable to fat or wide to mate directly or indirectly to 1024 differential package pads 162 on a first major surface 200, as second major surface 202 or both of a die package substrate 74.

Flex circuits 20 that attach directly to a die package substrate 74 or through connectors that attach directly to the die packages substrate 142 can help solve the density problem that coaxial and twin axial cables cannot provide. The flex circuits 20 can be denser at the first circuit end 134 or the second circuit end 136, for connection to highly dense package pads 162. On the other respective end of the flex circuit 20, the flex signal conductors 26 can spread farther apart in distance, resulting in less dense signal flex contact pads to accommodate the fatter or wider extruded coaxial cables, extruded waveguides or extruded and wrapped twin axial cables. In this particular example, a length of the flex circuit 20 can be kept short enough to make physical connections directly to the IC die 70 or indirectly through one or more connectors. Flex circuits 20 can have more unwanted loss characteristics than corresponding coax, twinax or RF cables of equal length. So respective lengths, pitches, AWGs, etc. of both the flex circuit 20 and the associated non-flex circuit cables 79 can be shortened, lengthen, modified or changed until the desired density and signal integrity are both maintained at the first circuit end 134 of the flex circuit 20, the second circuit end 136 of the flex circuit 20, a first end of any non-flex circuit cables 79 attached to the flex circuit 20, and a second end of any non-flex circuit cables 79 attached to a panel connector 203, backplane connector, mezzanine connector, or other electrical component. This disclosure is not limited to a cable assembly that includes a mixture of a flex circuit 20 and non-flex circuit cables 79.

Figure 10A:
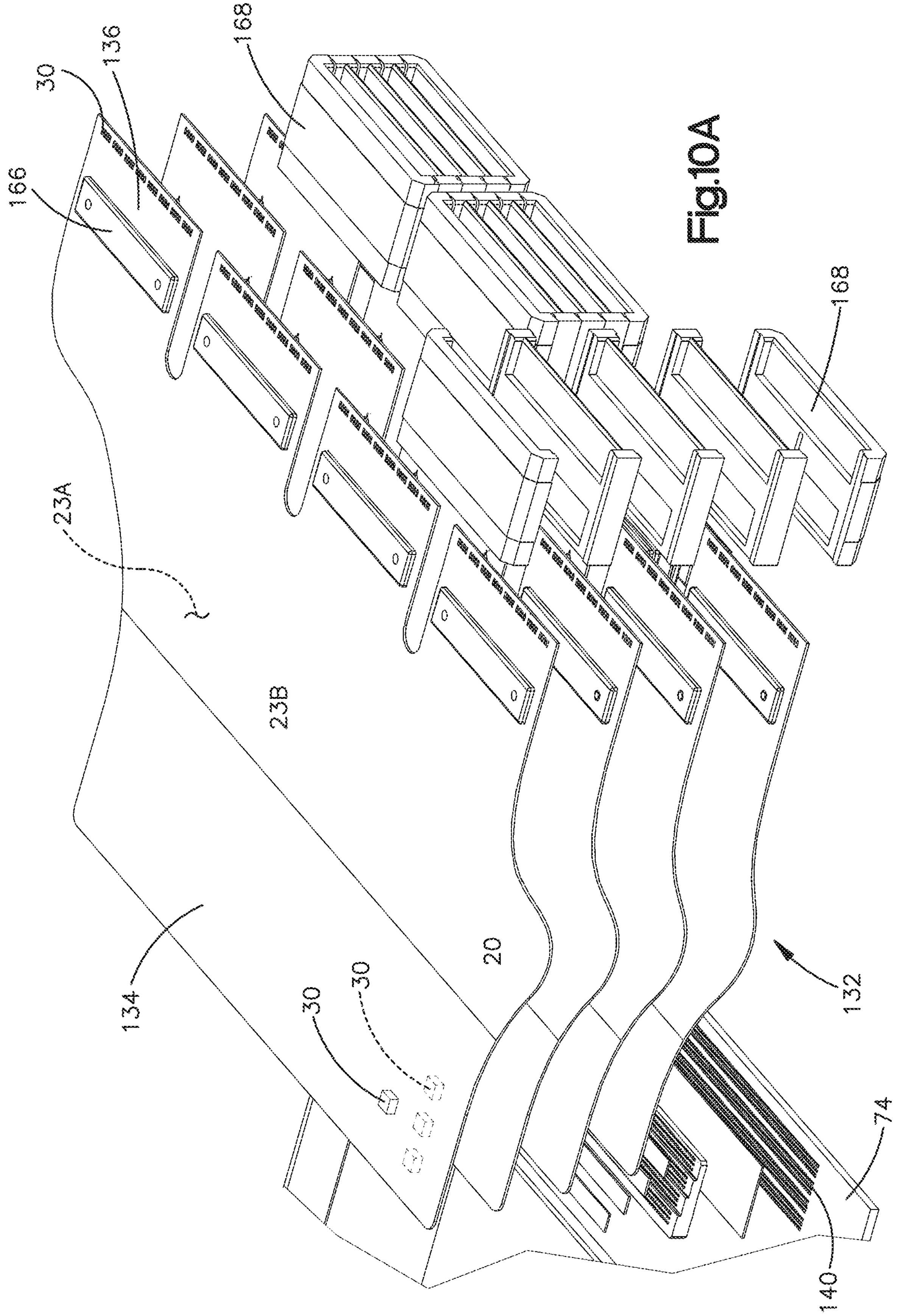
FIG. 10A is top perspective, exploded view of a high-density interconnect shown in FIG. 9 attached to one side of the die package substrate.

As generally shown in FIG. 10A, the high-density interconnect 132 can generally include one or more flex circuits 20, such as the flex circuit 20 described above. Each of the one or more flex circuits 20 can include at least two layers, at least three layers, at least four layers, at least five layers, only two layers, only three layers, only four layers, only five layers, only six layers, only seven layers, only eight layers, only nine layers, only ten layers, only eleven layers, only twelve layers, three or more layers, four or more layers, five or more layers, or six or more layers. A minimum number of layers for the chosen application are preferred. In a three-layer flex circuit 20 that defines a strip line transmission structure, first and second layer can each be ground layers, ground planes or first and second electrically conductive layers 22, 24. A third layer, positioned between the first and second layers can be a signal layer that includes only signal traces or only flex signal conductors 26 or a combination of signal and ground traces and perhaps a second inner dielectric layer 27. In flex circuits 20 with more than three layers, other respective conductive layers can be a ground layer or a signal layer as desired.

Three or more flex signal pads 30 and/or flex ground pads 35 can be positioned on any of: only on a first flex circuit side 23A of the first circuit end 134 of a respective flex circuit 20; only on a second flex circuit side 23B of the first circuit end 134 of the respective flex circuit 20; only on a first flex circuit side 23A of the second circuit end 134 of a respective flex circuit 20; only on a second flex circuit side 23B of the second circuit end 134 of the respective flex surface; only on the first and second flex surface sides 23A, 23B of the first circuit end 134 of the respective flex circuit 20; only on the first and second flex surface sides 23A, 23B of the second circuit end 136 of the respective flex circuit 20; only on a first flex circuit side 23A of both the first circuit end 134 and the second circuit end 136 of a respective flex circuit 20; only on a second flex circuit side 23B of both the first circuit end 134 and the second circuit end 136 of a respective flex circuit 20; only on the first flex circuit side 23A and second flex circuit side 23B of the first circuit end 134 and a of a respective flex circuit 20 and on one or both of the first and second flex surface sides 23A, 23 of the second circuit end; and only on the first flex circuit side 23A and second flex circuit side 23B of the second circuit end 136 and a of a respective flex circuit 20 and on one or both of the first and second flex surface sides 23A, 23B of the first circuit end 134 of the respective flex circuit 20.

Two of the three or more flex signal pads 30 can be differential signal pads. Each respective differential signal pads can be surrounded by an anti-pad 32 defined in the respective first and second electrically conductive layers 22, 24 of flex circuit 20 to isolate the differential signal pads from the respective first and second electrically conductive layers 22, 24, and can be electrically connected, physically connected or electrically and physically connected to a respective signal trace or flex signal conductor 26 in the second inner dielectric layer 28 of the flex circuit 20. For example, a flex signal pad 30 can be electrically connected to a corresponding signal trace by an electrically conductive filled via. The flex signal pad 30 pitch at the first circuit end 134 can be approximately 0.3 mm. In a differential pair configuration, a differential pair pitch can be approximately 0.9 mm. These flex signal pad 30 and differential pair pitches can yield at least sixty-four to at least two-hundred and fifty-six differential signal pairs at the first circuit end 134 of each respective flex circuit 20. The flex signal pads 30 adjacent to the first circuit end 134 can be only positioned on the first flex circuit side 23A, only one the second flex circuit side 23B or both of the respective flex circuit 20.

Three or more flex signal pads 30 can be positioned on the first flex circuit side 23A, the second flex circuit side 23B or both of the second circuit end 136 of a respective flex circuit 20. Two of the three or more signal flex electrical pads 30A can be differential signal pads. Each respective differential signal pair can be surrounded by an anti-pad 32 defined in the ground plane or first electrically conductive layer 22 of the respective flex circuit 20 and/or in the ground plane or second electrically conductive layer 24 of flex circuit 20. Each of the flex signal pads 30 that constitutes the differential signal pair can be electrically connected, physically connected or electrically and physically connected to a respective signal trace or flex signal conductor 26 in a third signal layer or first inner dielectric layer 27 of the flex circuit 20. For example, a flex signal pad 30 can be electrically connected to a corresponding signal trace or flex signal conductor 26 by an electrically conductive filled via. The flex signal pad 30 pitch at the second circuit end 136 or at the first circuit end 134 can be approximately 0.6 mm. In a differential pair configuration, a differential pair pitch can be approximately 1.7 mm to 2 mm, which allows space for one or more ground contacts between each differential signal pair or differential pair package pads 162. These flex signal pads 30 and differential pair pitches can yield at least sixty-four to at least two hundred and fifty-six differential signal pairs on each of at the second circuit end 136 of each respective flex circuit 20. The electrical contact pads 30*a* adjacent to the second circuit end 136 can be only positioned on the first flex circuit side 23A or on only the second flex circuit side 23B of the respective flex circuit 20, or on both sides or on two distinct, separate, spaced apart layers or first and second flex circuit sides 23A, 23B of the flex circuit 20.

Each of the three or more flex signal pads 30 positioned adjacent to the first circuit end 134 of a respective flex circuit 20 can be physically connected, electrically connected or both to a corresponding one of the three or more electrical contact pads 30 positioned adjacent to the second circuit end 136 of respective flex circuit 20 by respective electrically conductive traces carried by the third signal or first inner dielectric layer 27 of the respective flex circuit 20 and respective vias, such as filled electrically conductive vias.

Figure 10C:
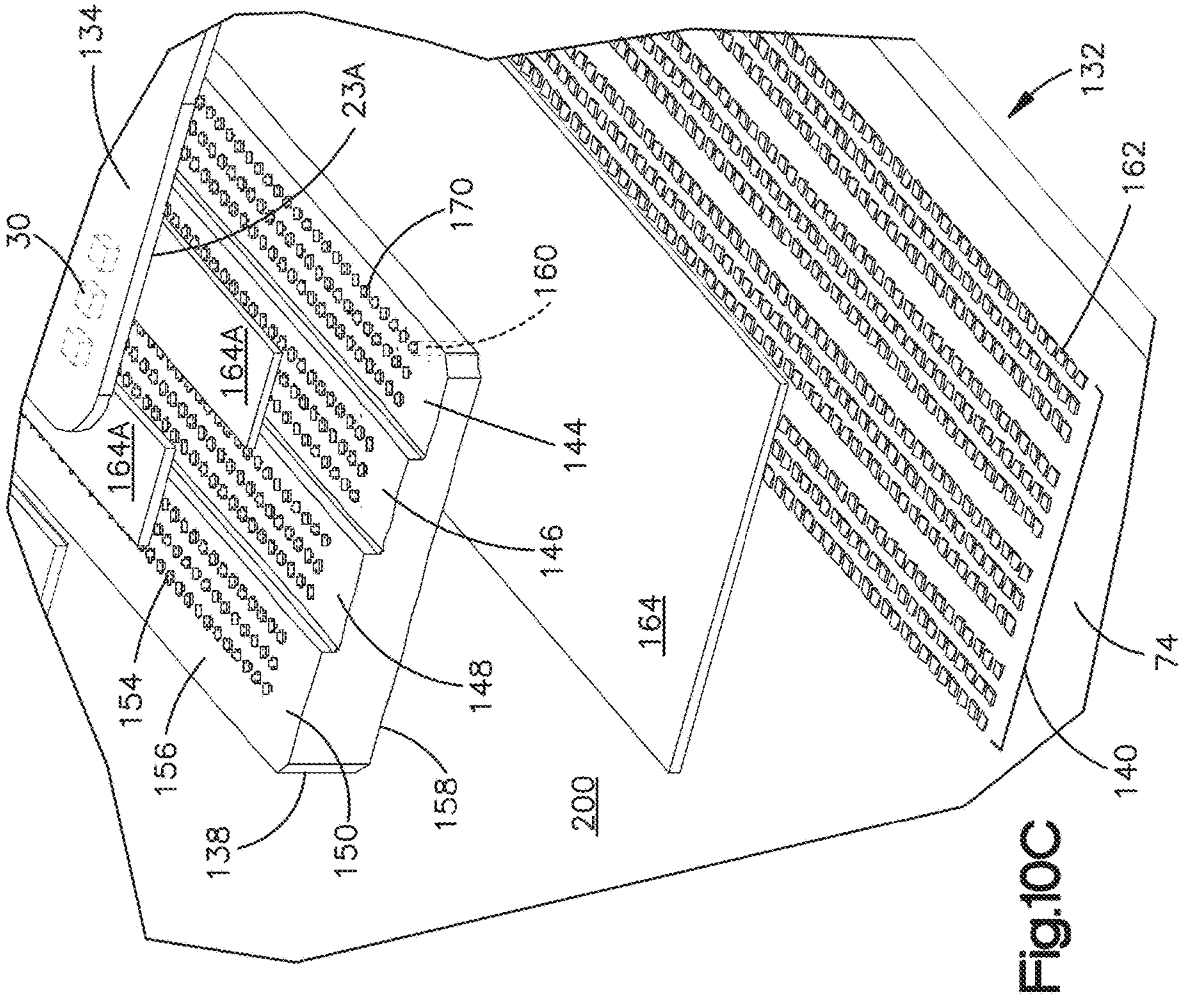
FIG. 10C is a magnified top perspective view a second circuit end of the high-density interconnect shown in FIG. 10A.
Figure 10B:
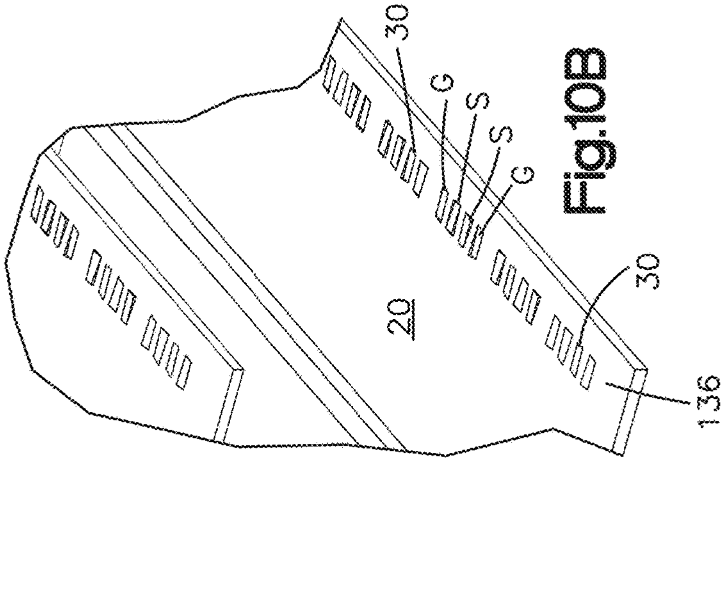
FIG. 10B is a magnified top perspective view of a first circuit end of the high-density interconnect shown in FIG. 10A.

As show in FIG. 10B, the flex signal pads 30 and the flex ground pads 35, such as near second circuit end 136 of flex circuit 20 can be arranged in a repeating G-S-S-G configuration, a repeating G-S configuration, a repeating G-G-S configuration, or any combinations thereof.

As shown in FIG. 10C, the high-density interconnect 132 can also include an electrical package connector 138 that is configured to be electrically, physically or both physically and electrically connector to a corresponding die package footprint 140 of the die package substrate 74. The die package substrate 74 may have a plurality of die package footprints 140, such as one die package footprint 140 positioned along each edge or die package side 178, 180, 182, 184 of the die package substrate 74, as shown in FIG. 6A. Package connector 138 can be made from an electrically non-conductive material and/or a magnetic absorbing material. The package connector 138 can define at least one, at least two, at least three or at least four of a first mating surface 144, a second mating surface 146, a third mating surface 148 and a fourth mating surface 150. The first and second mating surfaces 144, 146 can be stepped, such that the second mating surface 146 is spaced farther from a first major surface 200, such as first major surface 200 or second major surface 202, than the first mating surface 144. The third mating surface 148 can be stepped with respect to both the first and second mating surfaces 144, 146, such that the third mating surface 148 is spaced farther from the first major surface 200 than any one of the first or second mating surfaces 144, 146. The fourth mating surface 150 can be stepped with respect to the first, second and third mating surfaces 144, 146, 148, such that the fourth mating surface 150 is spaced farther from the first major surface 200 than any one of the first, second and third mating surfaces 144, 146, 148. The package connector 138 can also be an LGA-LGA (land grid array) connector, such as the ZRAY brand connector commercially available from the Applicant, Samtec, Inc, New Albany, IN, a BGA-LGA connector, a compression connector, a compression cable connector or any other connector described herein that can be mounted to the first major surface 200, the first major surface 200 and/or the second major surface 202.

Having a plurality of mating levels positioned at different heights above the first major surface 200 is not mandatory but can allow a higher density of interconnections compared to single mating levels. This can enable IC die packages 72 to have a greater number of high-speed input/output channels, such as, for example, 512 differential signal pair channels or 1024 differential signal pair channels. The use of flex circuits 20 can also offer advantages other than off-the-package density. The flexible nature of the flex circuits 20 can enable the spacing between the flex circuits 20 to change from the first circuit 134 end of the flex circuits 20 to the second circuit end 136 of the flex circuits 20. This can allow more space for flex connector housings 168 and electrical flex connectors 172 (both discussed below) at the second circuit end 136 of the flex circuits 20. The ability of the flex circuits 20 to have single sided flex signal pads 30 and flex ground pads 35 at the first circuit end 134 of the flex circuit 20 and a double-sided connection of flex signal pads 30 and flex ground pads 35 at the second circuit end 136 of the flex circuit 20 can allow the spacing between adjacent contacts at the second circuit end 136 to be twice that on the first circuit end 134 without any fan out of the flex signal conductors 26. Fan out of the signal traces can further increase the contact spacing. Increasing the contact spacing between adjacent electrical flex connectors 172 can allows a separatable interconnection at the second circuit end 136 to be made more reliably with reduced mechanical tolerances.

Each of the first, second, third and fourth mating surfaces 144, 146, 148, 150 can respectively carry at least one, at least two, at least three or three or more generally parallel, linear arrays or rows of electrical package connector conductors 154. Each one of the package connector conductors 154 can extend from a first package connector end 156 to an opposed second package connector end 158. A respective first package conductor end 156 of each respective package connector conductor 154 can be electrically attached, physically attached or both physically and electrically attached to a corresponding package pad 162 of the die package footprint 140. The package pads 162 can be arranged in a plurality of rows on each side of the die package substrate surface 152. The rows can be grouped so that each group of rows is aligned directly below one of the respective first, second, third and fourth mating surfaces 144, 146, 148 and 150. As shown, each first package conductor end 156 can be electrically and physically attached to an intermediate anisotropic conductive film 164, as shown, to a respective package pad 162, or to an electrical connector physically attached to the package pads 162. There are various types of intermediate anisotropic conductive films 164. Some types of intermediate anisotropic conductive film provide a separable interface between the die package substrate 74 and the package connector conductors 154 of the package connector 138. Examples of an intermediate anisotropic conductive film that provides a separable interface include, but not limited to; PARIPOSER brand anisotropic elastomer fabric commercially available from PARICON TECHNOLOGIES, Taunton, MA. and nanowires commercially available from Nanowired GmbH, Gernsheim, Germany. Alternatively, each first package conductor end 156 may be permanently attached to package pads 162 or traces on the die package substrate 74 either by a solder reflow process, such as a C4 process, or through a permanent intermediate anisotropic conductive film 164, such as, but not limited to ANISOLM brand anisotropic conductive film commercially available from Showa Denko Materials (America) Inc., San Jose, CA.

Flex signal pads 30 can each be positioned at first circuit end 134 of a respective flex circuit 20 can be electrically, physically, or electrically and physically attached to a second conductive film, such as an intermediate anisotropic conductor film 164A. Alternatively, flex signal pads 30 can be directly physically connected to a respective second package conductor end 170 of a respective one of the package connector conductors 154. Stated another way, respective ones of the flex signal pads 30 positioned on the first side S1 or the first flex circuit side 23A of a respective flex circuit 20 can be electrically, physically or electrically and physically connected to respective ones of the package connector conductors 154 or intermediate anisotropic conductive film 164A. As shown, each second package conductor end 170 can be electrically and physically attached to the intermediate anisotropic conductive film 164A, such as PARIPOSER® brand anisotropic elastomer fabric commercially available from PARICON TECHNOLOGIES, Taunton, MA.

Referring again to FIG. 10A, a first flex circuit 20 can be electrically attached, physically attached, or both physically and electrically attached to respective second package conductor ends 170 positioned adjacent to the first mating surface 144. A second flex circuit 20 can be electrically attached, physically attached, or both physically and electrically to respective second package conductor ends 170 of respective package connector conductors 154 that can be positioned adjacent to the second mating surface 146. A third flex circuit 20 can be electrically attached, physically attached, or both physically and electrically to respective second package conductor ends 170 of respective package connector conductors 154 that can be positioned adjacent to the third mating surface 148. A fourth flex circuit 20 can be electrically attached, physically attached, or both physically and electrically to respective second package conductor ends 170 of respective package connector conductors 154 that can be positioned adjacent to the fourth mating surface 150. As shown, but not limiting, each respective flex circuit 20 can be only electrically attached or connected to a corresponding first, second, third and fourth mating surface 144, 146, 148, 150 through respective intermediate anisotropic conductive films 164A.

Stiffeners 166 can be added adjacent to the second circuit end 136 of a respective flex circuit 20, to increase mechanical stability and durability of the flex circuit 20. The stiffeners 166 may engage with holes in the flex circuit 20 to help position the flex circuit 20 so that it can be properly registered relative to the flex connector housing or housings 168. Respective flex connector housings 168 can be mechanically attached to respective stiffeners 166 to form electrical flex connectors 172 at least one, at least two, at least three, at least four, or at least four or more second circuit ends 136 of the flex circuit 20. Each respective flex connector housing 168 can support, pinch, squeeze or otherwise keep the second circuit end 136 taunt and stiff within the confines of the respective flex connector housing 168. For example, each respective flex connector housing 168 can grip opposed edges of each respective second circuit end 136.

Figure 11:
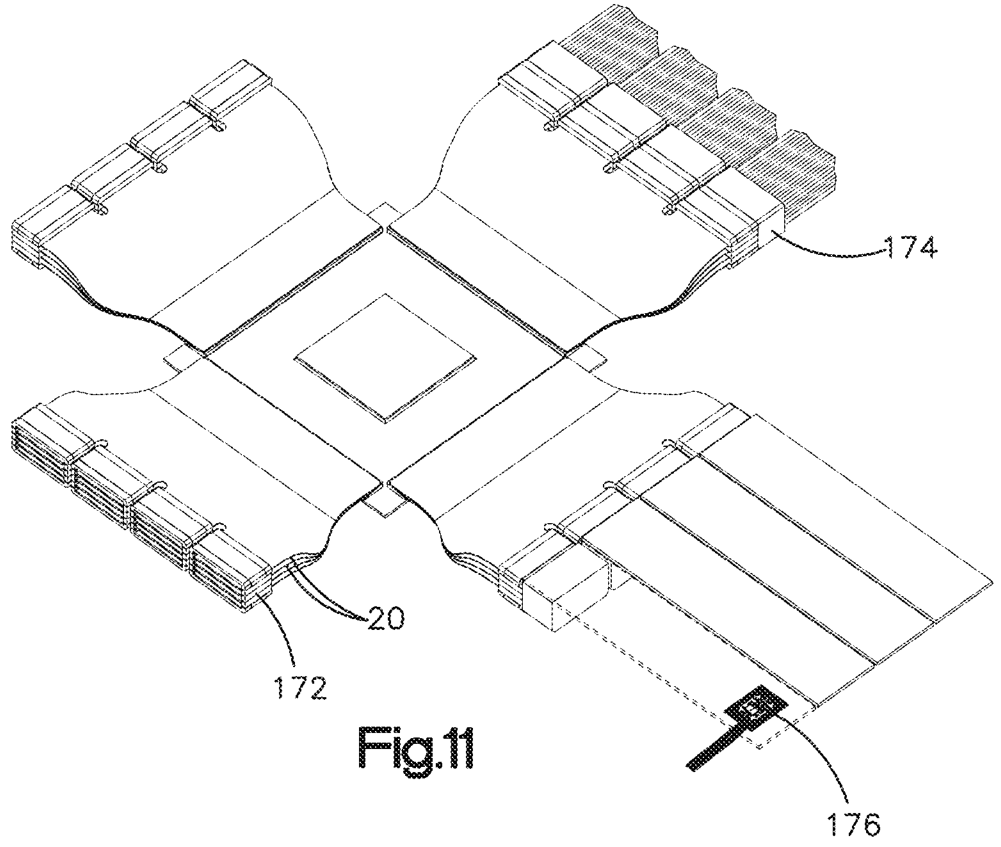
FIG. 11 is a perspective view of the high-density interconnect attached to the die package substrate shown in FIG. 9 further connected to an optical input/output module having optical engines.

In combination, at least one optional stiffener 166, at least one respective flex connector housing 168 and at least one second circuit end 136 can define the electrical flex connector 172 shown in FIG. 11. With continuing reference to FIG. 11, two or more flex circuits 20 can be carried by a single flex connector housing 168 or two flex connector housings 168 and can form a single electrical flex connector 172. Respective electrical flex connectors 172 can each define a separable, electrical flex connector mating interface. Each electrical flex connector 172 can be configured to mate and unmate with any one or more of twin axial cables 79 or coaxial cables 79 or dielectric waveguides or cable connectors 174 or optical I/O modules that can carry optical engines 176. Each cable connector 174 can carry one or more of: differential signal pair conductors physically attached, electrically attached or both to corresponding cable signal conductors of the cables 79, ground conductors physically attached, electrically attached or both to corresponding ground shields or drain wires of the cables 79, and/or dielectric waveguides.

Figure 12:
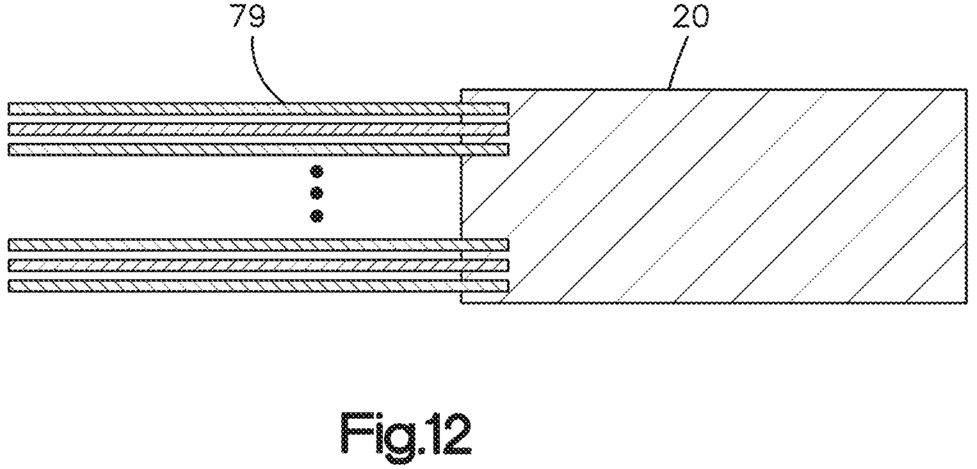
FIG. 12 is a schematic top view of a cable and flex circuit subassembly.

FIG. 12 shows a schematic top view of a cable connector subassembly 208 according to an embodiment of the current invention. The cable connector subassembly 208 may include a flex circuit 20 having a first circuit end 134 and an opposed second circuit end 136 along a longitudinal direction L. The flex circuit 20 can have a first electrically conductive layer 22, a second electrically conductive layer 24, flex signal conductors 26, flex signal pads 30, and flex ground pads 35 as previously described, but not shown in FIG. 12. Physically attached, electrically attached, or both to a second circuit end of the flex circuit 20 can be a plurality of electrical cables 79. The electrical cables can be twin axial cables having two cable signal conductors surrounded by a ground shield or with a drain wire; however, the cables 79 may be a coaxial cable with a single cable conductor surrounded by a ground shield. Each cable signal conductor of either the twin axial cable or the coaxial cable may be formed from wire having a wire gauge between 30 and 40 (approximately 0.25 to 0.08 mm wire diameter), such as 32, 34, 36, or 38 AWG. All the cables 79 may be attached to a single first flex circuit side 23A of the flex circuit 20. Alternatively, some cables 79 may be attached to a first flex circuit side 23A and a second flex circuit side 23B which is opposed to the first flex circuit side 23A along a transverse direction perpendicular to the longitudinal and lateral directions. The cable signal conductors and grounds may be physically attached, electrically attached or both to respective flex signal conductors 26, first and/or second electrically conductive layers, flex signal pads 30 and/or flex ground pads 35 by solder, a conductive adhesive, or some other bonding material. The electrical connection between the flex circuit 20 and each of the plurality of cables 79 may be a may be a permanent interconnection, such as by solder. For example, the cable signal conductors of the cables 79 can be soldered to corresponding flex signal pads 30 of the flex circuit 20. Alternatively, as shown in FIG. 11, the cable signal conductors and grounds may not be physically attached to the flex circuit but may be in electrical communication with respective flex signal contact pads 30 and flex ground pads 35 through an intermediary structure, coupler or connector. For example, a respective flex signal pad 30 can physically contact a fourth mating end of a respective electrical conductor of the mating cable connector 174 or PCB or flex circuit that carries optical engines 176. A fourth mounting end of the respective electrical conductor of the mating cable connector 174 can be configured to attach to a corresponding cable signal conductor or a corresponding cable ground shield (directly or through a commoning ground yolk) or corresponding ground drain wire.

The first circuit end 134 or the end of the flex circuit 20 configured to be closer to the IC die 70 or IC die package 72 than the opposed end of the flex circuit 20, may be smaller in the lateral direction A than the second circuit end 136 as shown in FIG. 12; however, this is not a requirement. Thus, the flex circuit 20 can flare, but does not have to flare or get wider, between the first circuit end 134 and the second circuit end 136. As described above flaring of the flex circuit 20 may be advantageous in certain circumstances since it allows a first pitch between adjacent traces, flex signal pads 30, or flex ground pads 35 on the second circuit side 136 to be larger than a second pitch on the first circuit side 134.

The signal transmission properties of a cable assembly having both a flex circuit 20 and cables 79 may be superior to that of the flex circuit 20 by itself. That is the cables 79 can have lower insertion loss, lower return loss, and less crosstalk than the flex circuit 20 over identical distances. In some applications, such as those described relative to FIG. 13B below, it might be advantageous to use a shorter length of flex circuit 20 and a longer length of cable 79. For example, the ratio of L2 to L1 may be greater than 1, 2, 5, or 10. The cable assembly can have any suitable an end-to-end length, such as between approximately 7.6 cm and 1 meter, between approximately 7.6 cm and 2 meters, between approximately 7.6 cm and 3 meters, between approximately 7.6 cm and 4 meters, between approximately 7.9 cm and 14 cm, between approximately 10 cm and 14 cm, greater than 7.6 cm and less than or equal to 1 meter, at least 1 meter but less than or equal to approximately 2 meters, at least 2 meters but less than or equal to approximately 3 meters, at least 1 meter but less than or equal to 5 meters, and at least 3 meters but less than or equal to 10 meters.

As described earlier, the first width d1 of the flex circuit 20 in the lateral direction A at the first circuit end 134 may be smaller than the second width d2 at the second circuit end 136. Since the number of flex signal pads 30 and flex ground pads 35 on both ends may be the same, this implies that a pitch between the flex signal pad 30 and flex ground pads 35 can be larger on the second circuit end 136. Having a larger pitch on the second circuit end 136 facilitates connection to the cables 79, which may have a minimum pitch in a range from approximately, 1.2 to 1.8 mm depending on AWG, wrapping thicknesses of shields and dielectric material thickness.

Figure 13A:
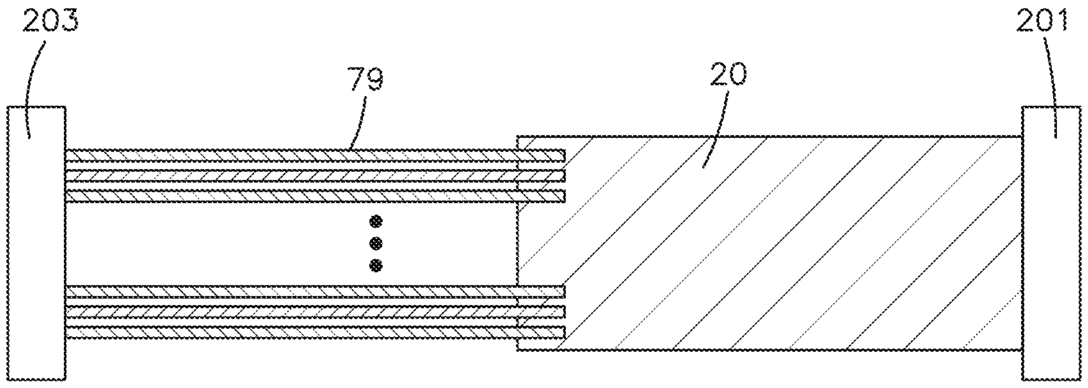
FIG. 13A is a schematic top view of the cable and flex circuit subassembly of FIG. 12 with connectors on both ends of the subassembly.

FIG. 13A shows a schematic top view of a cable connector assembly 209 according to an embodiment of the current invention. The cable connector assembly 209 may include the cable connector subassembly 208 depicted in FIG. 12 with a first electrical connector 201 attached to the first circuit end 134 of the flex circuit 20 and a second electrical connector 203 attached to the second cable end of the cables 79. In some embodiments, a height of the first electrical connector 201 may be less than 3 mm or 5 mm so that it can readily fit in a space between a heat sink 67 and the die package substrate 74 (see FIG. 6F). While FIG. 13A shows each cable of the plurality of cables going into a single second electrical connector 203, the present invention is not so limited. In alternative embodiments. Each cable 79 may have a separate and distinct second electrical connector 203. Alternatively, the cables 79 can be divided into a plurality of cable groups such that each cable in the cable group is attached to a common second electrical connector 203 and cables in other cable groups are attached to different second electrical connectors. The first electrical connector 201 and second electric connector 203 may be of any of the previously described electrical connectors.

Figure 13B:
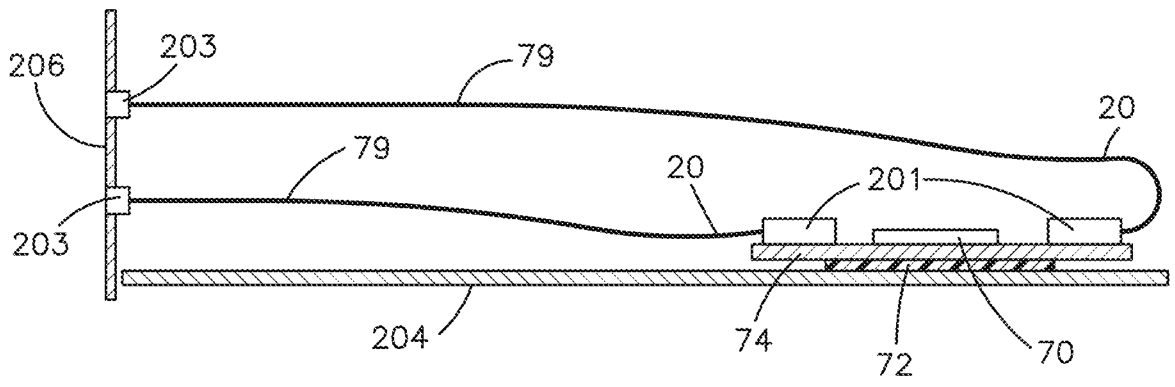
FIG. 13B is a schematic side view of the cable and flex circuit subassembly of FIG. 13A providing an interconnect between an IC package and a panel.

FIG. 13B shows a schematic side view of an electrical communication system 220 including the cable connector assembly 209 of FIG. 13A. The electrical communication system may include an IC die 70 mounted to a die package substrate 74 to form an IC die package 72 as previously described. The IC die package 72 may be electrically and mechanically connected through solder balls (as shown in FIG. 13B) or by a connector to a host substrate 204. Low speed (<1 GHz), control, and power signals may enter and exit the IC package by these connections. At least one cable connector assembly 209 may be in electrical communication with the IC die package 72. The cable connector assembly 209 may enable high-speed signal transmission between the IC die package 72 and the second electrical connector 203 mounted to the panel 206. The second electrical connector 203 may be directly mounted to the panel or indirectly mounted to the panel 206 through a cage (not shown in FIG. 13B). A length along the cable connector assembly 209 between the first electrical connector 201 and the second electrical connector 203 may be greater than or equal to approximately 5 cm and less than or equal to approximately 50 cm. This length range generally provides sufficient length to route high-speed signals between the IC die package 72 and the panel 206 in rack mounted applications.

FIG. 13B depicts two cable connector assemblies 209A and 209B in electrical communication with the IC die package 72; however, more than two, such as three, four, five or more cable connector assemblies 209 may be in electrical communication with the IC die package 72. In alternative embodiments, a single cable connector assembly 209 may route high speed signals to and from the IC die package 72 to panel connectors 203 positioned adjacent to a panel 206. As noted above, panel connectors 203 can be I/O connectors, such as card slotted QSFP, OSFP, QSFP-DD connectors, backplane connectors, non-slotted connectors, such as the ACCELRATE brand connectors commercially available from the Applicant, and open pin field connectors without dedicated ground shields.

A cable connector 209 can included any one or more of the following: flex circuit 20 by itself, a combination of a flex circuit 20 and cables 79, a flex circuit 79 attached to any of the electrical connectors described herein.

For example, a cable assembly can include a flex circuit 20 that includes a first circuit end 134 and a second circuit end 136. The first circuit end 134 can include a first plurality of flex signal pads 30A and the second circuit end 136 can include a second plurality of flex signal pads 30B, wherein the first plurality of flex signal pads 30A are on a first pitch, the second plurality of flex signal pads 30B are on second pitch and the second pitch is numerically greater than the first pitch and a plurality of cables positioned adjacent to a second end of the flex circuit. At least one electrical flex connector 172 can be positioned adjacent to the second circuit end 136. The at least one electrical flex connector 172 can be configured to mate with a cable connector 174. The cable connector 174 can carries the plurality of cables 79. The plurality of cables 79 can each be physically attached to the flex circuit 20. The plurality of cables 79 can be coaxial cables with coaxial cable conductors and a coaxial cable shield. The plurality of cables 79 can be twin axial cables with a pair of cable conductors and a twin axial cable shield.

The flex circuit 20 can have a shorter end-to-end length than an end-to-end length of one of the plurality of cables 79. For example, the end-to-end length of the flex circuit 20 can be at least two times less than an end-to-end cable length of one of the plurality of cables 79, at least three times less than an end-to-end cable length of one of the plurality of cables 79, at least four times less than an end-to-end cable length of one of the plurality of cables 79, at least five times less than an end-to-end cable length of one of the plurality of cables 79, at least six times less than an end-to-end cable length of one of the plurality of cables 79, at least seven times less than an end-to-end cable length of one of the plurality of cables 79, at least eight times less than an end-to-end cable length of one of the plurality of cables 79, at least nine times less than an end-to-end cable length of one of the plurality of cables 79 or at least ten times less than an end-to-end cable length of one of the plurality of cables 79.

The first circuit end 134 of the flex circuit 20 can be configured to be physically attached, electrically attached or both to an IC die 70 or a die package substrate 74. The first circuit end 134 of the flex circuit 20 can be configured to be physically attached, electrically attached or both to respective package pads 162 on a first major surface 200.

A cable assembly can include a flex circuit 20 attached to twin axial cables 79. The flex circuit 20 can have a first circuit end 134 and as second circuit end 136 and the twin axial cables 79 can be attached directly, or indirectly through a connector such as the electrical flex connector 172 or coupler or bridge, to the second circuit end 136. A first plurality of flex signal pads 30 can each be positioned at the first circuit end 134 on the first flex circuit side 23A. The first plurality of flex signal pads 30 can include first differential flex signal pair pads 30A. A third plurality of flex signal pads 30 can each be positioned at the first circuit end 134 on the second flex circuit side 23B. The third plurality of flex signal pads 30 can include third differential flex signal pair pads. A flex signal pad 30 of the first differential flex signal pair pads 30A can be offset from a flex signal pad 30 of an adjacently opposed third differential flex signal pair pads such that a line perpendicular to both the first and second flex circuit sides 23A, 23B passes through one of the flex signal pads 30 of the first differential flex signal pair pads 30A but not either one of the flex signal pads 30 of the third differential flex signal pair pads.

A second plurality of flex signal pads 30 can each be positioned at the second circuit end 136 on the second flex circuit side 23B. The second plurality of flex signal pads 30 can include second differential flex signal pair pads 30B. A fourth plurality of flex signal pads 30 can each be positioned at the second circuit end 136 on the first flex circuit side 23A. The fourth plurality of flex signal pads 30 can include fourth differential flex signal pair pads 30D. A flex signal pad 30 of the second differential flex signal pair pads 30B can be offset from an adjacently opposed flex signal pad 30 of the fourth differential flex signal pair pads 30D such that a line perpendicular to both the first and second flex circuit sides 23A, 23B passes through one of the flex signal pads 30 of the second differential flex signal pair pads 30B but not either one of the flex signal pads 30 of the fourth differential flex signal pair pads 30D.

A first electrical connector or a second electrical connector or a third electrical connector can be releasably or not releasably attached to the first circuit end 134. A panel connector 203 or other electrical component can be attached to a second end of the twin axial cables 79. As discussed above, the flex circuit 20 can have a shorter end-to-end length than one of the twin axial cables 79. The end-to-end length of the flex circuit 20 can be at least two times less than an end-to-end cable length of one of the twin axial cables 79, at least three times less than an end-to-end cable length of one of the twin axial cables 79, at least four times less than an end-to-end cable length of one of the twin axial cables 79, at least five times less than an end-to-end cable length of one of the twin axial cables 79, at least six times less than an end-to-end cable length of one of the twin axial cables, at least seven times less than an end-to-end cable length of one of the twin axial cables 79, at least eight times less than an end-to-end cable length of one of the twin axial cables 79, at least nine times less than an end-to-end cable length of one of the twin axial cables 79, or at least ten times less than an end-to-end cable length of one of the twin axial cables 79. First differential flex signal pair pads 30A and flex ground pads 35 can extend along a first common row. Third differential flex signal pair pads and flex ground pads 35 can extend along a second common row. The first common row and the second common row can be staggered or offset by less than a row pitch, by a row pitch or by more than a row pitch. Second differential flex signal pair pads 30B and flex ground pads 35 can extend along a third common row. Fourth differential flex signal pair pads 30D and flex ground pads 35 can extend along a fourth common row. The third common row and the fourth common row can be staggered or offset by less than a row pitch, by a row pitch or by more than a row pitch. For example, as shown in FIG. 1E, second differential signal pair pads 30B and sequentially adjacent and opposite fourth differential signal pair pads 30D are offset from one another in direction A by more than a row pitch. The second differential signal pair pads 30B and the fourth differential signal pair pads 30D can each be positioned on opposite sides of the flex circuit 20, but remain sequentially adjacent to one another along direction A. Stated another way, it is possible that there are no signal pair pads between the second differential signal pair pads 30B and the fourth differential signal pair pads 30D or between the first differential signal pair pads 30A or the third differential signal pair pads. Stated yet another way, an offset can exist between differential signal pair pads in immediately adjacent first and second common rows. An offset can exist between differential signal pair pads in immediately adjacent third and fourth common rows.

Fifth electrical connector 201 of the cable connector assembly 209 can be any of the electrical connectors described herein, as well as a compression connector or compression cable connector. Fifth electrical connector 201 may be in physical communication, electrical communication or both with the die package substrate 74 or the IC die 70 discussed earlier. The panel connector 203 may be mounted to the panel 206, such as a front panel. The panel 206 may be one a standard 1 RU (rack unit) or approximately 44.5 mm tall. In various embodiments, at least 500 or at least 1000 or at least 1026 or at least 1088 high speed differential pair signals may be routed between the panel 206 and the IC die package. High speed can mean any one or more of at least 28 Gbps at an acceptable level of crosstalk, such as 0% to 4% or −40 dB, at least 56 Gbps at an acceptable level of crosstalk, such as 0% to 4% or −40 dB, at least 112 Gbps at an acceptable level of crosstalk, such as 0% to 4% or −40 dB, and at least 224 Gbps at an acceptable level of crosstalk, such as 0% to 4% or −40 dB, at least 56G NRZ, at least 112G PAM-4, at least 112G NRZ, and at least 224G PAM-4. Exemplary quantities of high-speed differential pair signals may be 512, 1024, or 1152 on only one or both of the first or second major surfaces 200, 202 of the die package substrate 74. If each of the first, second, third and fourth die package sides 178, 180, 182, 184 of the IC die package 72 has an identical number of differential pair signal connections, then the number of differential pair signal connections per die package side 178, 180, 182, 184 can be at least 128, 256, or 288. Multiple electrical communication systems 220 may be mounted into a single rack, which may be part of a larger installation, such as a server farm.

Finally, here are some parting embodiments. A method to make a dense, high-speed transmission line can include the steps of providing a flex circuit 20 with a first circuit end 134 configured to attach to a die package substrate 74 or a connector carried by the die package substrate 74 and attaching cables 79, such as coaxial cables or twin axial cables, to the second circuit end 136 of the flex circuit 20. Another method to make a dense, high-speed transmission line can include the steps of routing differential signals from an IC die package 72 or an die package substrate 74 to an electrical connector, communication module or electrical or optical component using a flex circuit 20 that has a first flex length and determining if the first flex length of the flex circuit 20 has too much parasitic loss to be used in a pre-determined application. If there is too much parasitic loss, further steps can include and either shortening the first flex length of the flex circuit 20 to a second flex length that is less than the first flex length and adding cables 79, such as coaxial or twin axial cables to the flex circuit 20 such that a combined length of the flex circuit 79 and the cables 79 is at least as long as the first flex length or shortening a distance between the IC die package 72 or die package substrate 74 and the electrical connector, communication module or electrical or optical component.

An IC die package 72 having a die package substrate 74 or a die package substrate 74 without an IC die 70 can include a first die package side 178, a second die package side 180, a third die package side 182 and a fourth die package side 184, a flex circuit 20, a first flex circuit 20A1. The flex circuit 20 can be directly or indirectly attached to the die package substrate 74 adjacent to at one of the first die package side 178, second die package side 180, a third die package side 182 and a fourth die package side 184. First flex circuit 20A1 can be directly or indirectly attached to the die package substrate 74 adjacent to a remaining one of the first die package side 178, second die package side 180, a third die package side 182 and a fourth die package side 184. Flex circuits 20 can be attached three or four of the first die package side 178, the second die package side 180, the third die package side 182 and the fourth die package side 184 of the die package substrate 74.

Methods to make a high-speed, high-density system can independently include any respective one of the following steps: routing at least 512 or at least 1024 differential signal pairs from only one major surface of a die package substrate that has die package sides that are each at least 50 mm in length but less or equal to 120 mm in length; routing at least 512 or at least 1024 differential signal pairs from only one major surface of a die package substrate that has die package sides that are each at least 50 mm in length but less than or equal to 110 mm in length; routing at least 512 or at least 1024 differential signal pairs from only one major surface of a die package substrate that has die package sides that are each at least 50 mm in length but less than or equal to 100 mm in length; routing at least 512 or at least 1024 differential signal pairs from only one major surface of a die package substrate that has die package sides that are each at least 50 mm in length but less than or equal to 95 mm in length; routing at least 512 or at least 1024 differential signal pairs from only one major surface of a die package substrate that has die package sides that are each at least 50 mm in length but less than or equal to 90 mm in length; routing at least 512 or at least 1024 differential signal pairs from only one major surface of a die package substrate that has die package sides that are each at least 70 mm in length but less than or equal to 110 mm in length; routing at least 512 or at least 1024 differential signal pairs from only one major surface of a die package substrate that has die package sides that are each at least 70 mm in length but less than or equal to 100 mm in length; routing at least 512 or at least 1024 differential signal pairs from only one major surface of a die package substrate that has die package sides that are each at least 70 mm in length but less than or equal to 90 mm in length; routing at least 512 or at least 1024 differential signal pairs from only one major surface of a die package substrate that has die package sides that are each at least 75 mm in length but less than or equal to 110 mm in length; routing at least 512 or at least 1024 differential signal pairs from only one major surface of a die package substrate that has die package sides that are each at least 75 mm in length but less than or equal to 100 mm in length; routing at least 512 or at least 1024 differential signal pairs from only one major surface of a die package substrate that has die package sides that are each at least 75 mm in length but less than or equal to 95 mm in length; routing at least 512 or at least 1024 differential signal pairs from only one major surface of a die package substrate that has die package sides that are each at least 75 mm in length but less than or equal to 90 mm in length.

It should be appreciated that the illustrations and discussions of the embodiments shown in the figures are for exemplary purposes only and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should be further appreciated that the various alternative embodiments described above with respect to one illustrated embodiment can apply to all embodiments as described herein, unless otherwise indicated.

What is claimed is:

1. A cable assembly comprising:

a flex circuit including:

a first circuit end, an opposed second circuit end, a first flex circuit side, and an opposite second flex circuit side, wherein the first circuit end of the flex circuit is configured to be physically attached, electrically attached or both to an IC package substrate to which an IC die is mounted;

a first electrically conductive layer positioned adjacent to the first flex circuit side;

a second electrically conductive layer opposite the first electrically conductive layer, adjacent to the second flex circuit side;

a plurality of flex signal conductors disposed between the first and second electrically conductive layers;

a first plurality of differential flex signal pads positioned at the first circuit end and a second plurality of differential flex signal pads positioned at the second circuit end, wherein the first plurality of differential flex signal pads are all positioned on the first flex circuit side and the second plurality of differential flex signal pads are all positioned on the second flex circuit side;

a fourth plurality of differential flex signal pads all positioned at the second circuit end and all positioned on the first flex circuit side, wherein each of the second differential flex signal pads is offset from all of the fourth differential flex signal pads such that a line perpendicular to both the first and second flex circuit sides that passes through any of the second differential flex signal pads does not pass through any of the fourth differential flex signal pads; and at least one electrical flex connector positioned adjacent to the second circuit end wherein the at least one electrical flex connector is configured to mate with a cable connector and the cable connector carries a plurality of cables positioned adjacent to the second circuit end, wherein the electrical flex connector is further configured to unmate from the cable connector.

2. The cable assembly of claim 1, wherein the first plurality of differential flex signal pads comprises differential flex signal pair pads that are spaced apart from one another such that at least two-hundred and fifty-six of the differential flex signal pair pads fit within an area of approximately 750 square millimeters.

3. The cable assembly of claim 1, wherein the first plurality of differential flex signal pair pads are spaced apart from one another such that a row of at least sixty-four differential flex signal pair pads fit along a first die package side having a length greater than 50 mm but not more than approximately 75 mm.

4. The cable assembly of claim 1, further comprising a fourth plurality of signal pads all positioned at the second circuit end and all on the first flex circuit side.

5. The cable assembly of claim 1, wherein the flex circuit is configured to transmit data at frequencies up to 55 GHz while producing no more than −60 dB worst-case multi-active asynchronous cross talk.

6. The cable assembly of claim 1, wherein the first plurality of differential flex signal pads is on a first pitch, the second plurality of differential flex signal pads are on second pitch that is numerically greater than the first pitch.

7. The cable assembly of claim 6, wherein the plurality of cables is each physically attached to the flex circuit.

8. The cable assembly of claim 6, wherein the plurality of cable are twin axial cables with a pair of cable conductors.

9. The cable assembly of claim 6, wherein the flex circuit has a shorter end-to-end length than an end-to-end length of one of the plurality of cables.

10. The cable assembly of claim 6, wherein the first circuit end of the flex circuit is physically and electrically attached to the IC package substrate.

11. The cable assembly of claim 3, further comprising a flex ground pad disposed between adjacent pairs of the first plurality of differential flex signal pair pads along the first die package side.

12. The cable assembly of claim 1, wherein the first circuit end and the opposed second circuit end are opposite each other along a longitudinal direction, the first flex circuit side and the second flex circuit side are opposite each other along a transverse direction that is perpendicular to the longitudinal direction, and each of the second differential flex signal pads is offset from all of the fourth differential flex signal pads in a lateral direction that is perpendicular to each of the longitudinal direction and the transverse direction.

13. The cable assembly of claim 1, wherein the first circuit end is single-ended, such that all differentia flex signal pads at the first circuit end are positioned on the first flex circuit side.

* * * * *